United States Patent
Zhang et al.

(10) Patent No.: US 9,576,971 B2
(45) Date of Patent: Feb. 21, 2017

(54) THREE-DIMENSIONAL MEMORY STRUCTURE HAVING A BACK GATE ELECTRODE

(71) Applicant: SanDisk Technologies, Inc., Plano, TX (US)

(72) Inventors: Yanli Zhang, San Jose, CA (US); Johann Alsmeier, San Jose, CA (US); Yingda Dong, San Jose, CA (US); Akira Matsudaira, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 50 days.

(21) Appl. No.: 14/564,526

(22) Filed: Dec. 9, 2014

(65) Prior Publication Data

US 2016/0163729 A1    Jun. 9, 2016

(51) Int. Cl.
*H01L 27/115* (2006.01)
*H01L 29/788* (2006.01)
*H01L 29/792* (2006.01)

(52) U.S. Cl.
CPC ... *H01L 27/11582* (2013.01); *H01L 27/11556* (2013.01); *H01L 29/7883* (2013.01); *H01L 29/792* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 8,624,316 B2* | 1/2014 | Mizushima | H01L 21/28282 257/324 |
| 2011/0309432 A1* | 12/2011 | Ishihara | G11C 16/0466 257/324 |
| 2012/0001247 A1* | 1/2012 | Alsmeier | H01L 27/11551 257/316 |
| 2012/0001249 A1* | 1/2012 | Alsmeier | H01L 27/11551 257/319 |

(Continued)

OTHER PUBLICATIONS

International Search Report and Written Opinion for PCT/US2015/055559, dated Apr. 7, 2016, 19 pages.

(Continued)

*Primary Examiner* — Abul Kalam
(74) *Attorney, Agent, or Firm* — The Marbury Law Group PLLC

(57) ABSTRACT

A memory stack structure includes a cavity including a back gate electrode, a back gate dielectric, a semiconductor channel, and at least one charge storage element. In one embodiment, a line trench can be filled with a memory film layer, and a plurality of semiconductor channels can straddle the line trench. The back gate electrode can extend along the lengthwise direction of the line trench. In another embodiment, an isolated memory opening overlying a patterned conductive layer can be filled with a memory film, and the back gate electrode can be formed within a semiconductor channel and on the patterned conductive layer. A dielectric cap portion electrically isolates the back gate electrode from a drain region. The back gate electrode can be employed to bias the semiconductor channel, and to enable sensing of multinary bits corresponding to different amounts of electrical charges stored in a memory cell.

9 Claims, 37 Drawing Sheets

(56) References Cited

U.S. PATENT DOCUMENTS

| | | | | |
|---|---|---|---|---|
| 2012/0267699 A1* | 10/2012 | Kiyotoshi | ......... | H01L 27/11524 |
| | | | | 257/319 |
| 2013/0161725 A1* | 6/2013 | Park | ................... | H01L 29/7926 |
| | | | | 257/324 |
| 2013/0313627 A1* | 11/2013 | Lee | ................... | H01L 21/76816 |
| | | | | 257/324 |
| 2014/0362644 A1 | 12/2014 | Lue et al. | | |

OTHER PUBLICATIONS

Invitation to Pay Additional Fees and Communication Relating to the Results of the Partial International Search for PCT/US2015/055559, 10 pages, dated Jan. 26, 2016.

Non-Final Office Action dated Sep. 25, 2015, for U.S. Appl. No. 14/564,555, filed Dec. 9, 2014 (10 pages).

Zhang, Y. et al., "Three-Dimensional Memory Structure Having a Back Gate Electrode," U.S. Appl. No. 14/564,555, filed Dec. 9, 2014.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

Endoh et al., "Novel Ultra High Density Memory with a Stacked-Surrounding Gate Transistor (S-SGT) Structured Cell," IEDM Proc. (2001) 33-36.

\* cited by examiner

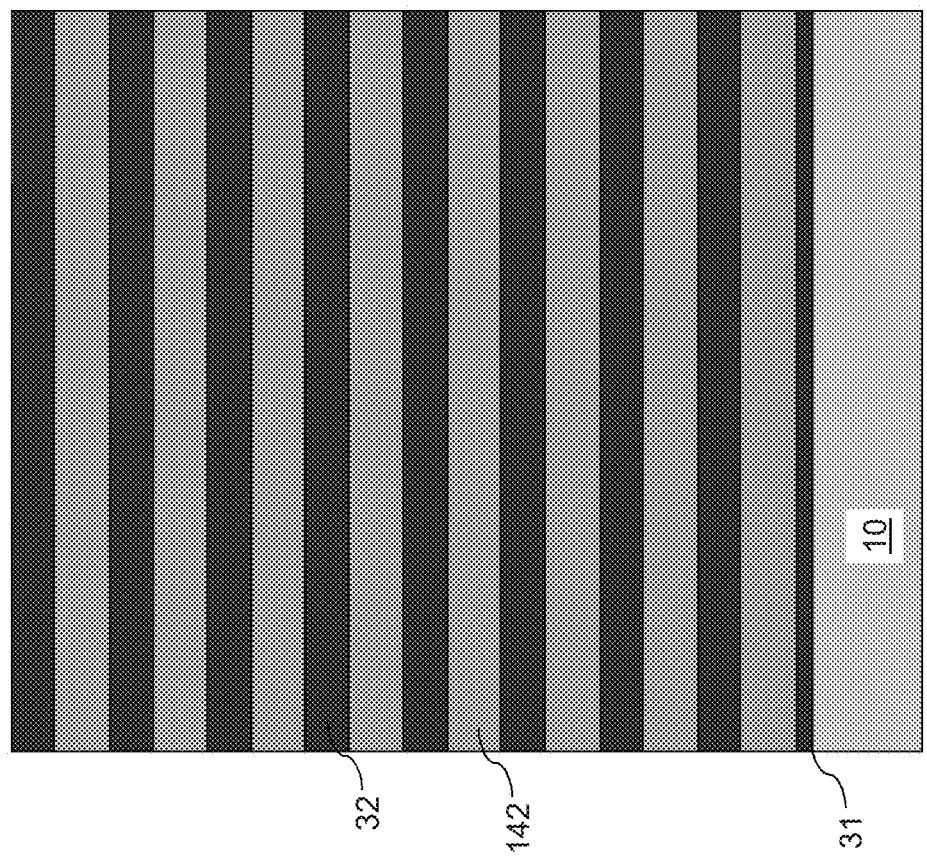
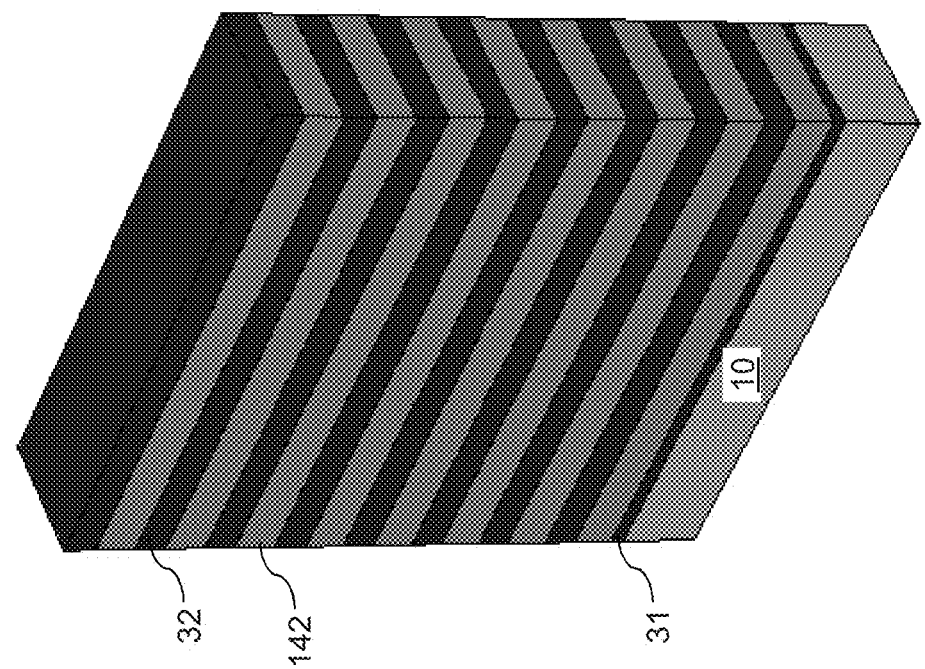

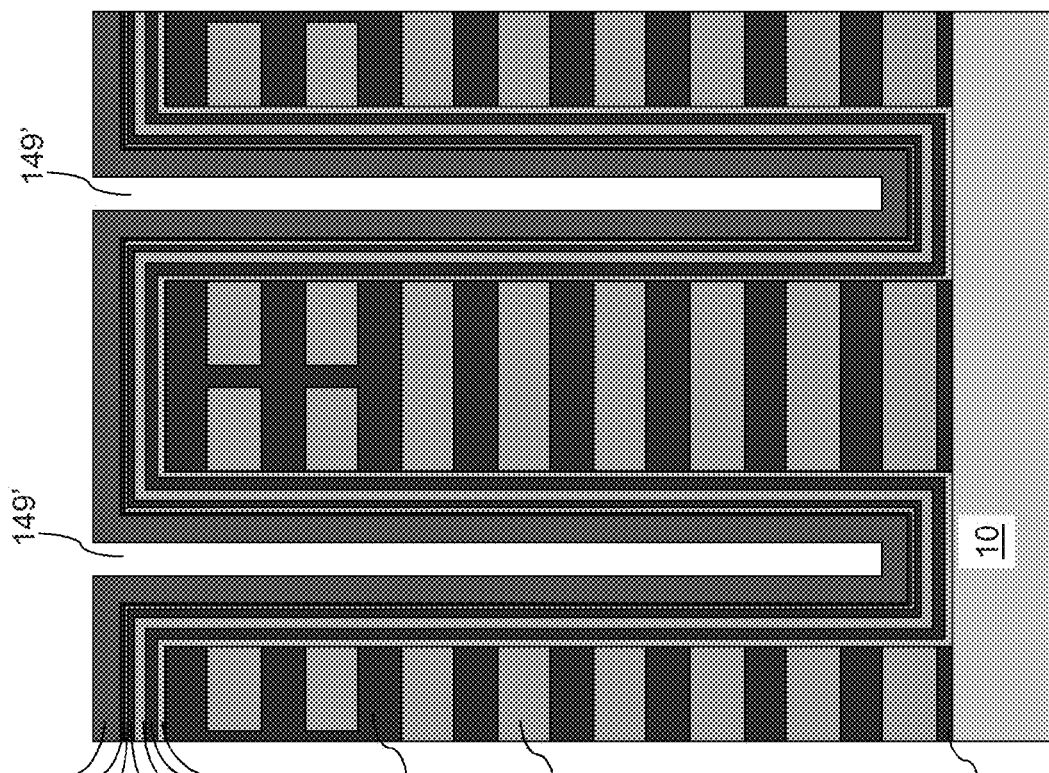
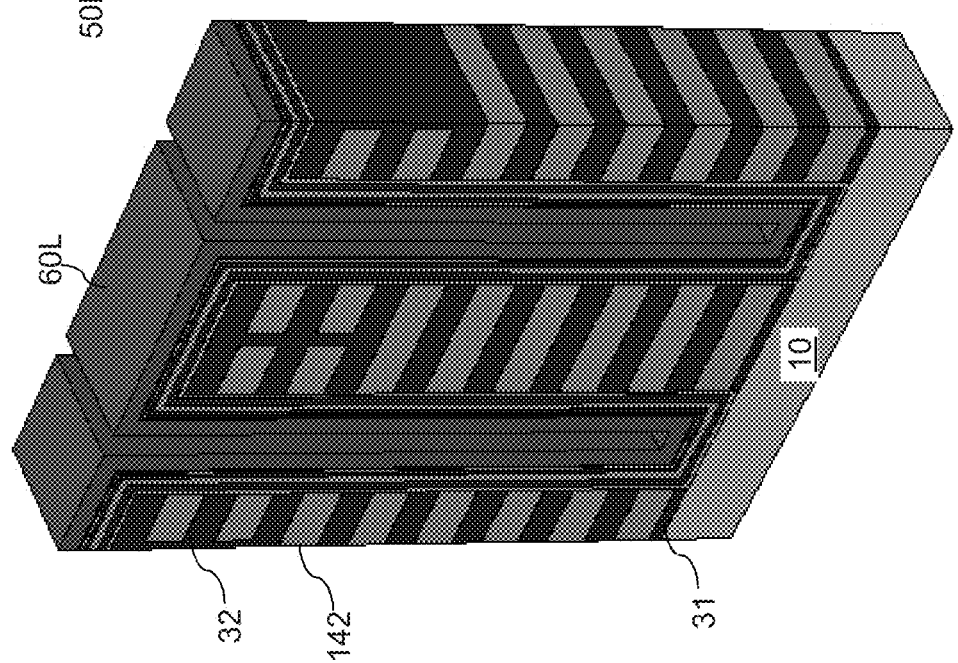
FIG. 4B
FIG. 4A

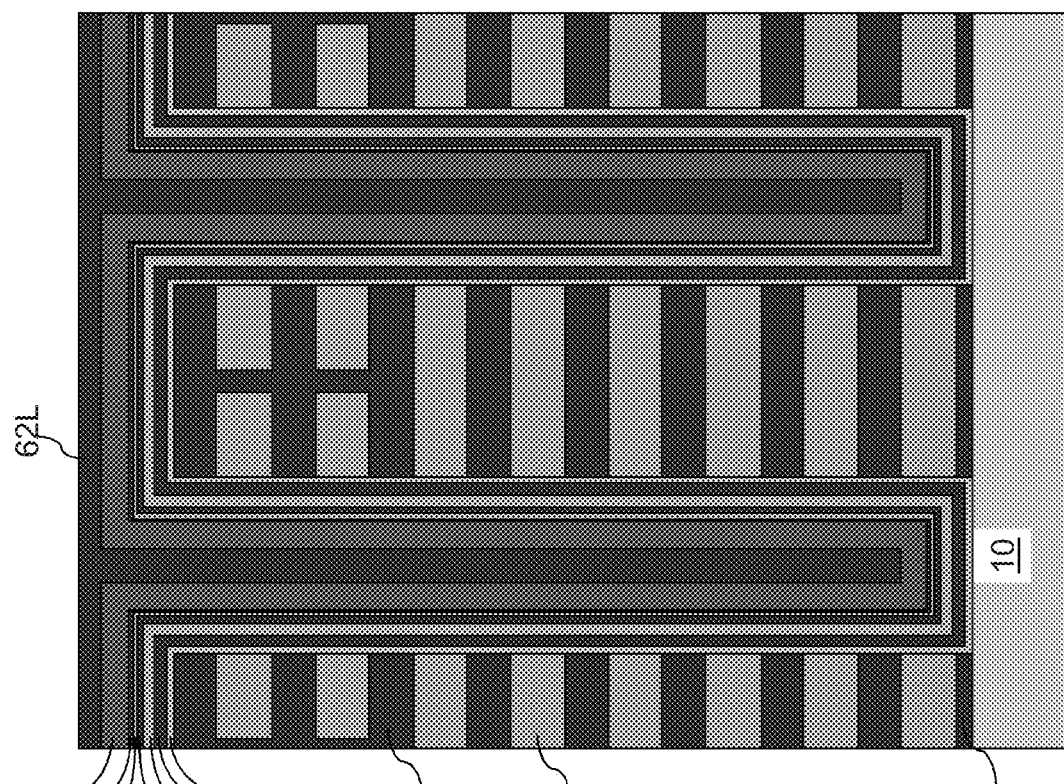
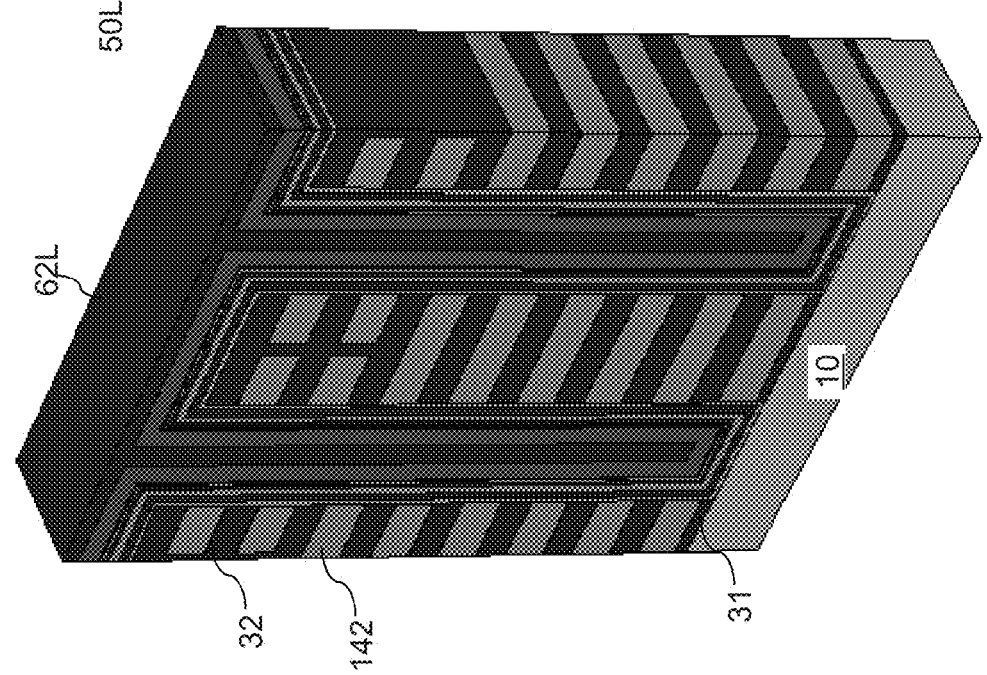

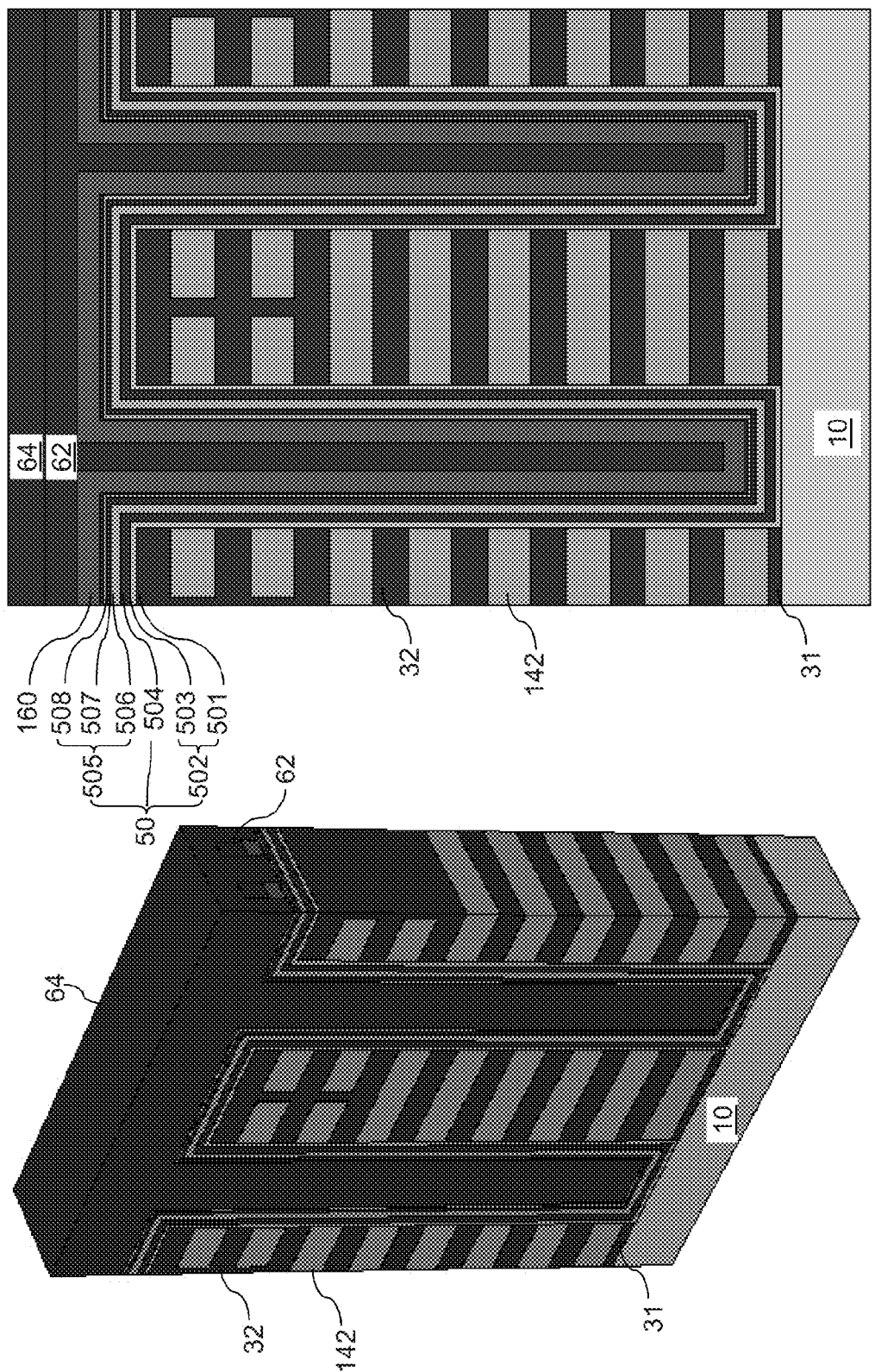

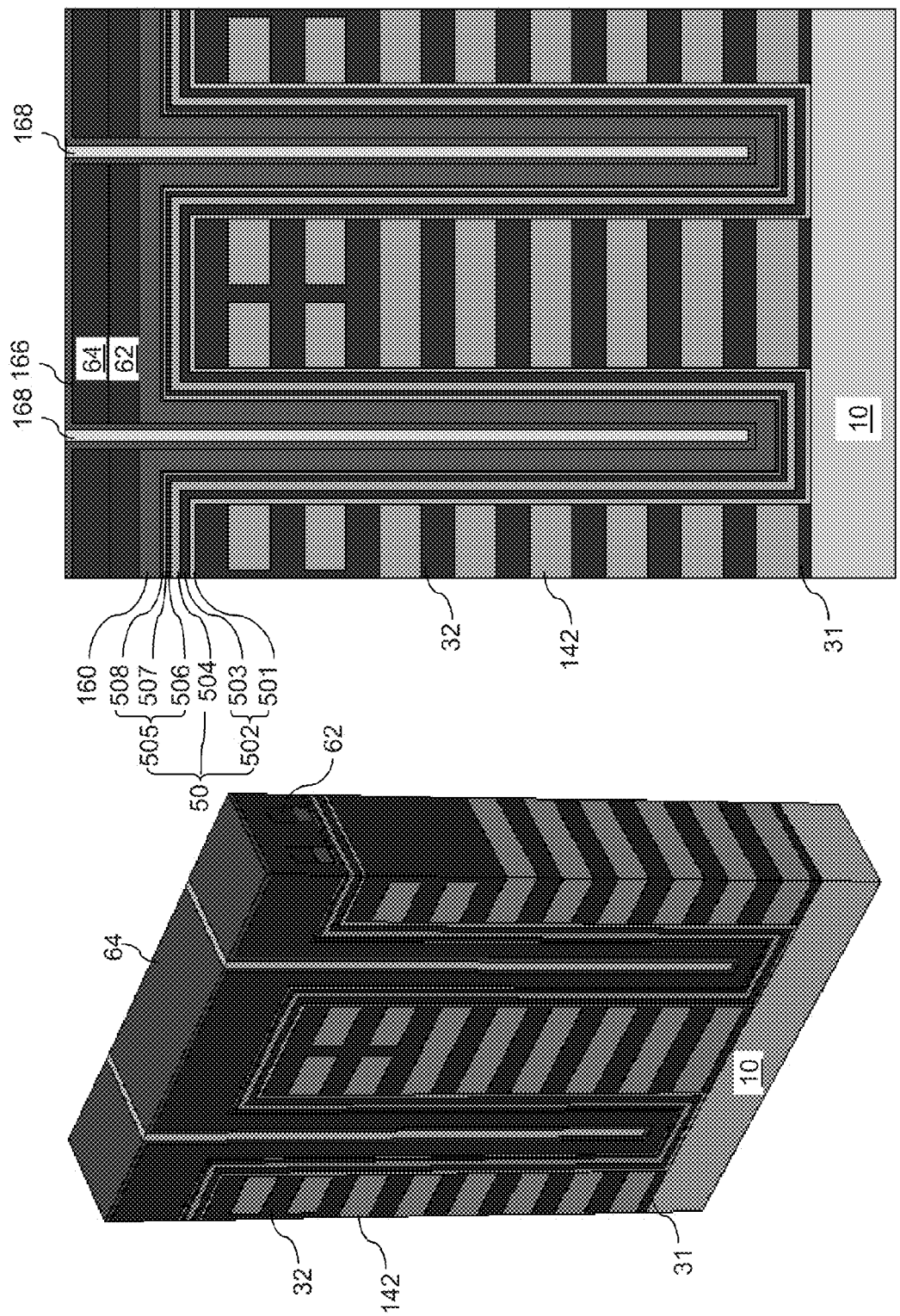

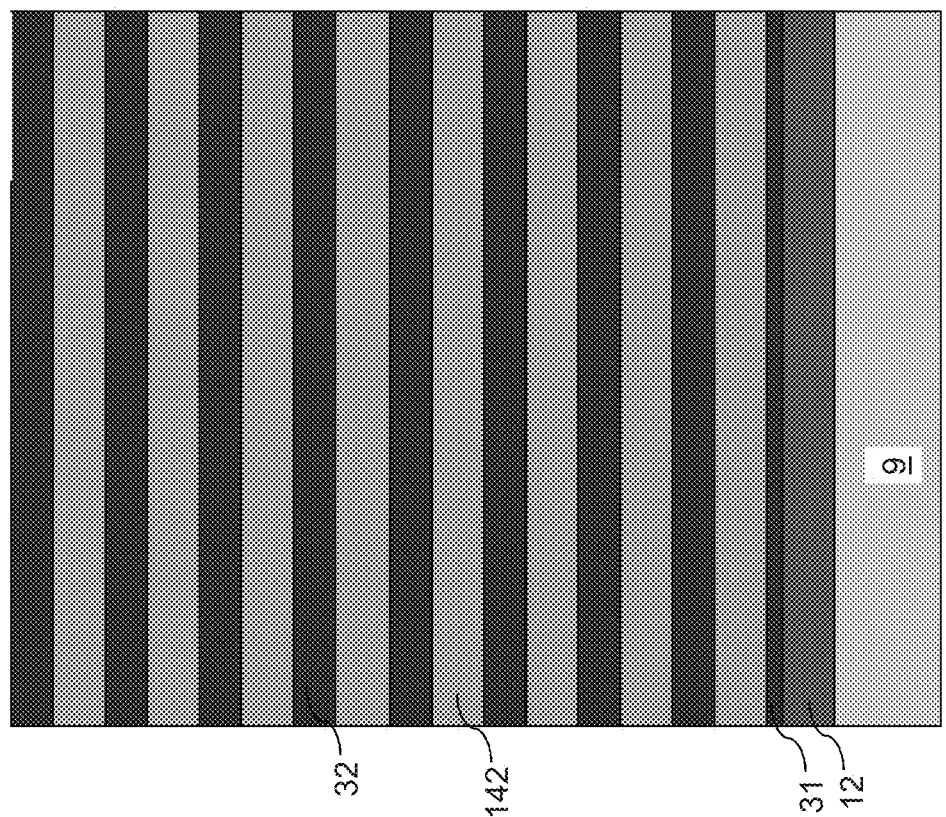
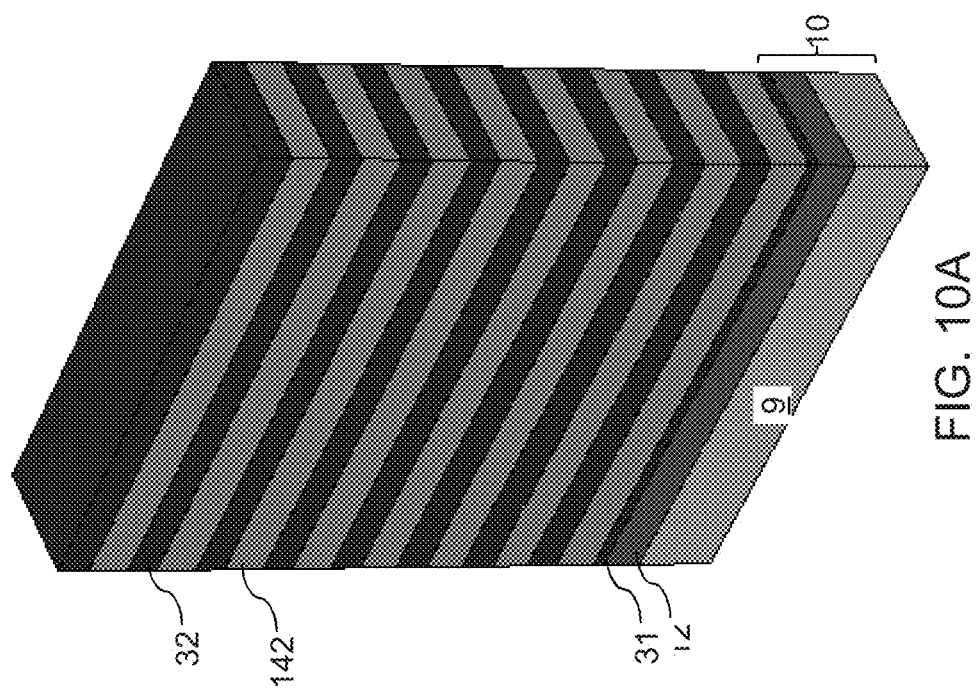
FIG. 10B
FIG. 10A

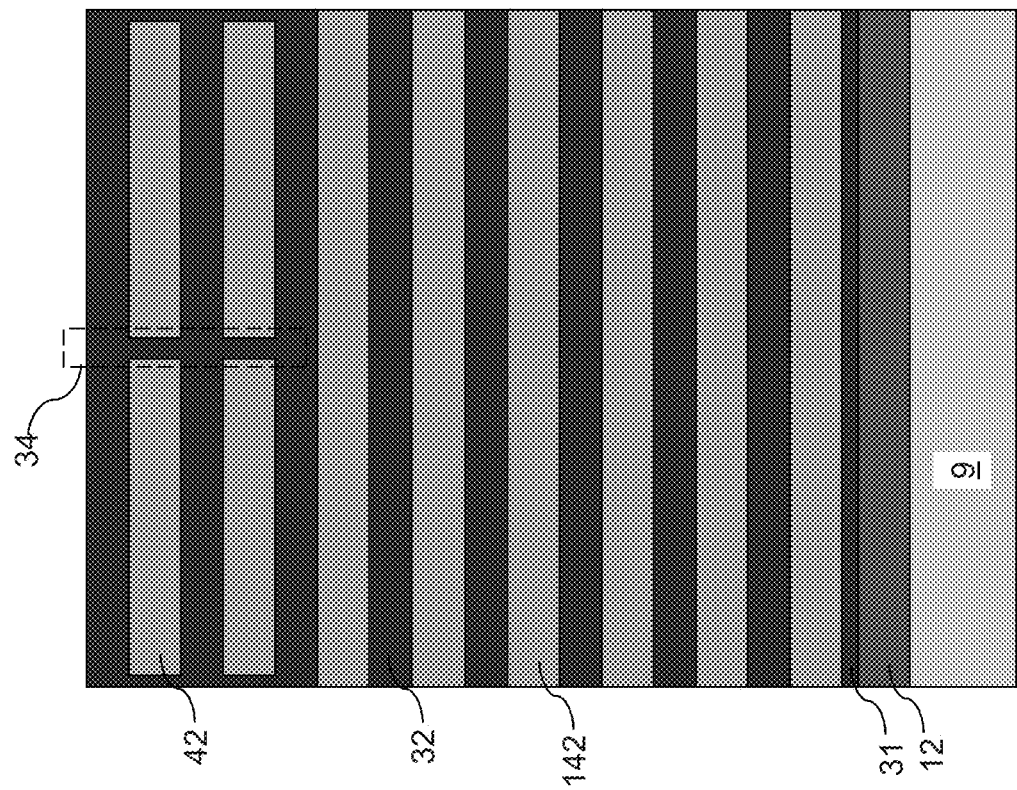
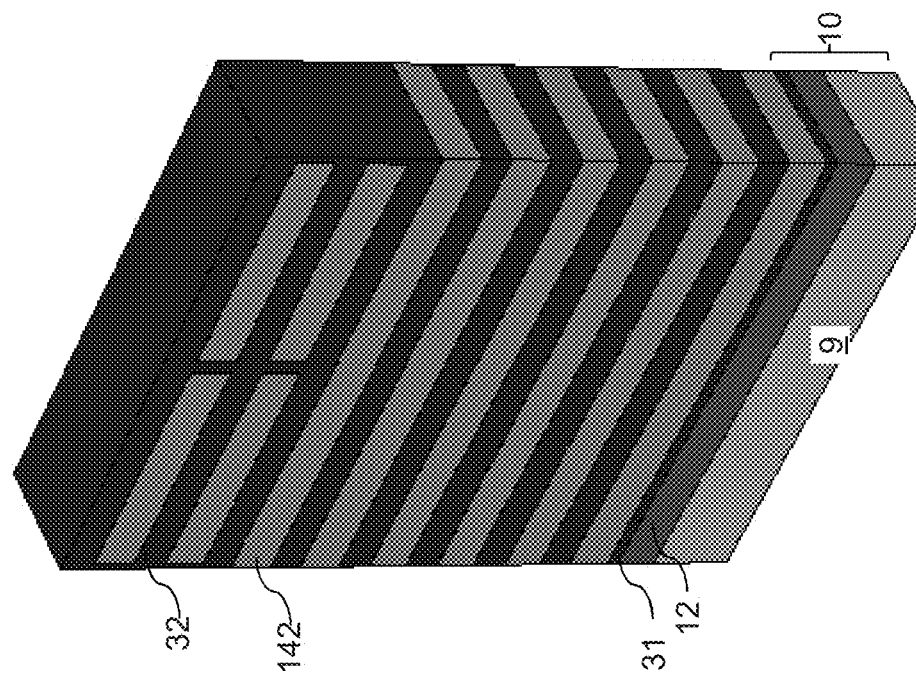

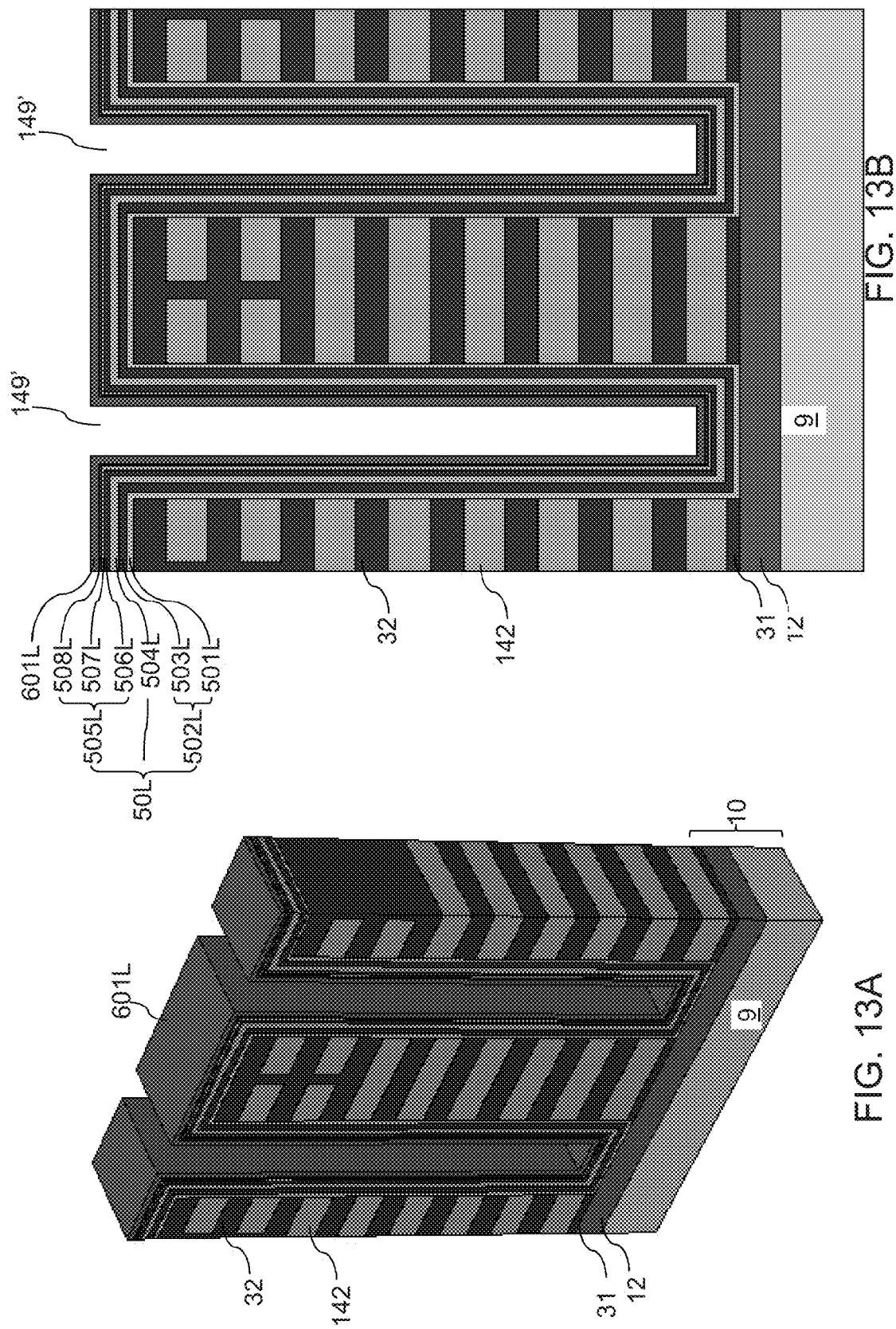

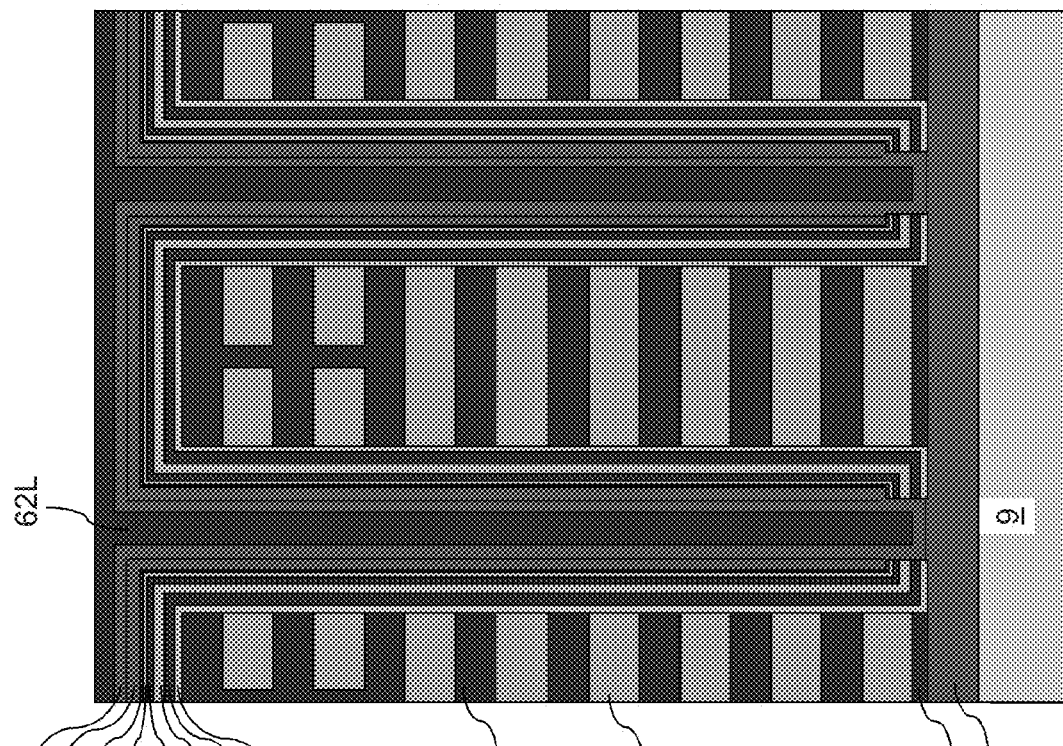
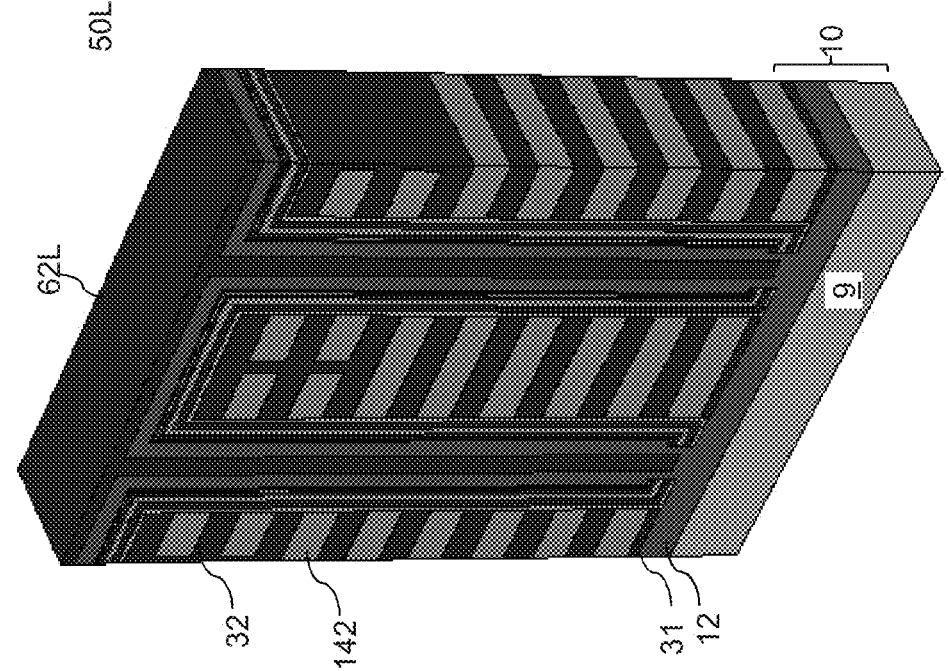
FIG. 14B
FIG. 14A

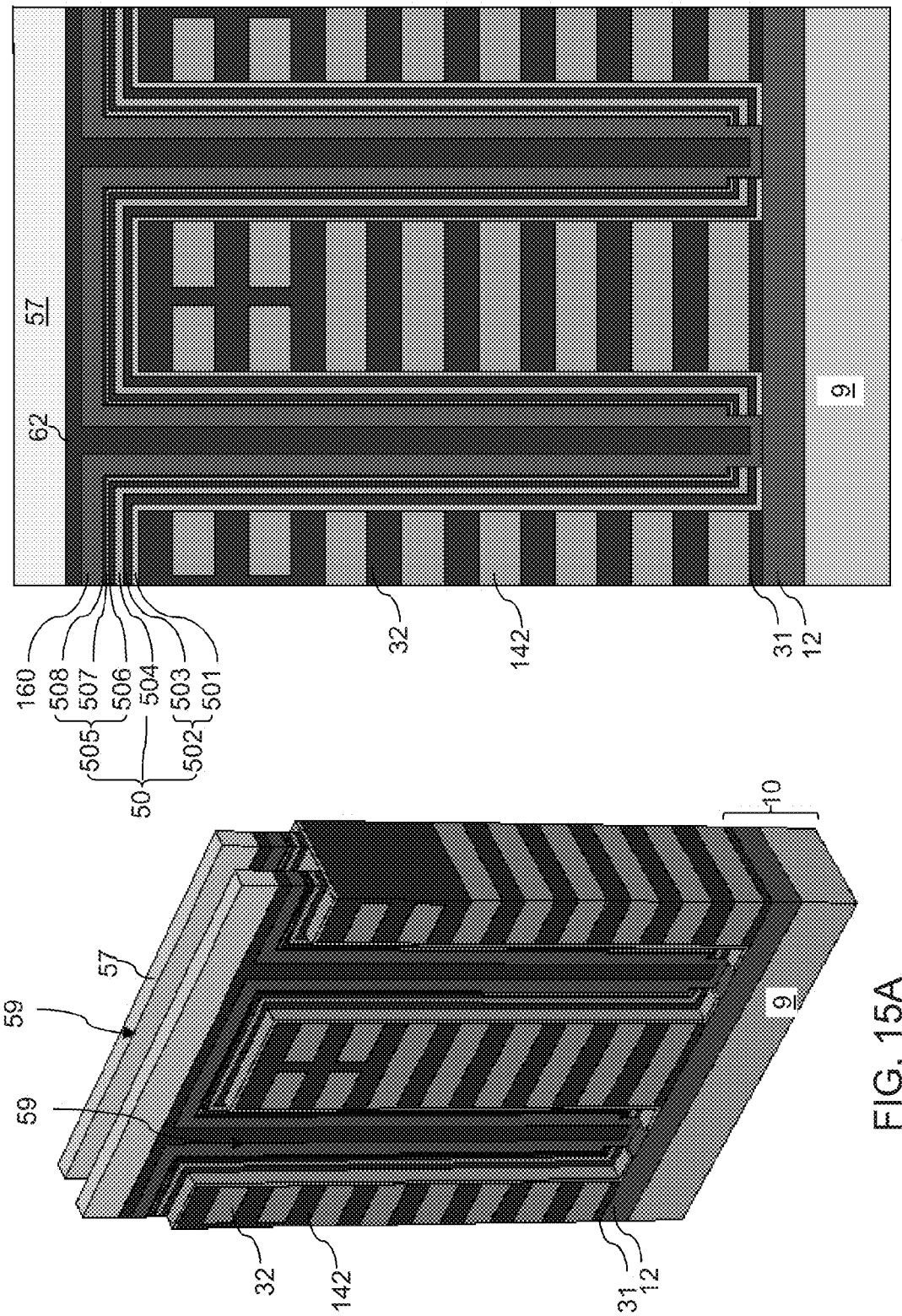

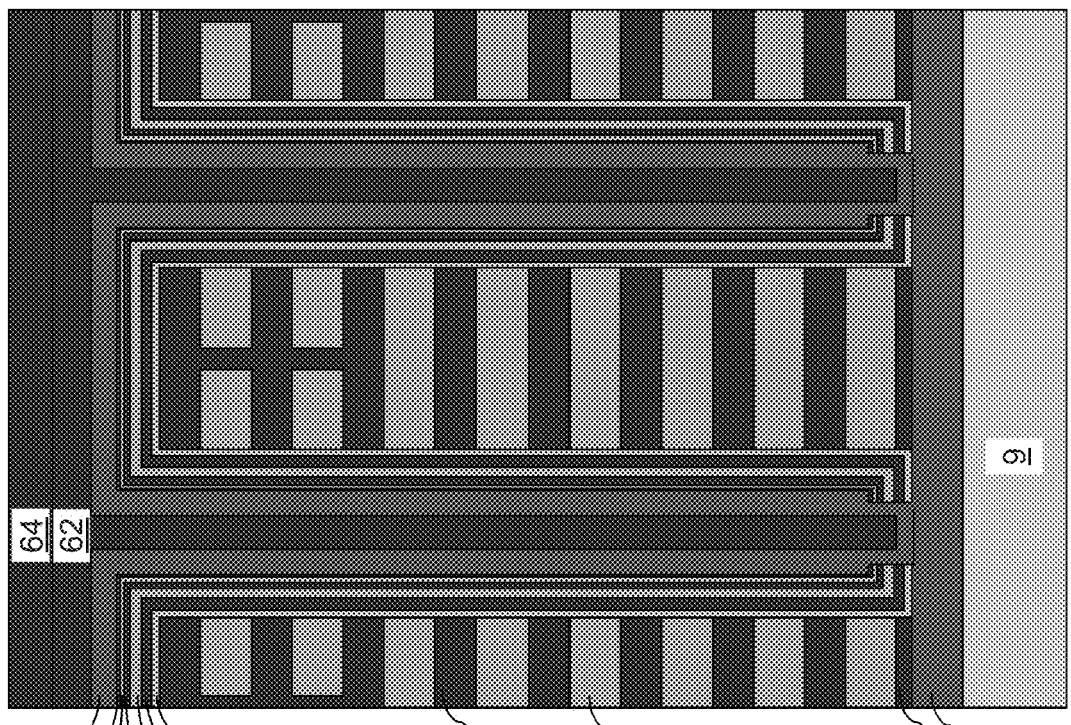
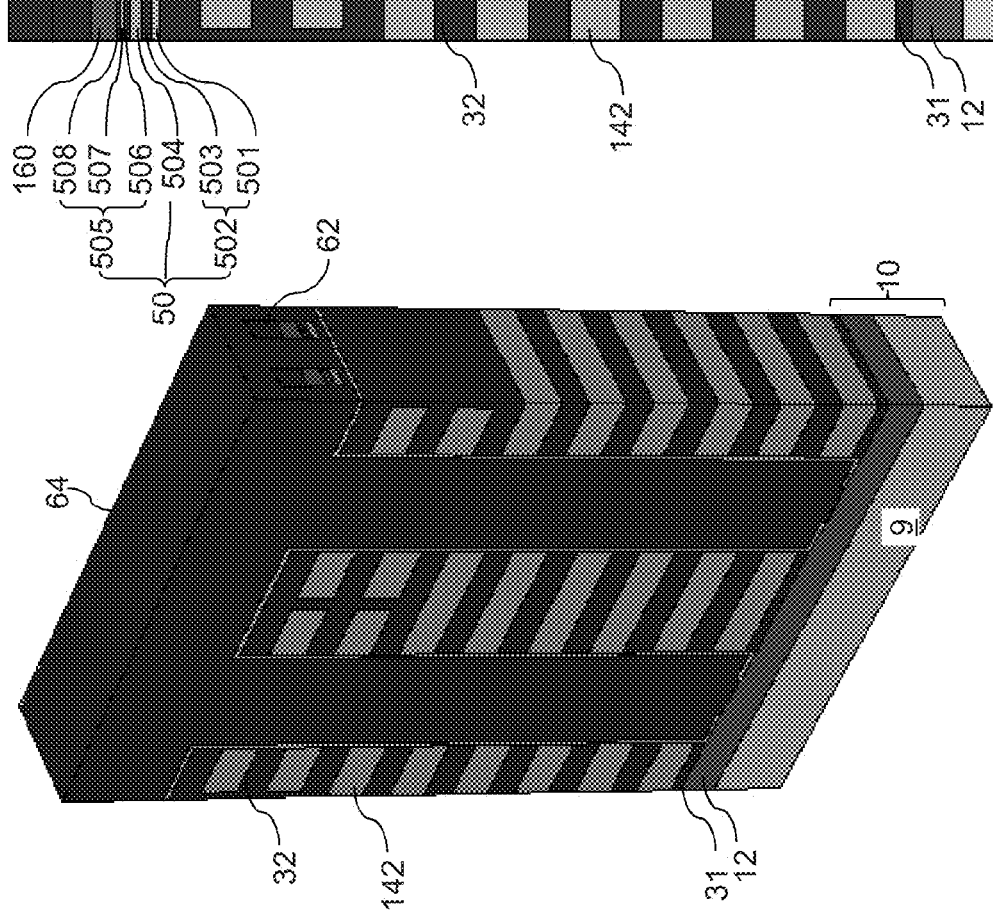
FIG. 16B
FIG. 16A

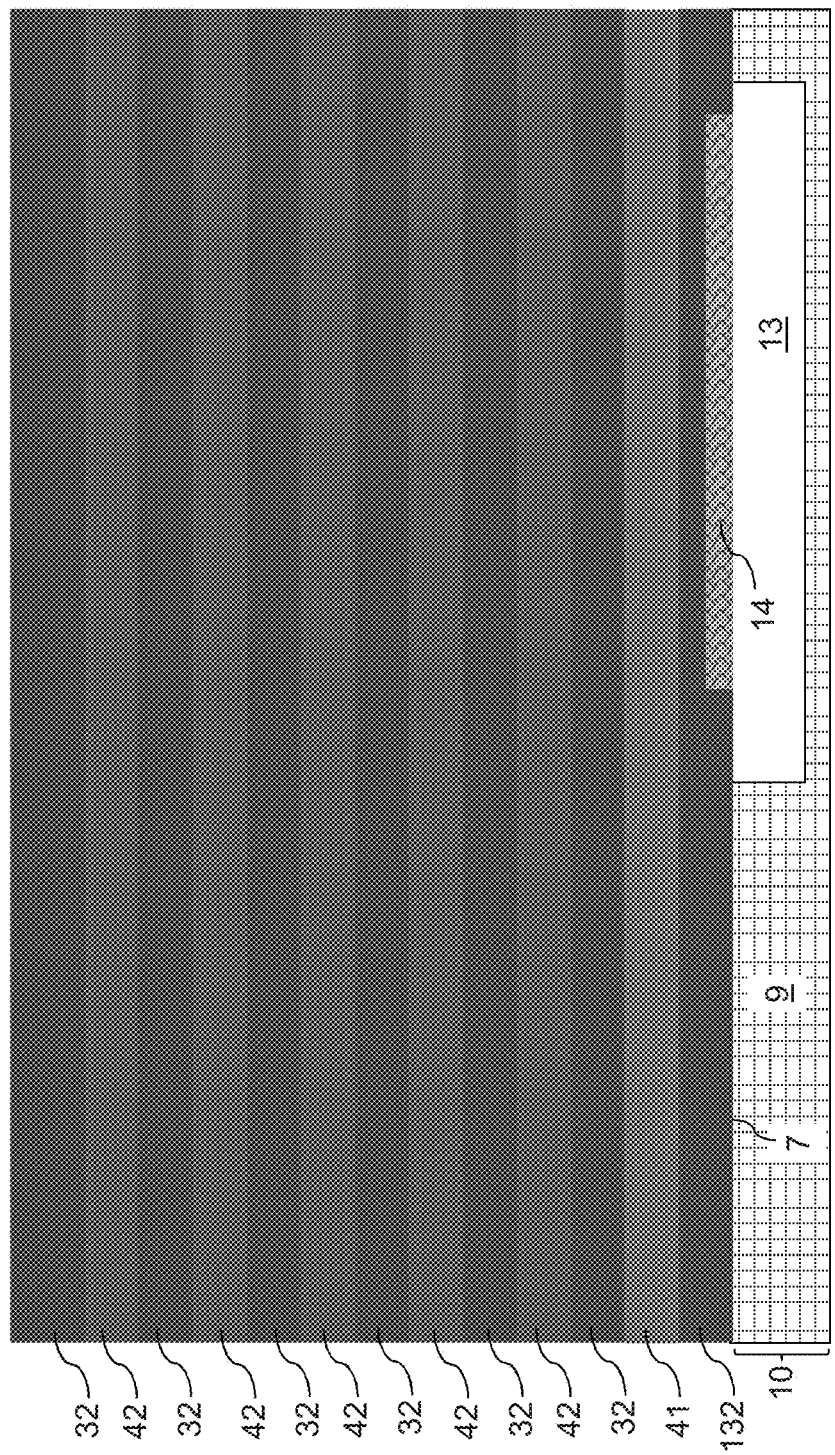

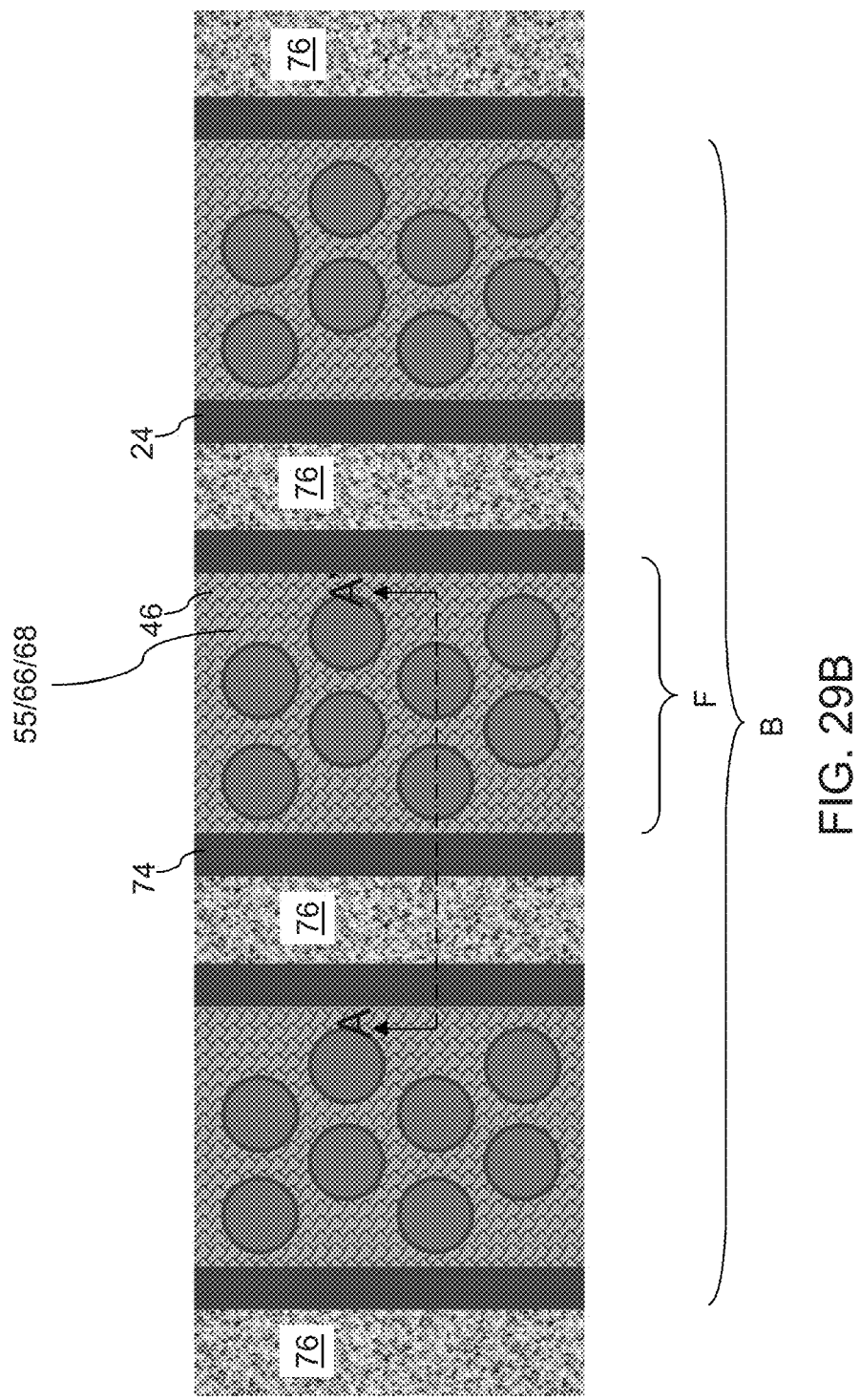

THREE-DIMENSIONAL MEMORY STRUCTURE HAVING A BACK GATE ELECTRODE

RELATED APPLICATIONS

The present application is related to a copending application Ser. No. 14/564,555, of which the entire content is incorporated herein by reference.

FIELD

The present disclosure relates generally to the field of semiconductor devices and specifically to three-dimensional memory structures, such as vertical NAND strings, that include a back gate electrode, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory structure is provided, which comprises a stack including an alternating plurality of insulator layers and electrically conductive layers, a trench extending through the stack and including a first sidewall and a second sidewall that are laterally spaced from each other, and a plurality of semiconductor strip structures straddling the trench. Each semiconductor strip structure contacts a respective portion of the first sidewall and a respective portion of the second sidewall and is laterally spaced from one another. The monolithic three-dimensional memory structure further comprises a back gate dielectric contacting inner sidewalls of the plurality of semiconductor strip structures, and a back gate electrode contacting inner sidewalls of the back gate dielectric.

According to another aspect of the present disclosure, a monolithic three-dimensional memory structure is provided, which comprises a stack including an alternating plurality of insulator layers and electrically conductive layers, a memory opening extending through the stack, and a pillar structure located within the memory opening and comprising a back gate electrode and a set of nested layers laterally surrounding the back gate electrode. The set of nested layers include, from inside to outside, a back gate dielectric, a semiconductor channel, and a memory film.

According to yet another aspect of the present disclosure, a method of manufacturing a monolithic three-dimensional memory structure is provided. A stack including an alternating plurality of first material layers and second material layers is formed over a substrate. A trench is formed, which vertically extends through the stack and laterally extends along a first horizontal direction. A plurality of semiconductor strip structures is formed, which straddles the trench and extends along a second horizontal direction that is different from the first horizontal direction. A back gate dielectric is formed on inner sidewalls of the plurality of semiconductor strip structures. A back gate electrode is formed on inner sidewalls of the back gate dielectric.

According to still another aspect of the present disclosure, a method of manufacturing a monolithic three-dimensional memory structure is provided. A stack including an alternating plurality of first material layers and second material layers is formed over a substrate. A memory opening is formed, which extends through the stack. A memory film is formed on a sidewall of the memory opening. A semiconductor channel is formed on the memory film within the memory opening. The semiconductor channel is electrically isolated from the substrate by the memory film. A back gate dielectric is formed on the semiconductor channel within the memory opening. A back gate electrode is formed on the back gate dielectric and within the memory opening.

According to another aspect of the present disclosure, a method of operating a three-dimensional memory device is provided. A three-dimensional memory device is provided, which comprises a stack including an alternating plurality of insulator layers and electrically conductive layers that include control gate electrodes located at their respective level, a plurality of charge storage elements located in the stack, a semiconductor channel located on a first side of the plurality of charge storage elements and within the stack, and a back gate electrode located on a second side of the plurality of charge storage elements and within the stack. A set of at least one charge storage element located at a selected level of the stack is programmed by injecting electrical charges into the set of at least one charge storage element. The total amount of electrical charge stored within the set of at least one charge storage element is a function of the selected mode of programming that is selected from among a plurality of modes of programming Electrical current through the semiconductor channel can be measured under a plurality of electrical bias conditions. Each of the plurality of electrical bias conditions differs from one another by at least one of a value for a backside bias voltage applied to the back gate electrode and a value for a control gate bias voltage applied to a control gate electrode located at the selected level. A subset of electrical bias conditions under which a respective measured electrical current through the semiconductor channel is below a predefined threshold level is identified. A total amount of electrical charge stored in the set of at least one charge storage element is determined based on the identified subset of electrical bias conditions.

BRIEF DESCRIPTION OF THE DRAWINGS

FIG. 1A is a perspective view of a first exemplary structure after formation of a stack of alternating plurality of material layers according to a first embodiment of the present disclosure.

FIG. 1B is a vertical cross-sectional view of the first exemplary structure of FIG. 1A.

FIG. 4A is a perspective view of the first exemplary structure after formation of a blocking dielectric layer, a tunneling dielectric layer, and a semiconductor material layer according to the first embodiment of the present disclosure.

FIG. 4B is a vertical cross-sectional view of the first exemplary structure of FIG. 4A.

FIG. 5A is a perspective view of the first exemplary structure after formation of a first dielectric cap material layer according to the first embodiment of the present disclosure.

FIG. 5B is a vertical cross-sectional view of the first exemplary structure of FIG. 5A.

FIG. 7A is a perspective view of the first exemplary structure after formation of a second dielectric cap material layer according to the first embodiment of the present disclosure.

FIG. 7B is a vertical cross-sectional view of the first exemplary structure of FIG. 7A.

FIG. 9A is a perspective view of the first exemplary structure after formation of a back gate dielectric and back gate electrodes according to the first embodiment of the present disclosure.

FIG. 9B is a vertical cross-sectional view of the first exemplary structure of FIG. 9A.

FIG. 10A is a perspective view of a second exemplary structure after formation of a stack of alternating plurality of material layers according to a second embodiment of the present disclosure.

FIG. 10B is a vertical cross-sectional view of the second exemplary structure of FIG. 1A.

FIG. 11A is a perspective view of the second exemplary structure after formation of electrically insulating portions according to the second embodiment of the present disclosure.

FIG. 11B is a vertical cross-sectional view of the second exemplary structure of FIG. 11A.

FIG. 13A is a perspective view of the second exemplary structure after formation of a blocking dielectric layer, a tunneling dielectric layer, and a semiconductor material layer according to the second embodiment of the present disclosure.

FIG. 13B is a vertical cross-sectional view of the second exemplary structure of FIG. 13A.

FIG. 14A is a perspective view of the second exemplary structure after formation of a first dielectric cap material layer according to the second embodiment of the present disclosure.

FIG. 14B is a vertical cross-sectional view of the second exemplary structure of FIG. 14A.

FIG. 15A is a perspective view of the second exemplary structure after patterning the first dielectric cap material layer and the semiconductor material layer according to the second embodiment of the present disclosure.

FIG. 15B is a vertical cross-sectional view of the second exemplary structure of FIG. 15A.

FIG. 16A is a perspective view of the second exemplary structure after formation of a second dielectric cap material layer according to the second embodiment of the present disclosure.

FIG. 16B is a vertical cross-sectional view of the second exemplary structure of FIG. 16A.

FIG. 19 is a vertical cross-sectional view of a third exemplary structure after formation of a stack including an alternating plurality of material layers according to a third embodiment of the present disclosure.

FIG. 29B is a horizontal cross-sectional view of the third exemplary structure of FIG. 29A along the plane B-B'. The vertical plane A-A' corresponds to the vertical plane of the vertical cross-sectional view of FIG. 29A.

DETAILED DESCRIPTION

Figure 2B:
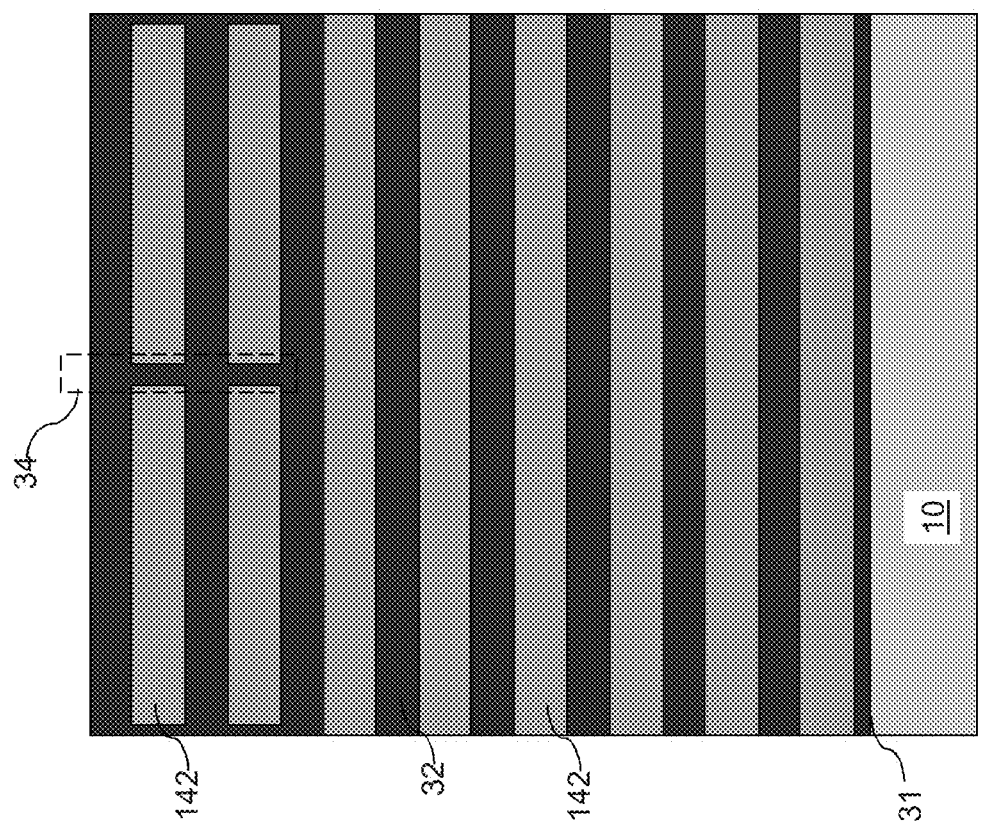
FIG. 2B is a vertical cross-sectional view of the first exemplary structure of FIG. 2A.

As discussed above, the present disclosure is directed to three-dimensional memory structures, such as vertical NAND strings, that include a back gate electrode, and methods of making thereof, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The exemplary structure includes a substrate 10, which can be a semiconductor substrate. The substrate can include a substrate semiconductor layer, and can include at least one elemental semiconductor material, at least one III-V compound semiconductor material, at least one II-VI compound semiconductor material, at least one organic semiconductor material, or other semiconductor materials known in the art. The substrate can have a major surface, which can be, for example, a topmost surface of the semiconductor material layer. The major surface can be a semiconductor surface. In one embodiment, the major surface can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device (not shown) for a peripheral circuitry can be formed on a portion of the substrate semiconductor layer. The at least one semiconductor device can include, for example, field effect transistors. For example, at least one dielectric material portion can be formed by etching portions of the semiconductor material layer and depositing a dielectric material therein. Optionally, a dielectric pad layer (not shown) can be formed above the semiconductor material layer. Optionally, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A dielectric cap layer (not shown) can be optionally formed.

A stack of an alternating plurality of first material layers 32 and second material layers 142 is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness there amongst, or may have different thicknesses. The second elements may have the same thickness there amongst, or may have different thicknesses. The alternating plurality of first material layers and second material layers may begin with an instance of the first material layers or with an instance of the second material layers. In one embodiment, the alternating plurality of first material layers and second material layers may end with an instance of the first material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer 32 can be an insulator layer, and each second material layer 142 can be a sacrificial material layer. In this case, the stack can include an alternating plurality of first material layers 32 and second material layers 142.

The stack of the alternating plurality is herein referred to as an alternating stack (32, 142). Each first material layer 32 can be composed of the first material, and each second material layer 142 can be composed a second material different from the first material. The first material of the first material layers 32 can be at least one electrically insulating material. In other words, the first material can be an insulator material, and each first material layer 32 can be an insulator layer. As such, each first material layer 32 can be an electrically insulating material layer. Electrically insulating materials that can be employed for the first material layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first material layers 32 can be silicon oxide.

In one embodiment, the second material of the second material layers 142 is a sacrificial material that can be removed selective to the first material of the first material layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In this case, the second material layers 142 may comprise an electrically insulating material, a semiconductor material, or a conductive material. The second material of the second material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the second material layers 142 can be material layers that comprise silicon nitride or a semiconductor material including at least one of silicon and germanium.

In one embodiment, the first material layers 32 can include silicon oxide, and sacrificial material layers can include silicon nitride sacrificial material layers. The first material of the first material layers 32 can be deposited, for example, by chemical vapor deposition (CVD). For example, if silicon oxide is employed for the first material layers 32, tetraethyl orthosilicate (TEOS) can be employed as the precursor material for the CVD process. The second material of the second material layers 142 can be formed, for example, CVD or atomic layer deposition (ALD).

Alternatively, the second material of the second material layers 142 is a permanent conductive material, i.e., a conductive material that is not subsequently replaced with any other material. In this case, the second material layers 142 can be conductive material layers. Exemplary conductive materials that can be employed as the second material include, but are not limited to, a conductive metallic nitride material (such as TiN, TaN, and WN), an elemental metal or an alloy thereof (such as W, Cu, Al, and alloys thereof), a doped semiconductor material, or a combination thereof.

The second material layers 142 can be suitably patterned so that conductive material portions that are immediately formed (in case the second material layers 142 are conductive material layers), or to be subsequently formed (by replacement of the sacrificial material of the second material layers 142 with a conductive material) can function as electrically conductive electrodes, such as the control gate electrodes of the monolithic three-dimensional NAND string memory devices to be subsequently formed. The second material layers 142 may comprise a portion having a strip shape extending substantially parallel to the major surface of the substrate.

The thicknesses of the first material layers 32 and the second material layers 142 can be in a range from 20 nm to 50 nm, although lesser and greater thicknesses can be employed for each first material layer 32 and for each second material layer 142. The number of repetitions of the pairs of a first material layer 32 and a sacrificial material layer (e.g., a control gate electrode or a sacrificial material layer) 142 can be in a range from 2 to 1,024, and typically from 8 to 256, although a greater number of repetitions can also be employed. The top and bottom gate electrodes in the stack may function as the select gate electrodes. In one embodiment, each second material layer 142 in the alternating stack (32, 142) can have a uniform thickness that is substantially invariant within each respective second material layer 142.

Figure 2A:
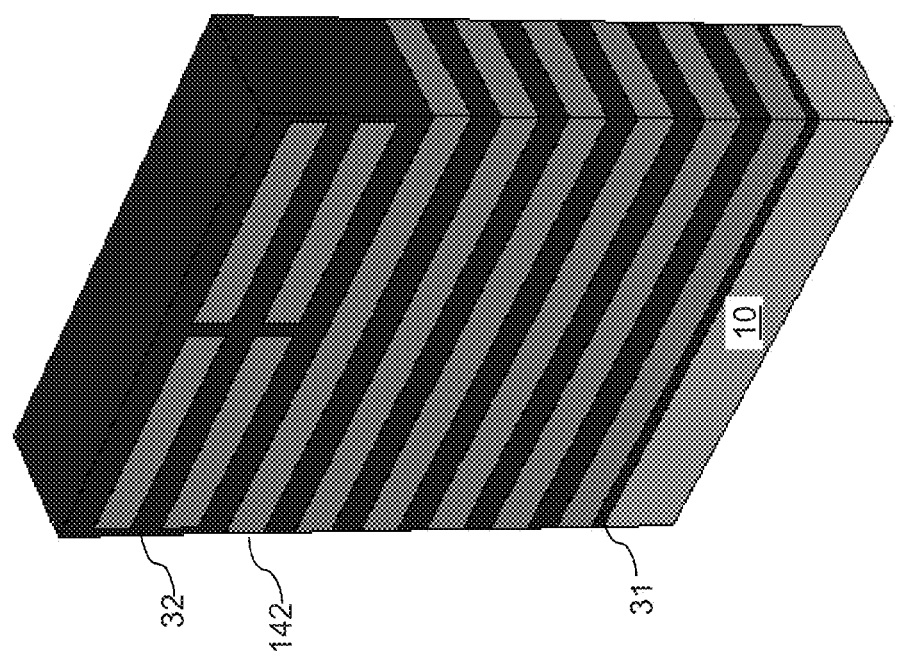
FIG. 2A is a perspective view of the first exemplary structure after formation of electrically insulating portions according to the first embodiment of the present disclosure.

Referring to FIGS. 2A and 2B, at least one trench can be formed through a set of at least one second material layer 142 located at a top portion of the alternating stack (32, 142). The set of the at least one second material layer 142 corresponds to at least one level in which drain select gate electrodes are to be subsequently formed. The total number of levels within the set of at least one second material layer 142 through which the at least one trench is formed can be the same as the number of levels within which the drain select gate electrodes are to be subsequently formed. Each of the at least one trench is filled with a dielectric material such as silicon oxide or a dielectric metal oxide to form a trench isolation structure 34.

Figure 3B:
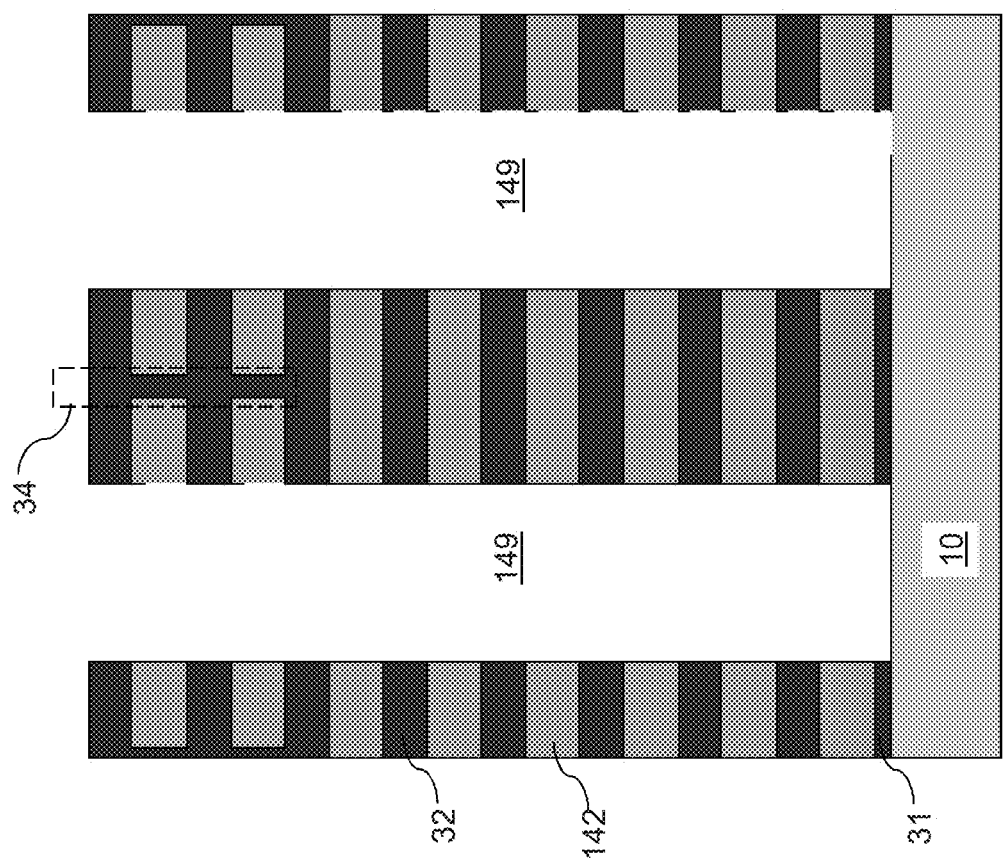
FIG. 3B is a vertical cross-sectional view of the first exemplary structure of FIG. 3A.
Figure 3A:
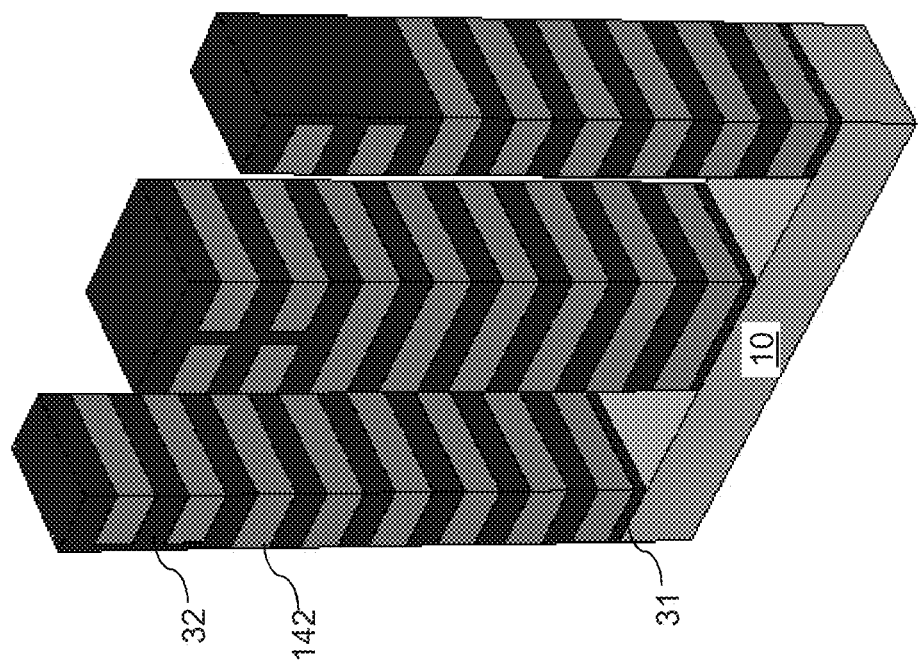
FIG. 3A is a perspective view of the first exemplary structure after formation of line trenches according to the first embodiment of the present disclosure.

Referring to FIGS. 3A and 3B, a lithographic material stack (not shown) including at least a photoresist layer can be formed over the alternating stack (32, 142), and can be lithographically patterned to form openings therein. The pattern of the opening can include shapes that extend farther along a first horizontal direction than along a second horizontal direction that is perpendicular to the first horizontal direction. In one embodiment, the pattern can be a periodic pattern that is repeated along at least one direction. The horizontal direction along which an opening in the photoresist layer extends farthest is herein referred to as the lengthwise direction of the opening. As used herein, a "lengthwise direction" of an element is a horizontal direction along which the element extends the farthest. A "widthwise" direction of an element is a horizontal direction along which the element extends the least. In one embodiment, the widthwise direction of each opening can be perpendicular to the lengthwise direction of the opening.

In one embodiment, the pattern of the opening in the photoresist layer can include rectangular shapes. In one embodiment, each opening can extend along a same lengthwise direction, and can have a uniform width along a same widthwise direction. As used herein, a "uniform" width refers to a width that is invariant under translation along the lengthwise direction. In one embodiment, the pattern of the openings in the photoresist layer can be a periodic pattern of lines that extend along the lengthwise direction and having a same uniform width, and having a uniform spacing along the widthwise direction.

The pattern in the lithographic material stack can be transferred through the entirety of the alternating stack (32, 142) by at least one anisotropic etch that employs the patterned lithographic material stack as an etch mask. Portions of the alternating stack (32, 142) underlying the openings in the patterned lithographic material stack are etched to form trenches that extend along a same lengthwise direction. The trenches are herein referred to as line trenches 49. As used herein, a line trench refers to a trench comprising at least one region in which a pair of sidewalls are parallel to each other and laterally extend along the direction of the sidewalls for a greater distance than the width of the respective region.

The transfer of the pattern in the patterned lithographic material stack through the alternating stack (32, 142) forms the line trenches 149 that vertically extend through the alternating stack (32, 142). The chemistry of the anisotropic etch process employed to etch through the materials of the alternating stack (32, 142) can alternate to optimize etching of the first and second materials in the alternating stack (32, 142). The anisotropic etch can be, for example, a series of reactive ion etches. The top surface of the substrate 10 may be used as an etch stop layer for the anisotropic etch. The sidewalls of line trenches 149 can be substantially vertical, or can be tapered. The patterned lithographic material stack can be subsequently removed, for example, by ashing.

In one embodiment, an overetch into the semiconductor material of the substrate 10 may be optionally performed after the top surface of the substrate 10 is physically exposed at a bottom of each line trench. The overetch may be performed prior to, or after, removal of the lithographic material stack. If the overetch is performed, the recessed surfaces of the semiconductor material layer may be vertically offset from the undressed top surfaces of the semiconductor material layer by a recess depth. The recess depth can be, for example, in a range from 0 nm to 50 nm, although lesser and greater recess depths can also be employed. The overetch is optional, and may be omitted. If the overetch is not performed, the bottom surface of each line trench 149 can be coplanar with the topmost surface of the semiconductor material layer. Each of the line trenches 149 can include a pair of parallel sidewalls that extends substantially perpendicular to the topmost surface of the substrate 10. The region in which the array of line trenches 149 is formed is herein referred to as a device region. Each line trench 149 vertically extends through the alternating stack (32, 142) and laterally extends along a first horizontal direction, which is the lengthwise direction of the line trench 149.

Referring to FIGS. 4A and 4B, a series of contiguous material layers including at least one blocking dielectric layer 502L, a memory material layer 504L, a tunneling dielectric layer 505L, and a semiconductor material layer 160L can be sequentially deposited in the line trenches 149 as a memory film layer 50L. The at least one blocking dielectric layer 502L can include, for example, a first blocking dielectric layer 501L and a second blocking dielectric layer 503L.

The first blocking dielectric layer 501L can be deposited on the sidewalls of each line trench 149 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed.

Subsequently, the memory material layer 504L, the tunneling dielectric layer 505L, and the semiconductor material layer 160L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions, for example, by being formed within lateral recesses into second material layers 142. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can be a stack including, from outside to inside, an outer silicon oxide layer 506L, a silicon nitride layer 507L, and an inner silicon oxide layer 508L. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The semiconductor material layer 160L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor material layer 160L includes amorphous silicon or polysilicon. The semiconductor material layer 160L can be formed by a conformal deposition method such as low pressure chemical vapor deposition (LPCVD). The thickness of the semiconductor material layer 160L can be in a range from 2 nm to 10 nm, although lesser and greater thicknesses can also be employed. A line cavity 149' is formed in the volume of each memory opening 49 that is not filled with the deposited material layers (501L, 503L, 504L, 505L, 601L).

Referring to FIGS. 5A and 5B, a dielectric material can be deposited in the line trenches 149 to fill the line cavities 149'. The dielectric material is concurrently deposited over the topmost surface of the semiconductor material layer 160L. The deposited dielectric material forms a contiguous dielectric material structure that fills the line cavities 149' and overlies the top surface of the semiconductor material layer 160L. The contiguous dielectric material structure is herein referred to as a first dielectric cap material layer 62L. The first dielectric cap material layer 62L includes a dielectric material such as silicon oxide, organosilicate glass (OSG), silicon nitride, a dielectric metal oxide, or a combination thereof. The thickness of the first dielectric cap material layer 62L, as measured above the topmost surface of the semiconductor material layer 160L, can be greater than one half of the width of the line cavities 149'. For example, the thickness of the first dielectric cap material layer 62L can be in a range from 10 nm to 100 nm, although lesser and greater thicknesses can also be employed.

Figures 6A, 6B:
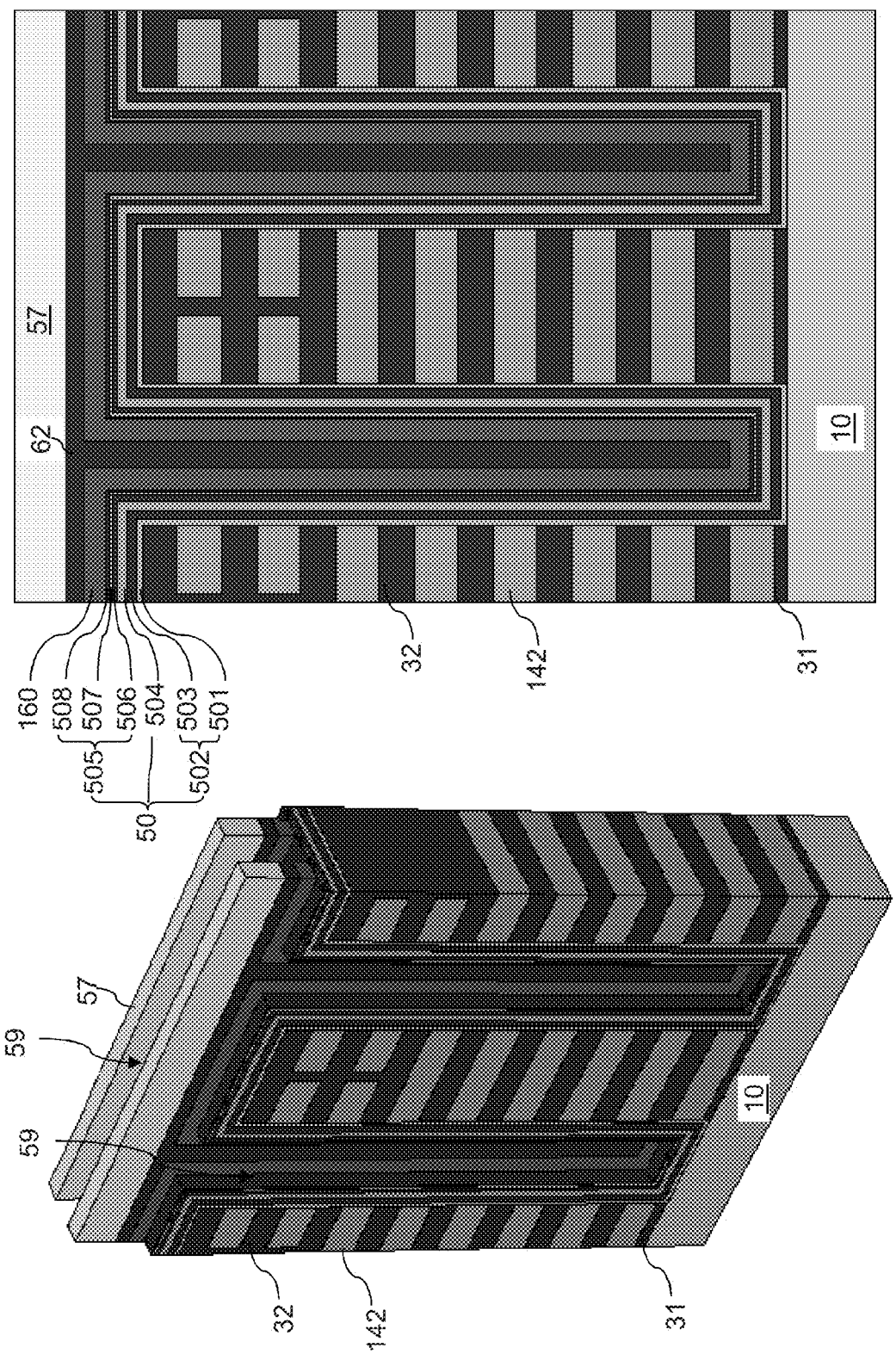
FIG. 6A is a perspective view of the first exemplary structure after patterning the first dielectric cap material layer and the semiconductor material layer according to the first embodiment of the present disclosure.
FIG. 6B is a vertical cross-sectional view of the first exemplary structure of FIG. 6A.

Referring to FIGS. 6A and 6B, a photoresist layer 57 is applied over the first dielectric cap material layer 62L, and is lithographically patterned to mask areas in the shapes of strips that straddle the line trenches. In one embodiment, the lengthwise direction of the patterned strips of the photoresist layer 57 can be perpendicular to the lengthwise direction of the line trenches. In one embodiment, the width of each patterned strip of the photoresist layer 57 can be uniform, and can be the same across a plurality of patterned strips of the photoresist layer 57. In one embodiment, the width of the patterned strips of the photoresist layer 57 can be selected from a range from 10 nm to 100 nm, although lesser and greater widths can also be employed. In one embodiment, lithographic methods such as photoresist trimming or pitch multiplication techniques can be employed to provide a plurality of patterned strips of photoresist layer 57 that extend along the widthwise direction of the line trenches. In one embodiment, the lengthwise direction of the patterned strips of the photoresist layer 57 can be perpendicular to the lengthwise direction of the line trenches.

The pattern in the photoresist layer 57 can be transferred through the first dielectric cap material layer 62L by an anisotropic etch that etches the dielectric material of the first dielectric cap material layer 62L and the semiconductor material of the semiconductor material layer 160L. In one embodiment, the anisotropic etch can comprise a first etch step in which the dielectric material of the first dielectric cap material layer 62L is etched selective to the semiconductor material of the semiconductor material layer 160L, and a second step in which the semiconductor material of the semiconductor material layer 160L is etched.

Each remaining portion of the first dielectric cap material layer 62L constitutes a dielectric cap material portion 62. Each dielectric cap material portion 62 includes a horizontal strip laterally extending along the first horizontal direction, and at least one first vertically extending dielectric pillar portion that protrudes downward into the line trenches. In one embodiment, each first vertically extending dielectric portion may have a shape of a rectangular column, i.e., a column having a rectangular horizontal cross-sectional area. Each remaining portion of the semiconductor material layer 160L constitutes a semiconductor strip structure 160, which can have a uniform width, and includes at least two upper horizontal portions located over the topmost horizontal surface of the memory film layer 50L, at least one pair of vertical portions located within the line trench, and at least one lower horizontal portion located in proximity to a bottom surface of the line trench.

A plurality of semiconductor strip structures 160 can be formed, which straddles each of the at least one line trench (that extends along a first horizontal direction). The plurality of semiconductor strip structures 160 extends along a second horizontal direction that is different from the first horizontal direction. In one embodiment, the second horizontal direction can be perpendicular to the first horizontal direction. The strips of semiconductor strip structures 160 are laterally spaced apart from one another. A discrete trench 59 can be formed in each volume within a line trench from which the materials of the semiconductor material layer 160L and the first dielectric cap material layer 62L are etched. The discrete trenches 59 can form a two-dimensional array of trenches with a first periodicity (pitch) that is the same as the periodicity of the line trenches along the first horizontal direction and with a second periodicity that is the same as the periodicity of the strips of the semiconductor strip structures 160 along the second horizontal direction. Each semiconductor strip structure 160 can include a plurality of semiconductor channels for three-dimensional memory devices.

In one embodiment, at least a portion of the memory film layer 50L can be patterned collaterally during the second step of the anisotropic etch, or by an additional processing step of the anisotropic etch. As used herein, a tunneling dielectric 505 refers to a remaining contiguous portion of the tunneling dielectric layer 505L after the anisotropic etch, which may be patterned into discrete strips after the anisotropic etch or may be present as a single contiguous layer underlying the semiconductor strip structures 160. A charge trapping layer 504 refers to each remaining contiguous portion of the memory film layer 504L, which may be patterned into discrete strips after the anisotropic etch or may be present as a single contiguous layer. A blocking dielectric 502 refers to each remaining contiguous portion of the blocking dielectric layer 502L. In one embodiment, a tunneling dielectric 505 can include an ONO stack. In this case, the tunneling dielectric 505 can include a stack including an outer silicon oxide portion 506, a silicon nitride portion 507, and an inner silicon oxide portion 508. In one embodiment, each blocking dielectric 502 can include a first blocking dielectric 501 that is a portion of the first blocking dielectric layer 501L and a second blocking dielectric 503 that is a portion of the second blocking dielectric layer 503L.

In one embodiment, at least one layer among the plurality of contiguous material layers of the memory film layer 50L can be patterned with the same pattern as the plurality of semiconductor strip structures 160 by the anisotropic etch. The anisotropic etch can employ another layer among the plurality of contiguous material layers in the memory film layer 50L as an etch stop layer. In an illustrative example, the tunneling dielectric layer 505L can be patterned into tunneling dielectrics 505 in a strip pattern employing the memory film layer 504L as an etch stop layer. In another example, the memory film layer 504L can be patterned into charge trapping layers 504 employing the blocking dielectric layer 502L as an etch stop layer.

The anisotropic etch can form a memory film 50 on a bottom surface of each line trench. Each memory film 50 can include a tunneling dielectric 505, a charge trapping layer 504, and a blocking dielectric 502. The plurality of semiconductor strip structures 160 is formed over a horizontal portion of the memory film 50, and is electrically isolated from the substrate 10 by the horizontal portion of the memory film 50. The photoresist layer 57 can be removed, for example, by ashing.

Referring to FIGS. 7A and 7B, a second dielectric cap material layer 64 can be deposited into the array of discrete cavities 59 and over the top surface of the dielectric cap material portions 62. The discrete cavities 59 are filled with the dielectric material of the second dielectric cap material layer 64. The second dielectric cap material layer 64 includes a dielectric material such as silicon oxide, organosilicate glass (OSG), silicon nitride, a dielectric metal oxide, or a combination thereof. The second dielectric cap material layer 64 can have the same material as, or a material different from, the at least one dielectric cap material portion 62. The second dielectric cap material layer 64 can be planarized, for example, by chemical mechanical planarization (CMP), a recess etch, or a combination thereof.

In one embodiment, the second dielectric cap material layer 64 includes a planar portion having a planar top surface and located above a horizontal plane including top surfaces of the dielectric cap material portions 62, strip portions extending along the first horizontal direction and located between horizontal portions of the dielectric cap material portions 62 and the semiconductor strip structures 160, below the horizontal plane including top surfaces of the dielectric cap material portions, and above the topmost surface of the alternating stack (32, 142), and second vertically extending dielectric pillar portions that are located between first vertically extending dielectric pillar portions of the dielectric cap material portions 62. Within each line trench, an alternating plurality of first vertically extending dielectric pillar portions of the dielectric cap material portions 62 and second vertically extending dielectric pillar portions of the second dielectric cap material layer 64 is provided, which extends along the first horizontal direction.

Figures 8A, 8B:
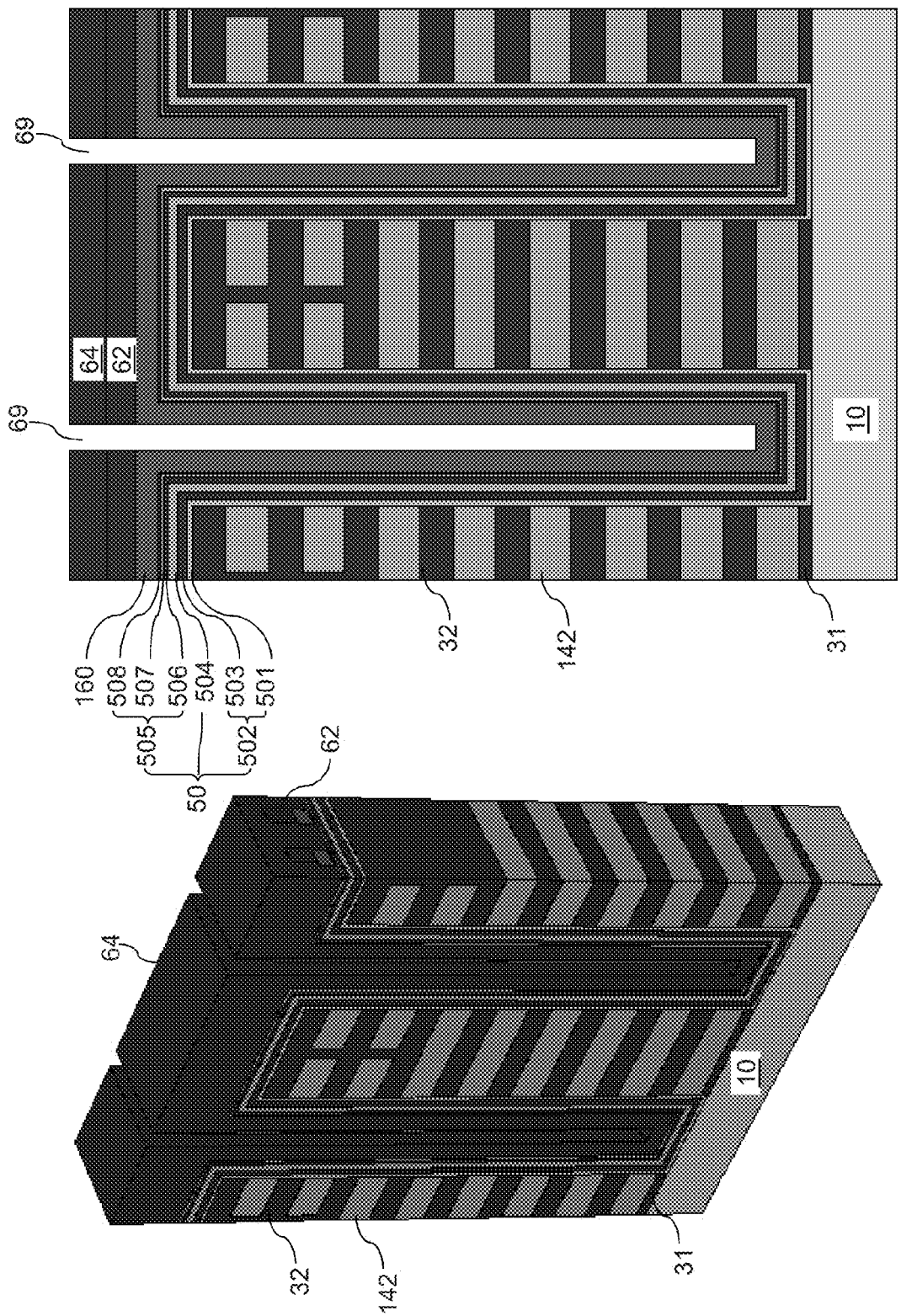
FIG. 8A is a perspective view of the first exemplary structure after formation of line cavities according to the first embodiment of the present disclosure.
FIG. 8B is a vertical cross-sectional view of the first exemplary structure of FIG. 8A.

Referring to FIGS. 8A and 8B, a photoresist layer (not shown) can be applied over the second dielectric cap material layer 64, and can be lithographically patterned to form openings that overlie the areas of the alternating pluralities of vertically extending dielectric pillar portions of the second dielectric cap material layer 64 and vertically extending dielectric pillar portions of the dielectric cap material portions 62. Each opening in the photoresist layer can laterally extend along the first horizontal direction, which is the lengthwise direction of the line trenches. Each opening in the photoresist layer can straddle bottommost horizontal portions of the plurality of semiconductor strip structures 160 that are located in proximity to bottom surfaces of the line trenches. In one embodiment, the lengthwise edges of an opening in the photoresist layer can be parallel to inner sidewalls of portions of a plurality of semiconductor strip structures 160 that are located within a same line trench. In one embodiment, lengthwise edges of an opening in the photoresist layer can laterally offset outward along the second horizontal direction from inner sidewalls of portions of a plurality of semiconductor strip structures 160 that are located within a same line trench.

The portions of the second dielectric cap material layer 64 and the portions of the dielectric cap material portions 62 within the area of each opening in the photoresist layer is removed employing an anisotropic etch that is selective to the semiconductor material of the plurality of semiconductor strip structures 160. The anisotropic etch can form a plurality of line cavities 69 that extend along the first horizontal direction. Each line cavity 69 can straddle a plurality of semiconductor strip structures 160. For each semiconductor channel that a line cavity 69 straddles, a pair of substantially vertical sidewalls of the semiconductor strip structure 160 and a horizontal top surface of a bottom portion of the semiconductor strip structure 160 can be physically exposed within the line cavity 69. Thus, sidewalls of a plurality of semiconductor strip structures 160 and top surfaces of horizontal bottom portions of the plurality of semiconductor channel can be physically exposed within the line cavity 69.

Referring to FIGS. 9A and 9B, a back gate dielectric 166 can be deposited within the line cavities 69. In one embodiment, the back gate dielectric 166 can be deposited as a single contiguous layer by a conformal deposition method such as low pressure chemical vapor deposition (LPCVD) and/or atomic layer deposition (ALD). The back gate dielectric 166 can include silicon oxide, silicon oxynitride, a dielectric metal oxide, or a stack thereof. The thickness of the back gate dielectric 166 can be in a range from 1 nm to 10 nm, although lesser and greater thicknesses can also be employed. The back gate dielectric 166 can be formed on inner sidewalls of the plurality of semiconductor strip structures 160.

A back gate electrode 168 can be formed within each remaining portion of the line cavities 69 by deposition of at least one conductive material and removal of the at least one conductive material from above the topmost surface of the back gate dielectric 166. Each remaining portion of the at least one conductive material constitutes a back gate electrode 168. In one embodiment, the at least one conductive material can include a metallic liner material such as TiN, TaN, and/or WN, and a metallic fill material such as W, Al, Cu, or a combination thereof.

Each back gate electrode 168 can be formed on inner sidewalls of the back gate dielectric 166. Each back gate dielectric 166 extends along the first horizontal direction within a line trench, and contacts surfaces of at least two of the plurality of semiconductor strip structures 160. Each back gate electrode 168 straddles the at least two of the plurality of semiconductor channels.

If the second material layers 142 are sacrificial material layers, the sacrificial material of the second material layers 142 can be replaced with a conductive material, which can include, for example, a conductive metallic nitride material (such as TiN, TaN, and WN), an elemental metal or an alloy thereof (such as W, Al, Cu, and alloys thereof), and a doped semiconductor material. Replacement of the sacrificial material with a conductive material can be performed, for example, by forming at least one trench that is intersects the alternating stack (32, 142), removing the sacrificial material of the second material layers 142 selective to the first material layers 32 and various structures located in the line trenches, and by depositing a conductive material in the backside recesses formed by removal of the sacrificial material. Alternatively, if the second material layer 142 are conductive material layers (for example, doped semiconductor layers or metallic material layers), replacement of the second material layers 142 with a conductive material can be omitted.

Contact via structures (not shown) can be formed through a topmost horizontal portion of the back gate dielectric 166 (if not removed during planarization of the conductive material of the back gate electrodes 168), and through the second dielectric cap material layer 64 and the dielectric cap material portions 62 to horizontal top portions of the semiconductor strip structures 160 that are located above a horizontal plane including the topmost surface of the alternating stack (32, 142). Each semiconductor channel corresponds to a portion of a semiconductor strip structure 160 that extends between a first contact via structure located on one side of a line trench and a second contact via structure located on the other side of the line trench. Each semiconductor channel includes a U-shaped portion of a semiconductor strip structure 160, a first horizontal portion adjoined to one end of the U-shaped portion and contacting a contact via structure (which can function as a source contact via structure), and a second horizontal portion adjoined to another end of the U-shaped portion and contacting another contact via structure (which can function as a drain contact via structure). In one embodiment, the horizontal portions of each semiconductor strip structure can be doped to form active regions that function as source regions and/or drain regions.

A U-shaped portion of a semiconductor strip structure 160 is located within a line trench and includes a horizontal semiconductor channel portion adjacent to a bottom of the line trench and a pair of vertically extending semiconductor channel portions adjoined to the horizontal semiconductor channel portion. A first horizontal portion of the semiconductor strip structure 160 is adjoined to a top end of a first vertically extending semiconductor channel portion among the pair of vertically extending semiconductor channel portions. A second horizontal portion of the semiconductor strip structure 160 is adjoined to a top end of a second vertically extending semiconductor channel portion among the pair of vertically extending semiconductor channel portions. The contact via structure that contacts the first horizontal portion of the semiconductor strip structure 160 can function as a source-side contact via structure, and the contact via structure that contacts the second horizontal portion of the semiconductor strip structure 160 can function as a drain-side contact via structure.

A memory film 50 can be located on the first sidewall, the second sidewall, and the top surface of the substrate 10. The memory film 50 can comprise a tunneling dielectric 505 in contact with at least one of the plurality of semiconductor strip structures 160. In one embodiment, the memory film 50 can comprise an element selected from a charge trapping layer and floating gate material portions. The back gate dielectric 166 can straddle at least two of the plurality of semiconductor strip structures 160, and the back gate electrode 168 can straddle at least two of the plurality of semiconductor strip structures 160. In one embodiment, the back gate dielectric 166 does not include a charge storage material or a charge trapping material (such as silicon nitride).

Each of the plurality of semiconductor strip structures 160 can include a respective first horizontal portion located over the stack (32, 142) and a respective second horizontal portion (32, 142) located at a bottom portion of the line trench. Each of the plurality of semiconductor strip structures 160 can further comprise a respective first vertical portion adjoined to the respective first horizontal portion and the respective second horizontal portion and contacting a portion of the first sidewall of the line trench, and a respective second vertical portion adjoined to a respective third horizontal portion located over the stack and the respective second horizontal portion and contacting a portion of the second sidewall of the line trench. The line trench can laterally extend along a first horizontal direction, and each of the plurality of semiconductor strip structures 160 can laterally extend along a second horizontal direction that is different from the first horizontal direction. In one embodiment, each of the plurality of semiconductor strip structures 160 can have a respective uniform width that is invariant under translation along the second horizontal direction.

Referring to FIGS. 10A and 10B, a second exemplary structure according to a second embodiment of the present disclosure can be derived from the first exemplary structure illustrated in FIGS. 1A and 1B by forming a source line layer 12 in an upper portion of the substrate 10. In one embodiment, the source line layer 12 can be formed by implanting electrical dopants into an upper portion of a substrate semiconductor layer 9 of the substrate 10. Alternatively or additionally, the source line layer 12 can be formed by depositing a doped semiconductor material layer, for example, by a selective epitaxy process. The source line layer 12 can be formed as a plurality of disjoined portions that are laterally spaced from one another along one direction, which can be a first horizontal direction along which line trenches to be subsequently formed extend. In an illustrative example, if a vertical NAND device employing an n-doped drain region and an n-doped source region is to be formed, the source line layer 12 can be a p-doped semiconductor layer. The thickness of the source line layer 12 can be in a range from 10 nm to 300 nm, although lesser and greater thicknesses can also be employed. An alternating stack (32, 142) of first material layers 32 and second material layers 142 can be formed above the source line layer 12 in the same manner as in the first embodiment.

Referring to FIGS. 11A and 11B, the processing steps of FIGS. 2A and 2B can be performed as in the first embodiment.

Figure 12B:
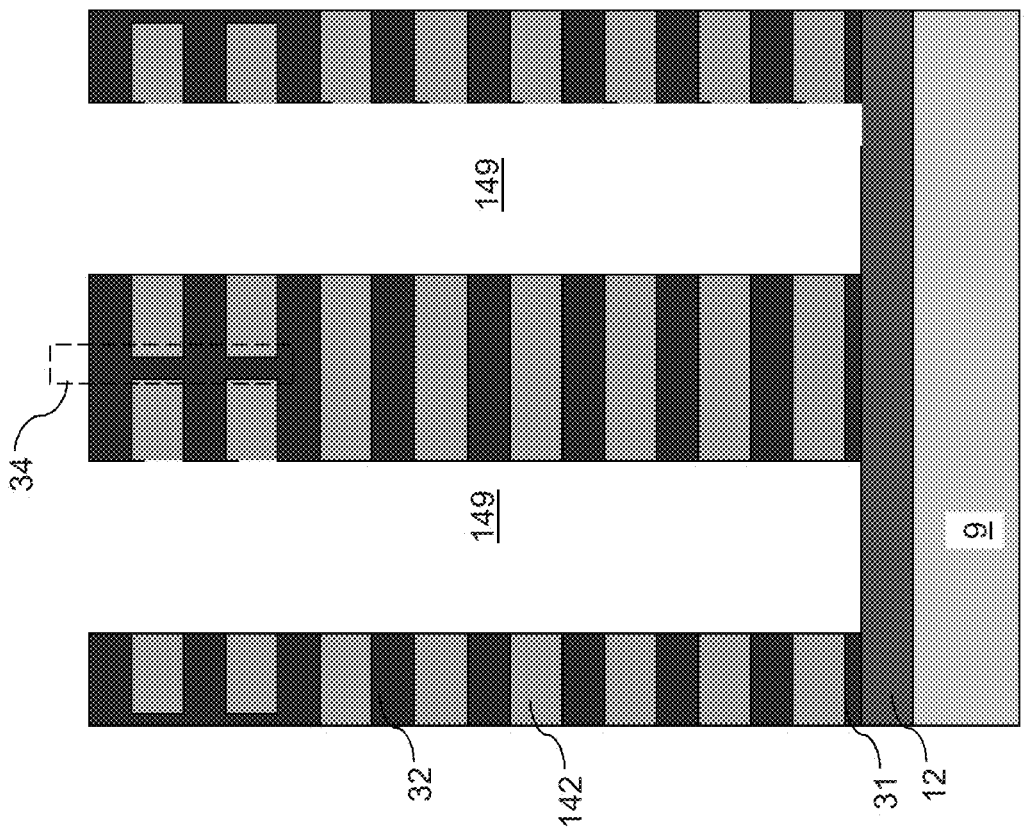
FIG. 12B is a vertical cross-sectional view of the second exemplary structure of FIG. 12A.
Figure 12A:
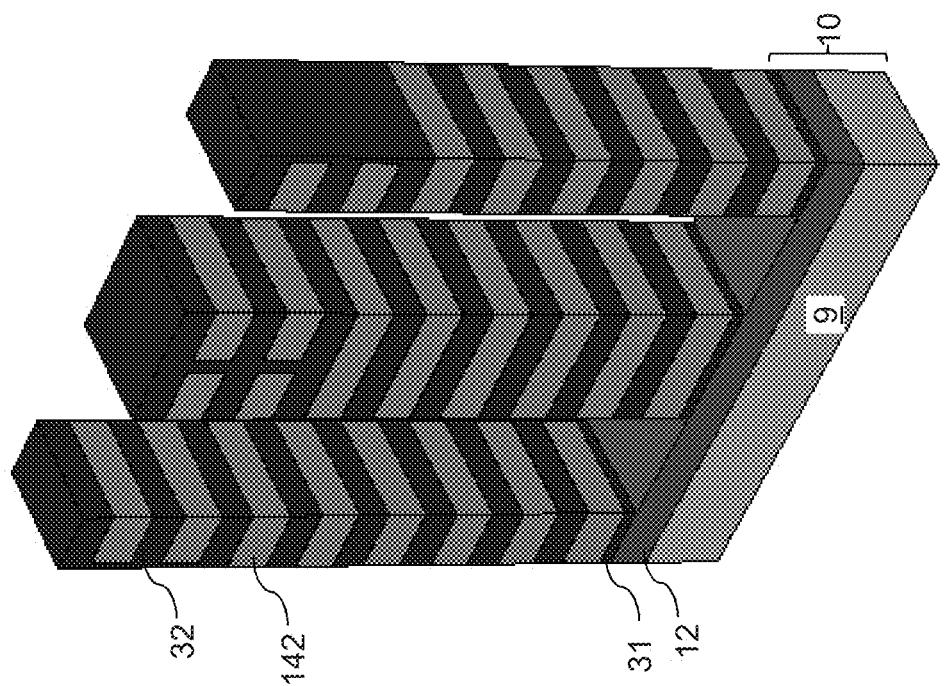
FIG. 12A is a perspective view of the second exemplary structure after formation of line trenches according to the second embodiment of the present disclosure.

Referring to FIGS. 12A and 12B, the processing steps of FIGS. 3A and 3B can be performed as in the first embodiment. A top surface of the source line layer 12 can be physically exposed at the bottom of each line trench 149.

Referring to FIGS. 13A and 13B, the processing steps of FIGS. 4A and 4B can be performed to form the memory film layer 50L as in the first embodiment. A first semiconductor material layer 601L can be deposited on the memory film layer 50L. The first semiconductor material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor material layer 601L includes amorphous silicon or polysilicon. The first semiconductor material layer 601L can be formed by a conformal deposition method such as low pressure chemical vapor deposition (LPCVD). The thickness of the first semiconductor material layer 601L can be in a range from 2 nm to 10 nm, although lesser and greater thicknesses can also be employed. A line cavity 149' is formed in the volume of each line trench that is not filled with the deposited material layers (501L, 503L, 504L, 5051, 601L).

Referring to FIGS. 14A and 14B, a photoresist layer (not shown) can be applied over the second exemplary structure, and can be lithographically patterned to form openings in the areas of the line cavities 149'. In one embodiment, peripheries of an opening in the patterned photoresist layer can cover the sidewalls of the first semiconductor material layer 601L inside a line trench. In another embodiment, peripheries of an opening in the patterned photoresist layer can overlie a topmost surface of the first semiconductor material layer 601L. In one embodiment, the shape of each opening in the patterned photoresist layer can be substantially the same as the shape of the horizontal surface of a bottom portion of the first semiconductor material layer 601L within an underlying line trench. Alternatively, a patterning process that does not employ a photoresist layer can be employed. In this case, an anisotropic etch process can be performed to remove horizontal portions of the first semiconductor material layer 601L and the memory film layer 50L, and to form an opening at a bottom of each line trench so that a top surface of the source line layer 12 is physically exposed at a bottom portion of each line trench. The vertical portions of the first semiconductor material layer 601L and the memory film layer 50L can remain on sidewalls of the line trenches.

An anisotropic etch can be performed to form openings through the bottom portions of the first semiconductor material layer 601L located within the line trenches. The horizontal portions of the first semiconductor material layer 601L, the tunneling dielectric layer 505L, the memory material layer 504L, and optionally one or more of the at least one blocking dielectric layer 502L at a bottom of each line cavity 149' can be removed to form openings in remaining portions thereof. Each of the first semiconductor material layer 601L, the tunneling dielectric layer 505L, the memory material layer 504L, and the at least one blocking dielectric layer 502L can be etched by anisotropic etch process.

A second semiconductor material layer 602L can be deposited directly on the semiconductor surface of the source line layer 12, and directly on the first semiconductor material layer 601L. The second semiconductor material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor material layer 602L includes amorphous silicon or polysilicon. The second semiconductor material layer 602L can be formed by a conformal deposition method such as low pressure chemical vapor deposition (LPCVD). The thickness of the second semiconductor material layer 602L can be in a range from 2 nm to 10 nm, although lesser and greater thicknesses can also be employed. The second semiconductor material layer 602L may partially fill the line cavity 149' in each line trench. The first and second semiconductor material layers (601L, 602L) collectively constitute a semiconductor material layer 160L.

A dielectric material can be deposited in the line trenches 149 to fill the line cavities 149'. The dielectric material is concurrently deposited over the topmost surface of the semiconductor material layer 160L. The deposited dielectric material forms a contiguous dielectric material structure that fills the line cavities 149' and overlies the top surface of the semiconductor material layer 160L. The contiguous dielectric material structure is herein referred to as a first dielectric cap material layer 62L. The first dielectric cap material layer 62L includes a dielectric material such as silicon oxide, organosilicate glass (OSG), silicon nitride, a dielectric metal oxide, or a combination thereof. The thickness of the first dielectric cap material layer 62L, as measured above the topmost surface of the semiconductor material layer 160L, can be greater than one half of the width of the line cavities 149'. For example, the thickness of the first dielectric cap material layer 62L can be in a range from 10 nm to 100 nm, although lesser and greater thicknesses can also be employed.

Referring to FIGS. 15A and 15B, the processing steps of FIGS. 6A and 6B can be performed to pattern the first dielectric cap material layer 62L into dielectric cap material portions 62, and to pattern the semiconductor material layer 160L into a plurality of semiconductor strip structures 160 in the same manner as in the first embodiment. For example, a photoresist layer 57 can be applied over the first dielectric cap material layer 62L, and is lithographically patterned to mask areas in the shapes of strips that straddle the line trenches. In one embodiment, the lengthwise direction of the patterned strips of the photoresist layer 57 can be perpendicular to the lengthwise direction of the line trenches.

The pattern in the photoresist layer 57 can be transferred through the first dielectric cap material layer 62L by an anisotropic etch that etches the dielectric material of the first dielectric cap material layer 62L and the semiconductor material of the semiconductor material layer 160L. In one embodiment, the anisotropic etch can comprise a first etch step in which the dielectric material of the first dielectric cap material layer 62L is etched selective to the semiconductor material of the semiconductor material layer 160L, and a second step in which the semiconductor material of the semiconductor material layer 160L is etched.

Each remaining portion of the first dielectric cap material layer 62L constitutes a dielectric cap material portion 62. Each dielectric cap material portion 62 includes a horizontal strip laterally extending along the first horizontal direction, and at least one first vertically extending dielectric pillar portion that protrudes downward into the line trenches. In one embodiment, each first vertically extending dielectric portion may have a shape of a rectangular column, i.e., a column having a rectangular horizontal cross-sectional area. Each remaining portion of the semiconductor material layer 160L constitutes a semiconductor strip structure 160, which can have a uniform width, and includes at least two upper horizontal portions located over the topmost horizontal surface of the memory film layer 50L, at least one pair of vertical portions located within the line trench, and at least one lower horizontal portion located in proximity to a bottom surface of the line trench.

A plurality of semiconductor strip structures 160 can be formed, which straddles each of the at least one line trench (that extends along a first horizontal direction). The plurality of semiconductor strip structures 160 extends along a second horizontal direction that is different from the first horizontal direction. In one embodiment, the second horizontal direction can be perpendicular to the first horizontal direction. The strips of semiconductor strip structures 160 are laterally spaced apart from one another. A discrete trench 59 can be formed in each volume within a line trench from which the materials of the semiconductor material layer 160L and the first dielectric cap material layer 62L are etched. The discrete trenches 59 can form a two-dimensional array of trenches with a first periodicity (pitch) that is the same as the periodicity of the line trenches along the first horizontal direction and with a second periodicity that is the same as the periodicity of the strips of the semiconductor strip structures 160 along the second horizontal direction.

In one embodiment, at least a portion of the memory film layer 50L can be patterned collaterally during the second step of the anisotropic etch, or by an additional processing step of the anisotropic etch. As used herein, a tunneling dielectric 505 refers to a remaining contiguous portion of the tunneling dielectric layer 505L after the anisotropic etch, which may be patterned into discrete strips after the anisotropic etch or may be present as a single contiguous layer underlying the semiconductor strip structures 160. A charge trapping layer 504 refers to each remaining contiguous portion of the memory film layer 504L, which may be patterned into discrete strips after the anisotropic etch or may be present as a single contiguous layer. A blocking dielectric 502 refers to each remaining contiguous portion of the blocking dielectric layer 502L. In one embodiment, a tunneling dielectric 505 can include an ONO stack. In this case, the tunneling dielectric 505 can include a stack including an outer silicon oxide portion 506, a silicon nitride portion 507, and an inner silicon oxide portion 508. In one embodiment, each blocking dielectric 502 can include a first blocking dielectric 501 that is a portion of the first blocking dielectric layer 501L and a second blocking dielectric 503 that is a portion of the second blocking dielectric layer 503L.

In one embodiment, at least one layer among the plurality of contiguous material layers of the memory film layer 50L can be patterned with the same pattern as the plurality of semiconductor strip structures 160 by the anisotropic etch. The anisotropic etch can employ another layer among the plurality of contiguous material layers in the memory film layer 50L as an etch stop layer. In an illustrative example, the tunneling dielectric layer 505L can be patterned into tunneling dielectrics 505 in a strip pattern employing the memory film layer 504L as an etch stop layer. In another example, the memory film layer 504L can be patterned into charge trapping layers 504 employing the blocking dielectric layer 502L as an etch stop layer.

The anisotropic etch can form a memory film 50 on a bottom surface of each line trench. Each memory film 50 can include a tunneling dielectric 505, a charge trapping layer 504, and a blocking dielectric 502. The plurality of semiconductor strip structures 160 is formed over a horizontal portion of the memory film 50, and is electrically isolated from the substrate 10 by the horizontal portion of the memory film 50. The photoresist layer 57 can be removed, for example, by ashing.

Referring to FIGS. 16A and 16B, the processing steps of FIGS. 7A and 7B can be performed to form a second dielectric cap material layer 64 in the same manner as in the first embodiment.

Figures 17A, 17B:
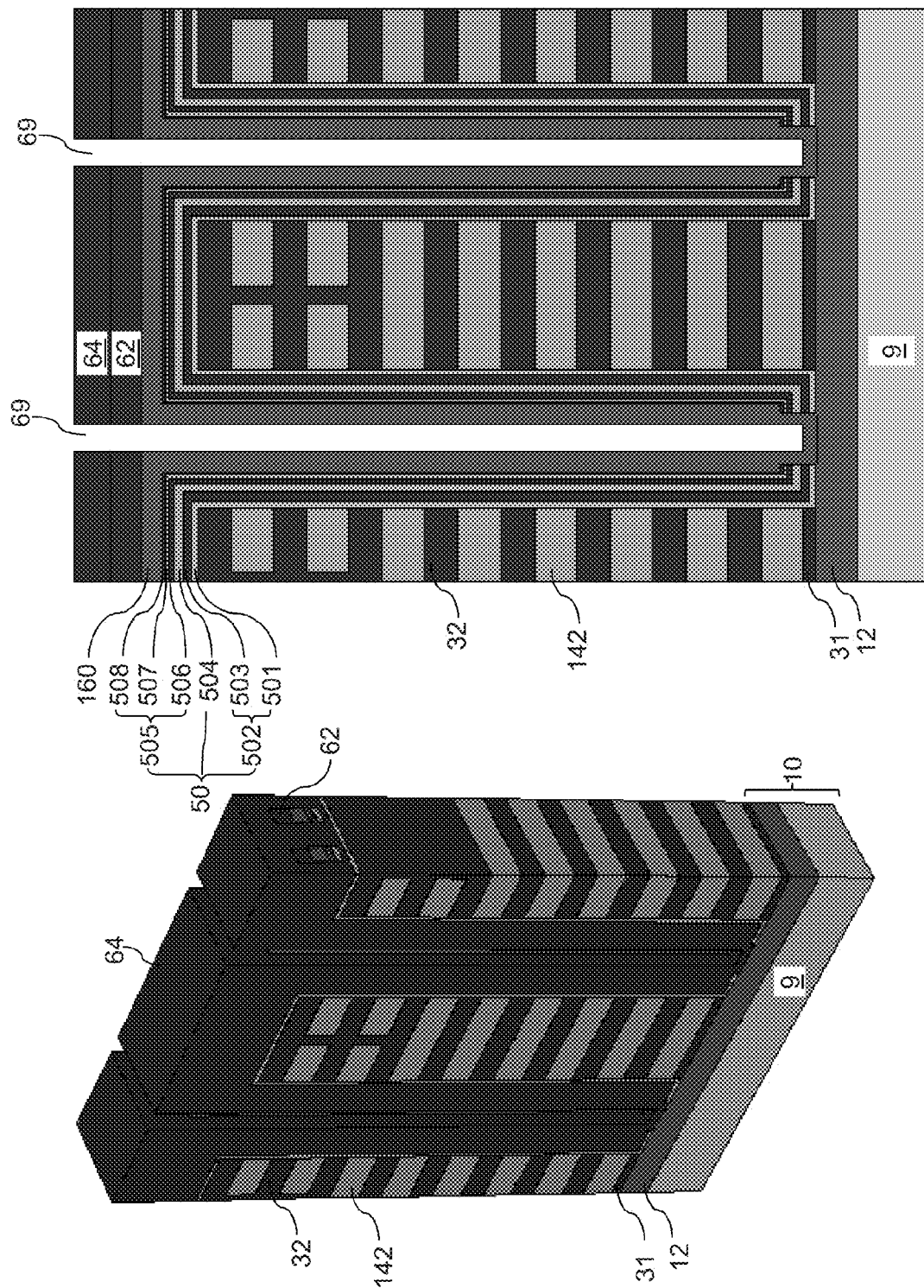
FIG. 17A is a perspective view of the second exemplary structure after formation of line cavities according to the second embodiment of the present disclosure.
FIG. 17B is a vertical cross-sectional view of the second exemplary structure of FIG. 17A.

Referring to FIGS. 17A and 17B, the processing steps of FIGS. 8A and 8B can be performed to form line trenches 69 in the same manner as in the first embodiment.

Figures 18A, 18B:
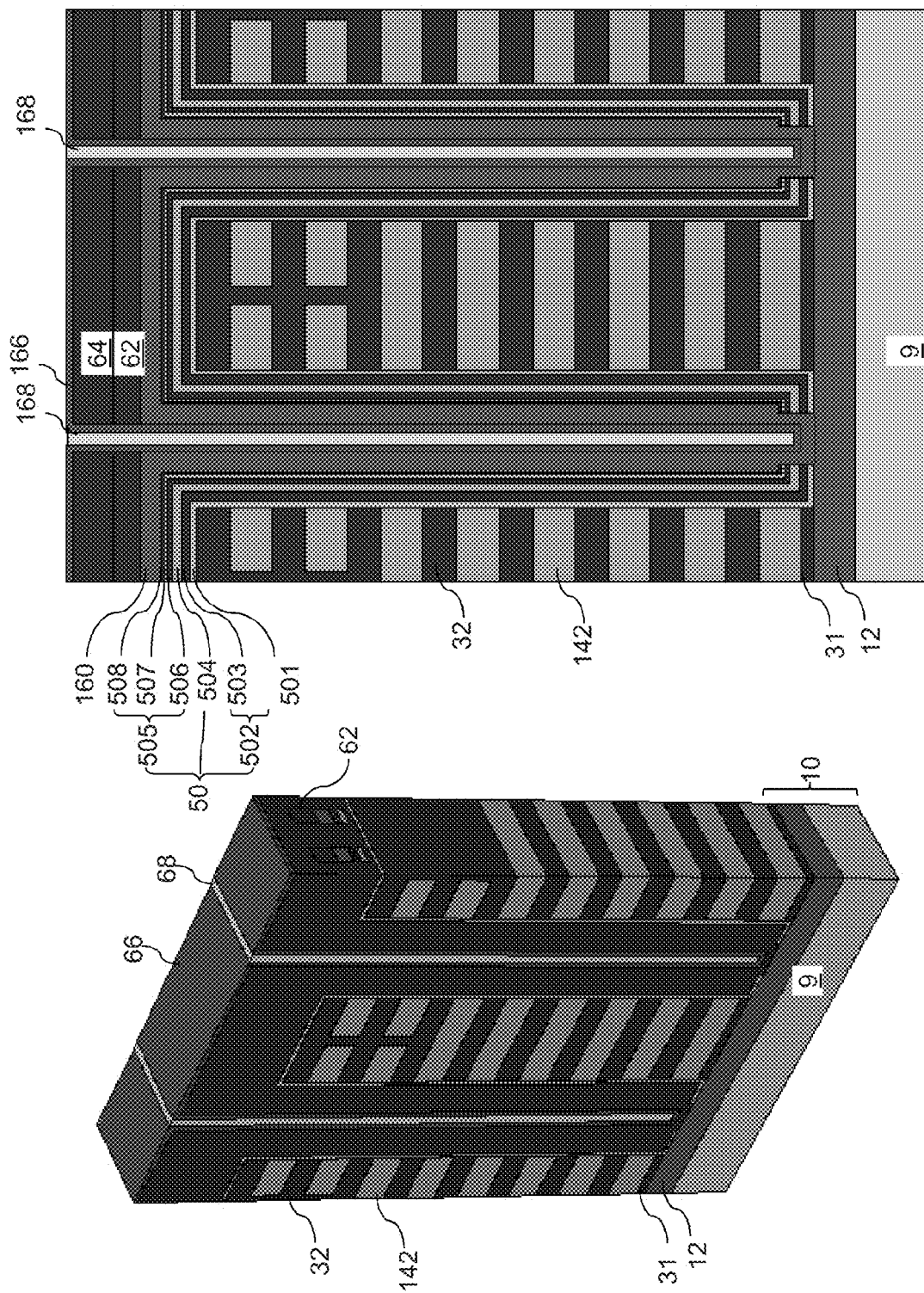
FIG. 18A is a perspective view of the second exemplary structure after formation of a back gate dielectric and back gate electrodes according to the second embodiment of the present disclosure.
FIG. 18B is a vertical cross-sectional view of the second exemplary structure of FIG. 18A.

Referring to FIGS. 18A and 18B, the processing steps of FIGS. 9A and 9B can be performed to form a back gate dielectric 166 and back gate electrodes 168 in the same manner as in the first embodiment.

If the second material layers 142 are sacrificial material layers, the sacrificial material of the second material layers 142 can be replaced with a conductive material, which can include, for example, a conductive metallic nitride material (such as TiN, TaN, and WN), an elemental metal or an alloy thereof (such as W, Al, Cu, and alloys thereof), and a doped semiconductor material. Replacement of the sacrificial material with a conductive material can be performed, for example, by forming at least one trench that is intersects the alternating stack (32, 142), removing the sacrificial material of the second material layers 142 selective to the first material layers 32 and various structures located in the line trenches, and by depositing a conductive material in the backside recesses formed by removal of the sacrificial material. Alternatively, if the second material layer 142 are conductive material layers (for example, doped semiconductor layers or metallic material layers), replacement of the second material layers 142 with a conductive material can be omitted.

A source region (not shown) can be formed in, or over, the substrate 10 such that the source region contacts the source line layer 12. In one embodiment, the source region can have a doping of an opposite conductivity type than the doping of the source line layer 12. A backside contact via structure (not shown) can be formed on each source region through the stack of an alternating plurality of insulator layers 32 and conductive material layers (which can be the second material layers 142 if the second material layers include a conductive material, or can be formed by replacement of the second material layers 142 if the second material layers include a sacrificial material). The backside contact via structure can be electrically isolated from the alternating stack by a dielectric spacer.

Drain regions can be formed in horizontal portions of the semiconductor strip structures 160 that overlie the alternating stack (32, 142), for example, by implantation of electrical dopants, which can be p-type dopants or n-type dopants. Drain contact via structures (not shown) can be formed through a topmost horizontal portion of the back gate dielectric 166 (if not removed during planarization of the conductive material of the back gate electrodes 168), and through the second dielectric cap material layer 64 and the dielectric cap material portions 62 to horizontal top portions of the semiconductor strip structures 160 that are located above a horizontal plane including the topmost surface of the alternating stack (32, 142).

During operation of the three-dimensional memory device, electrical current can flow through a source-side contact via structure (not shown) extending through the alternating stack (32, 142), a source region located in (or over) the substrate 10, the source line layer 12 located in (or over) a portion of the substrate 10, a vertically extending portion of a semiconductor strip structure 160, a drain region formed in a horizontal portion of the semiconductor strip structure 160, and a drain-side contact via structure that extends through the alternating stack (32, 142). A vertical portion of the semiconductor strip structure 160 functions as a portion of a semiconductor channel for a three-dimensional memory device. A horizontal portion of the semiconductor strip structure 160 adjoined to the vertical portion of the semiconductor strip structure 160 can be a drain region. The contact via structure that contacts the horizontal portion of the semiconductor strip structure 160 can function as a drain-side contact via structure.

A memory film 50 can be located on the first sidewall, the second sidewall, and the top surface of the substrate 10. The memory film 50 can comprise a tunneling dielectric 505 in contact with at least one of the plurality of semiconductor strip structures 160. In one embodiment, the memory film 50 can comprise an element selected from a charge trapping layer and floating gate material portions. The back gate dielectric 166 can straddle at least two of the plurality of semiconductor strip structures 160, and the back gate electrode 168 straddle at least two of the plurality of semiconductor strip structures 160. The semiconductor channels in the semiconductor strip structure 160 can be electrically shorted to the source line layer 12 located in (or over) the substrate 10. Each source line layer 12 can be laterally spaced from, and electrically isolated from, adjacent semiconductor channel layers 12 along the first horizontal direction (which is the direction along which the line trenches extend). The source line layers 12 can extend along the second horizontal direction that is perpendicular to the first horizontal direction.

Each of the plurality of semiconductor strip structures 160 can include a respective first horizontal portion located over the stack (32, 142) and a respective second horizontal portion (32, 142) located at a bottom portion of the line trench. Each of the plurality of semiconductor strip structures 160 can further comprise a respective first vertical portion adjoined to the respective first horizontal portion and the respective second horizontal portion and contacting a portion of the first sidewall of the line trench, and a respective second vertical portion adjoined to a respective third horizontal portion located over the stack and the respective second horizontal portion and contacting a portion of the second sidewall of the line trench. The line trench can laterally extend along a first horizontal direction, and each of the plurality of semiconductor strip structures 160 can laterally extend along a second horizontal direction that is different from the first horizontal direction. In one embodiment, each of the plurality of semiconductor strip structures 160 can have a respective uniform width that is invariant under translation along the second horizontal direction.

Referring to FIG. 19, a third exemplary structure according to a third embodiment of the present disclosure is shown. The third exemplary structure includes a substrate 10, which includes a substrate semiconductor layer 9. The substrate semiconductor layer 9 is a semiconductor material layer located at least in an upper portion of a substrate, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

An optional dielectric material portion 13 can be formed within the substrate semiconductor layer 9, for example, by forming a shallow trench in an upper portion of the substrate semiconductor layer 9, filling the shallow trench with a dielectric material, and removing an excess portion of the dielectric material from above the top surface of the substrate semiconductor layer 9 employing a planarization process such as a chemical mechanical planarization (CMP) process. The remaining portion of the dielectric material constitutes the dielectric material portion. The dielectric material portion includes a dielectric material such as silicon oxide, silicon nitride, a dielectric metal oxide, or a combination thereof.

A patterned conductive material layer 14 can be formed on the top surface of the dielectric material portion 13. The patterned conductive material layer 14 can be formed, for example, by depositing a layer of a conductive material over the substrate 10, and patterning the deposited conductive material by a combination of lithographic methods and an etch process. For example, a photoresist layer may be applied and patterned to mask a portion of the deposited conductive material, and unmasked portions of the deposited conductive material can be removed by an etch process. The remaining portion of the conductive material constitutes the patterned conductive material layer 14. In one embodiment, the conductive material layer 14 can be a metallic material layer. In one embodiment, the conductive material layer 14 can include a stack, from bottom to top, of a conductive metallic nitride layer including a conductive metallic nitride (such as TiN, TaN, and WN) and a metallic material layer including an elemental metal or an alloy thereof (such as W, Al, Cu, or an ally thereof). The thickness of the conductive material layer 14 can be in a range from 2 nm to 40 nm, although lesser and greater thicknesses can also be employed. In one embodiment, the entire periphery of the conductive material layer 14 can be entirely within an area defined by the periphery of the dielectric material portion 13.

Alternatively, the conductive material layer 14 may be formed as a doped semiconductor layer within an upper portion of the substrate 10. In this case, the doped semiconductor layer can be electrically isolated from the substrate semiconductor layer 9 by a reverse-biased p-n junction between the doped semiconductor layer and the substrate semiconductor layer 9. The dielectric material portion 13 electrically isolated the conductive material layer 14 from the substrate semiconductor layer 9.

A bottommost insulator layer 132 can be formed over the substrate 10 and the conductive material layer 14. The bottommost insulator layer 132 includes an electrically insulating material. Electrically insulating materials that can be employed for the bottommost insulator layer 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the bottommost insulator layer 132 can include the same material as insulator layers to be subsequently formed. In one embodiment, the bottommost insulator layer 132 can include silicon oxide.

A temporary material layer 41 can be formed over the bottommost insulator layer 132. The temporary material layer 41 includes a material that can be removed selective to a first material of the insulator layers to be subsequently formed and selective to a second material of sacrificial material layers to be subsequently formed. As used herein, a "temporary material" refers to a material that is present on a structure during at least one processing step, and is removed from the structure prior to completion of the structure, i.e., prior to the termination of the last processing step.

A stack of an alternating plurality of first material layers (which can be insulating layers 32) and second material layers (which can be sacrificial material layer 42) is formed over the top surface of the substrate, which can be, for example, on the top surface of the temporary material layer 41. The alternating plurality of first material layers and second material layers may begin with an instance of the first material layers, and end with another instance of the first material layers. In one embodiment, an instance of the first elements and an instance of the second elements may form a unit that is repeated with periodicity within the alternating plurality of layers.

Each first material layer includes a first material, and each second material layer includes a second material that is different from the first material. In one embodiment, each first material layer 32 can be an insulator layer, and each second material layer 142 can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including germanium or a silicon-germanium alloy.

In one embodiment, the insulator layers 32 can include silicon oxide, and sacrificial material layers can include silicon nitride. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the bottommost insulator layer 132, the temporary material layer 41, the insulator layers 32, and the sacrificial material layers 42 can be in a range from 20 nm to 50 nm, although lesser and greater thicknesses can be employed for each layer. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

In one embodiment, the bottommost insulator layer 132 and the insulator layers 32 can include silicon oxide, the sacrificial material layers 42 can include silicon nitride, and the temporary material layer 41 can include a semiconductor material. The semiconductor material of the temporary material layer 41 can be, for example, a Group IV semiconductor material, a III-V compound semiconductor material, a II-VI semiconductor material, an organic semiconductor material. In an illustrative example, the semiconductor material can be amorphous silicon or polysilicon.

In another embodiment, the bottommost insulator layer 132 and the insulator layers 32 can include silicon oxide, the sacrificial material layers 42 can include a semiconductor material that can be etched selective to the semiconductor material of the semiconductor material layer 10, and the temporary material layer 41 can include silicon nitride. The semiconductor material of the sacrificial material layers 42 can be, for example, germanium, a silicon-germanium alloy, a III-V compound semiconductor material, a II-VI semiconductor material, an organic semiconductor material.

Figure 20:
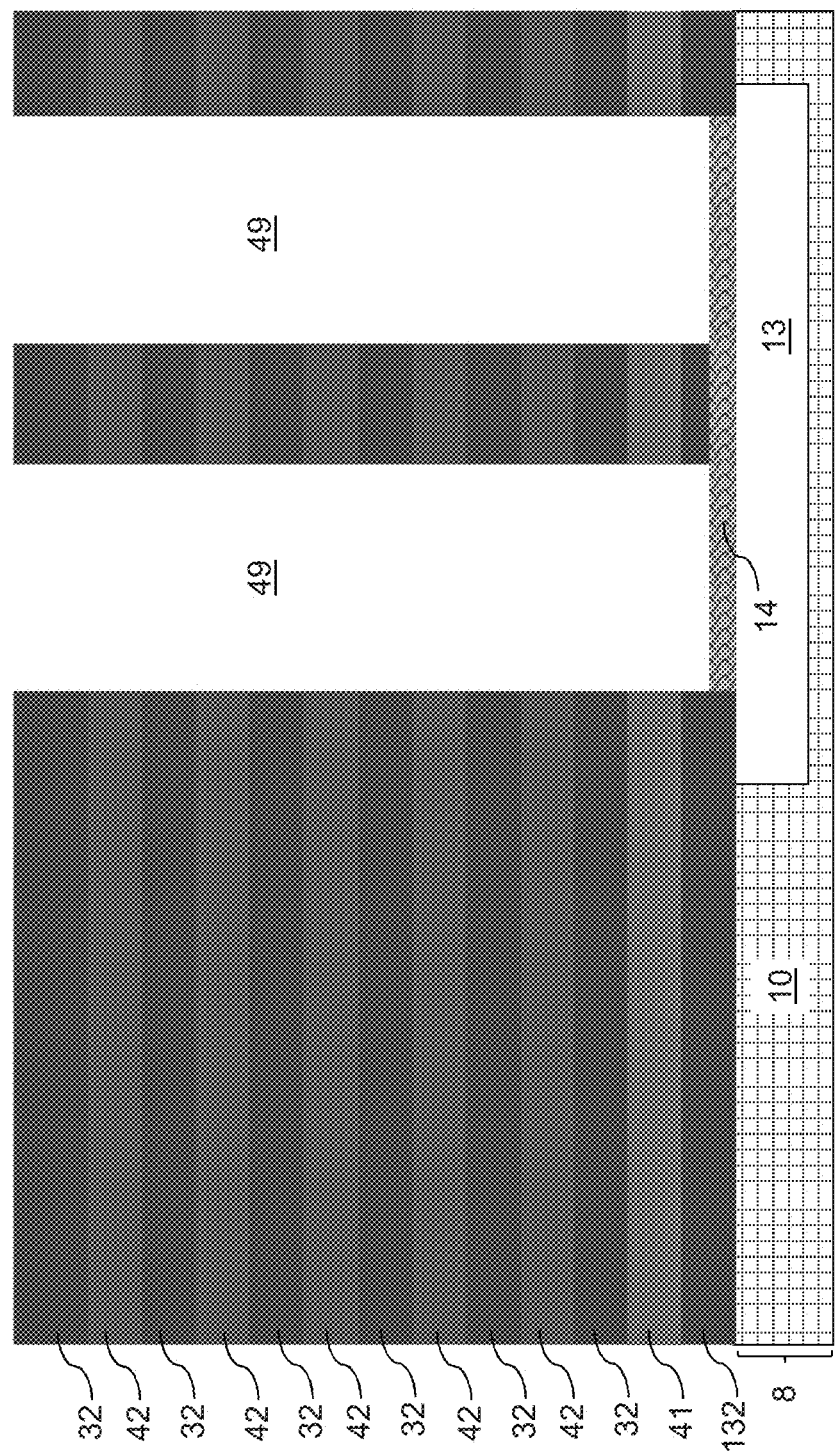
FIG. 20 is a vertical cross-sectional view of the third exemplary structure after formation of memory openings through the stack according to the third embodiment of the present disclosure.

Referring to FIG. 20, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the conductive material layer 14 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the alternating stack (32, 42), the temporary material layer 41, and the bottommost insulator layer 132 so that the memory openings 49 extend from the top surface of the alternating stack (32, 42) to the top surface of the conductive material layer 14 over the substrate 10. The region in which the array of memory openings 49 is formed is herein referred to as a device region. In one embodiment, each memory openings 49 can have a cylindrical shape, and a horizontal cross-sectional shape of each memory opening can be circular, elliptical, polygonal, or of a general curvilinear closed shape.

Figure 21:
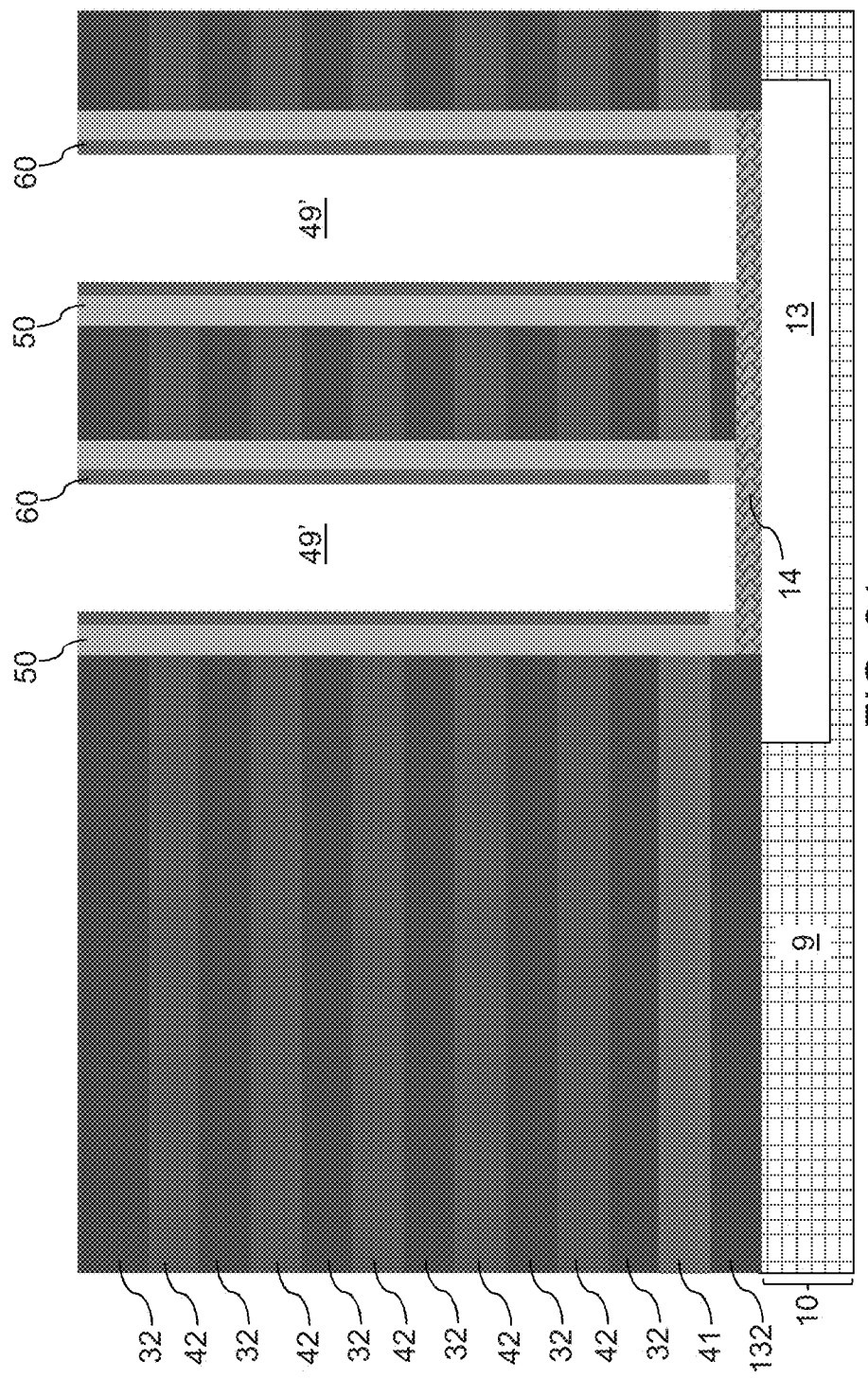
FIG. 21 is a vertical cross-sectional view of the third exemplary structure after formation of blocking dielectric layers and semiconductor channels according to the third embodiment of the present disclosure.

Referring to FIG. 21, a memory film layer and a semiconductor channel layer are sequentially deposited into the array of memory openings 49 and over the alternating stack (32, 42). The memory film layer can have the same material stack as the memory film layer 50L according to the first and second embodiments. The semiconductor channel layer can have the same material composition and thickness as the semiconductor material layer 160L according to the first and second embodiments. The semiconductor channel layer is a semiconductor material layer, and can include an amorphous semiconductor material or a polycrystalline semiconductor material.

The semiconductor channel layer and the memory film layer can be anisotropically etched to remove horizontal portions from above the alternating stack (32, 42) and at the bottom of each memory opening 49. A horizontal portion of the semiconductor channel layer is removed over a bottom surface of each memory opening 49. An opening is formed in the memory film layer at a bottom portion of each memory opening 49.

Each remaining annular portion of the memory film layer constitutes a memory film 50, which can have the same stacked structure and material compositions as in the first and second embodiments. Each remaining annular portion of the semiconductor channel layer constitutes a semiconductor channel 60, which includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. A cavity 49' can be present within a volume of each memory opening 49 that is not filled with a memory film 50 and a semiconductor channel 60. An annular horizontal portion of the memory film 50 can underlie the semiconductor channel 60 within each memory opening. A top surface of the conductive material layer 14 can be physically exposed at the bottom of each cavity 49'. The semiconductor channel 60 is electrically isolated from the substrate 10 by the memory film 50 within each memory opening. Each memory film 50 can be topologically homeomorphic to a torus. Each memory film 50 can be topologically homeomorphic to a torus. As used herein, an element is homeomorphic to a geometrical shape if the shape of the element can be mapped to the geometrical shape by continuous deformation without creation or destruction of any hole.

Figure 22:
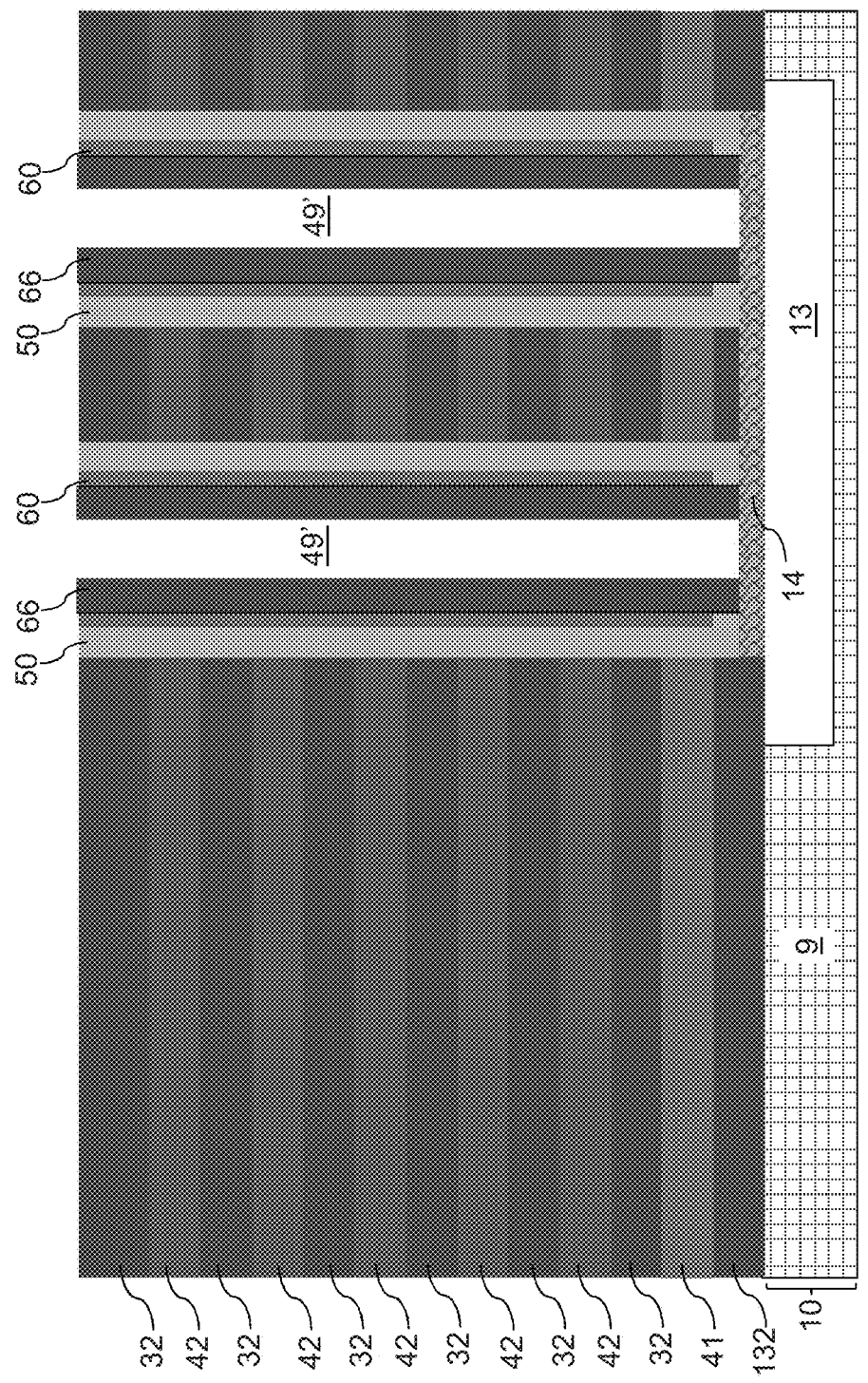
FIG. 22 is a vertical cross-sectional view of the third exemplary structure after formation of back gate dielectrics according to the third embodiment of the present disclosure.

Referring to FIG. 22, back gate dielectrics 66 can be formed on the inner sidewalls of the semiconductor channels 60 inside each memory opening. In one embodiment, the back gate dielectrics 66 can be formed by depositing a back gate dielectric layer in the memory openings and over the alternating stack (32, 42), and by anisotropically etching the back gate dielectric layer. An opening is formed through each horizontal portion of the back gate dielectric layer at a bottom portion of each memory opening. Each remaining vertical portion of the back gate dielectric layer constitutes a back gate dielectric 66.

The back gate dielectrics 66 include at least one dielectric material. The dielectric materials that can be included in the back gate dielectrics 66 include, but are not limited to, silicon oxide, silicon nitride, a dielectric metal oxide, an organosilicate glass, or a combination thereof. In one embodiment, the back gate dielectrics 66 can include a stack of a silicon oxide layer and a dielectric metal oxide layer. In one embodiment, the back gate dielectrics 66 do not include a charge trapping material or a charge storage material (such as silicon nitride). The thickness of each back gate dielectric 66 can be in a range from 3 nm to 30 nm, although lesser and greater thicknesses can also be employed. A bottom surface of each back gate dielectric 66 can contact a top surface of the conductive material layer 14. An outer sidewall of each back gate dielectric 66 can contact an inner sidewall of a semiconductor channel 60 and an inner sidewall of a memory film 50. Each back gate dielectric 66 can be topologically homeomorphic to a torus.

Figure 23:
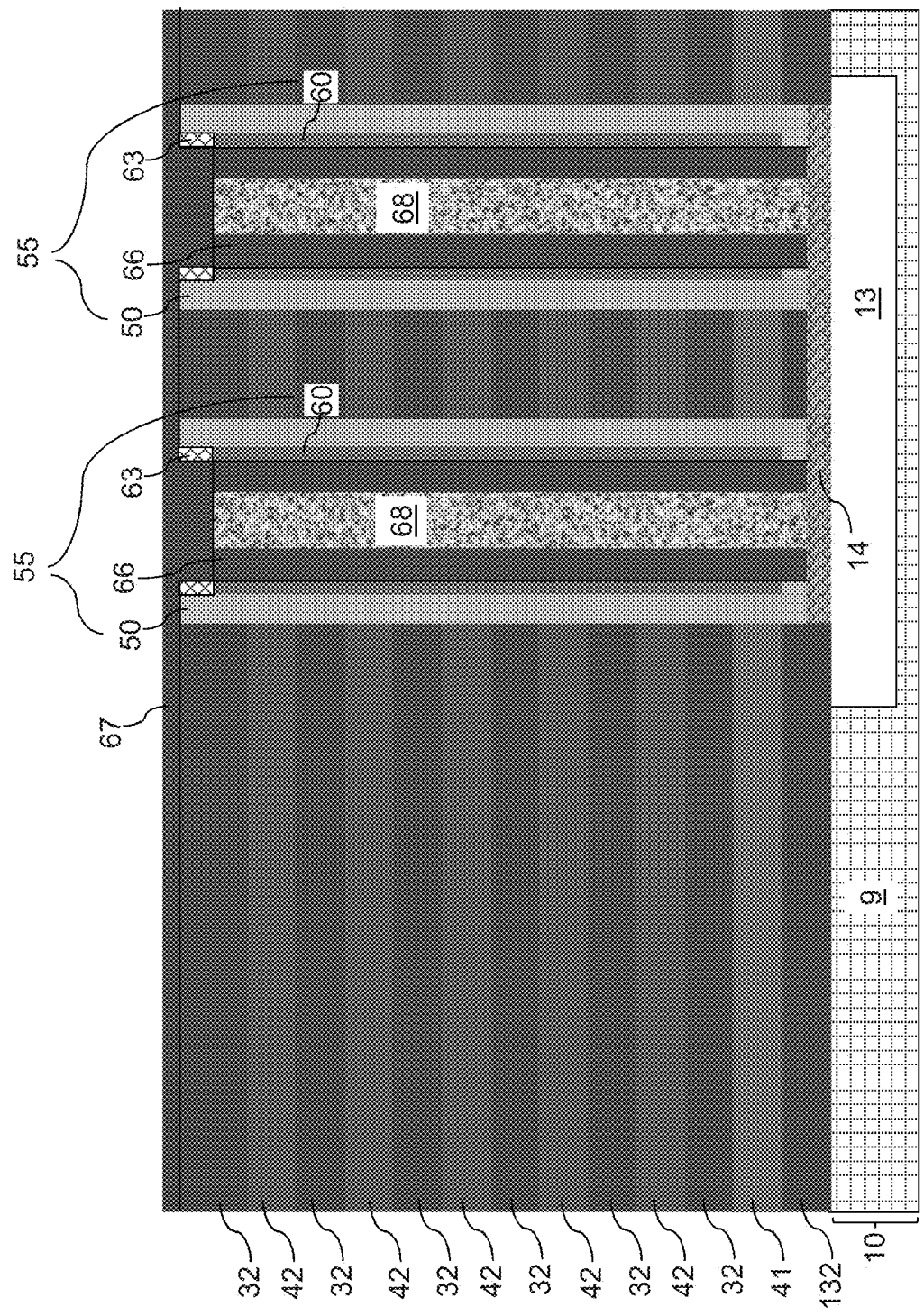
FIG. 23 is a vertical cross-sectional view of the third exemplary structure after formation of back gate electrodes and a dielectric cap layer according to the third embodiment of the present disclosure.

Referring to FIG. 23, back gate electrodes 68 can be formed within each cavity 49' that is laterally surrounded by a back gate dielectric 66. At least one conductive material can be deposited within each cavity 49' that is laterally enclosed by a back gate dielectric 66 and over the alternating stack (32, 42). The at least one conductive material can include, for example, a conductive metallic nitride liner material (such as TiN, TaN, and/or WN) and a conductive fill material (such as an elemental metal (e.g., W), an intermetallic alloy, a doped semiconductor material, a metal-semiconductor alloy material, or a combination thereof). The deposited conductive material can be removed from above the topmost surface of the alternating stack (32, 42) by a planarization process. Chemical mechanical planarization (CMP) and/or a recess etch process can be employed for the planarization process.

The remaining portion of the deposited conductive material can be vertically recessed, for example, by a recess etch below a horizontal plane including the top surface of the alternating stack (32, 42). The recess depth below the horizontal plane including the top surface of the alternating stack (32, 42) can be in a range from 3 nm to 300 nm, although lesser and greater recess depths can also be employed. Each remaining portion of the deposited conductive material constitutes a back gate electrode 68. Each back gate electrode 68 can be in contact with the conductive material layer 14.

In one embodiment, the top surface of each back gate electrode 68 can be formed above a horizontal plane including the top surface of the topmost sacrificial material layer 42 within the alternating stack (32, 42). In one embodiment, a top portion of each back gate dielectric 66 can be collaterally recessed vertically during the vertical recessing of the deposited conductive material to form the back gate electrodes 68. In another embodiment, the recessing of the deposited conductive material to form the back gate electrodes 68 can be performed selective to the dielectric material of the back gate dielectrics 66, i.e., without substantially etching the dielectric material of the back gate dielectrics 66. In this case, the top surface of each back gate electrode 68 can be recessed below the horizontal plane including the topmost surface of the alternating stack (32, 42).

In one embodiment, electrical dopants, which can be p-type dopants or n-type dopants, can be introduced into an upper portion of each semiconductor channel 60 to convert each implanted portion into a drain region 63. A drain region 63 can be formed on top a remaining portion of a semiconductor channel 60. Each drain region 63 can be an annular structure, i.e., can be topologically homeomorphic to a torus. Each drain region 63 can contact an inner sidewall of a memory film 50, and may contact a topmost portion of an outer sidewall of a back gate dielectric 66.

A dielectric cap layer 67 can be deposited into the recesses within the memory openings and over the alternating stack (32, 42). The dielectric cap layer 67 includes a dielectric material, which can be the same as, or different from, a dielectric material contained within the back gate dielectrics 66. The dielectric cap layer 67 can include a material that is different from the material of the sacrificial material layers 42. In one embodiment, the dielectric cap layer 67 can include silicon oxide or a dielectric metal oxide such as aluminum oxide. Optionally, the top surface of the dielectric cap layer 67 can be planarized. The dielectric cap layer 67 can contact an inner sidewall and a top surface of each drain region 63, a top surface of each back gate dielectric 66, and a top surface of each back gate electrode 68.

Each set of a memory film 50 and a semiconductor channel 60 within a memory opening constitutes a memory stack structure 55 including a plurality of charge storage elements. A back gate electrode 68 and a set of nested layers laterally surrounding the back gate electrode 68 within a memory opening collectively constitute a pillar structure (68, 66, 60, 63, 50). The set of nested layers include, from inside to outside, a back gate dielectric 66, a semiconductor channel 60, and a memory film 50.

Figure 24:
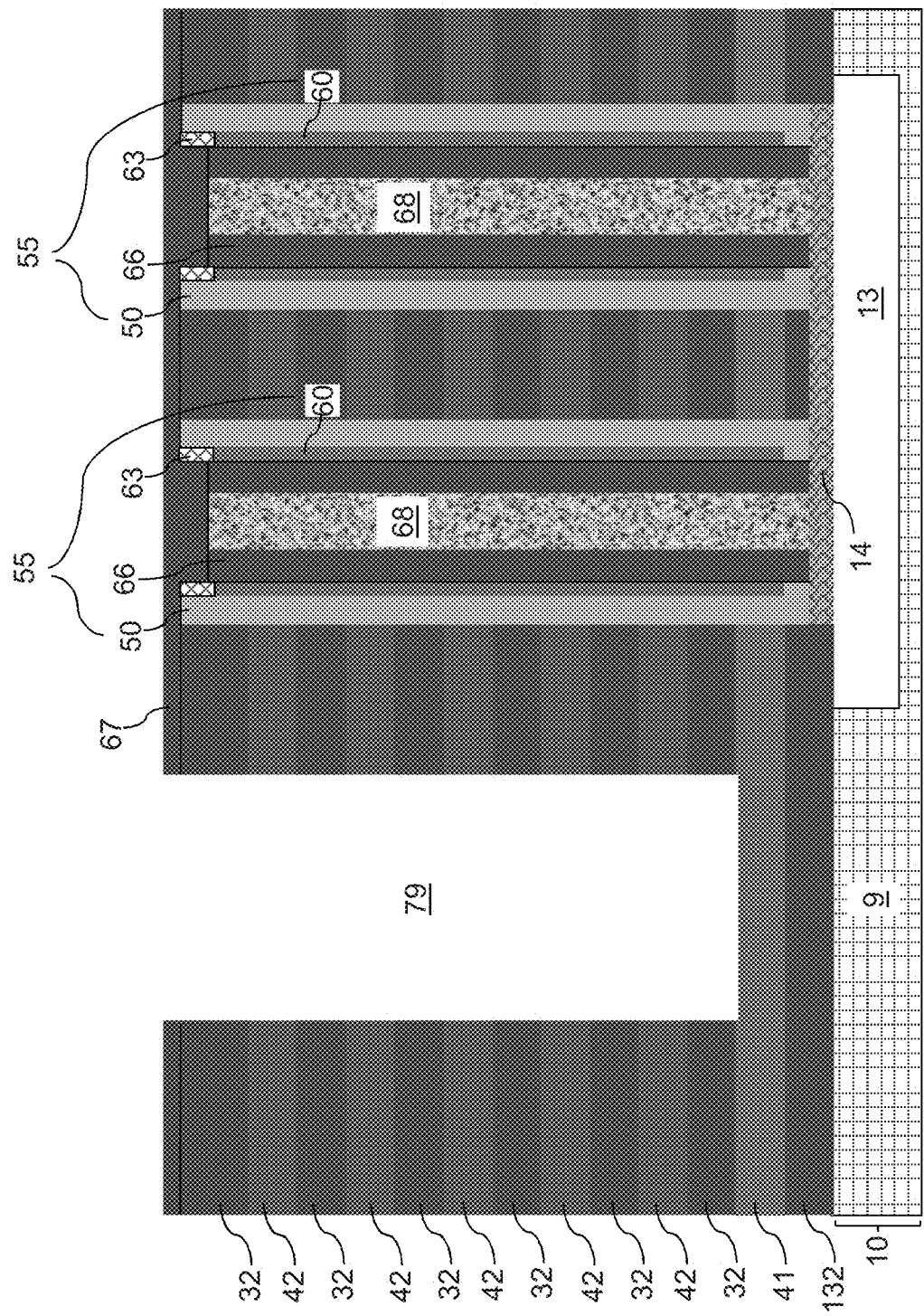
FIG. 24 is a vertical cross-sectional view of the third exemplary structure after formation of a backside cavity according to the third embodiment of the present disclosure.

Referring to FIG. 24, a photoresist layer (not shown) can be applied over the dielectric cap layer 67 and the alternating stack (32, 42), and can be lithographically patterned to form openings therein. The pattern in the photoresist layer can be transferred through the dielectric cap layer 67 and the alternating stack (32, 42) employing an anisotropic etch to form the at least one backside contact trench 79. Each backside contact trench 79 can extend through the entirety of the alternating stack (32, 42), and can have a horizontal surface of the temporary material layer 41 as a bottom surface. In one embodiment, the anisotropic etch can be selective to the material of the temporary material layer 41, and the bottom surface of each backside contact trench 79 can be coincident with the top surface of the temporary material layer 41. In another embodiment, the bottom surface of a backside contact trench 79 can be located between a first horizontal plane including the topmost surface of the temporary material layer 41 and the bottom surface of the temporary material layer 41. The sidewalls of each backside contact trench 79 can be substantially vertical or tapered. The photoresist layer can be subsequently removed, for example, by ashing.

Figure 25:
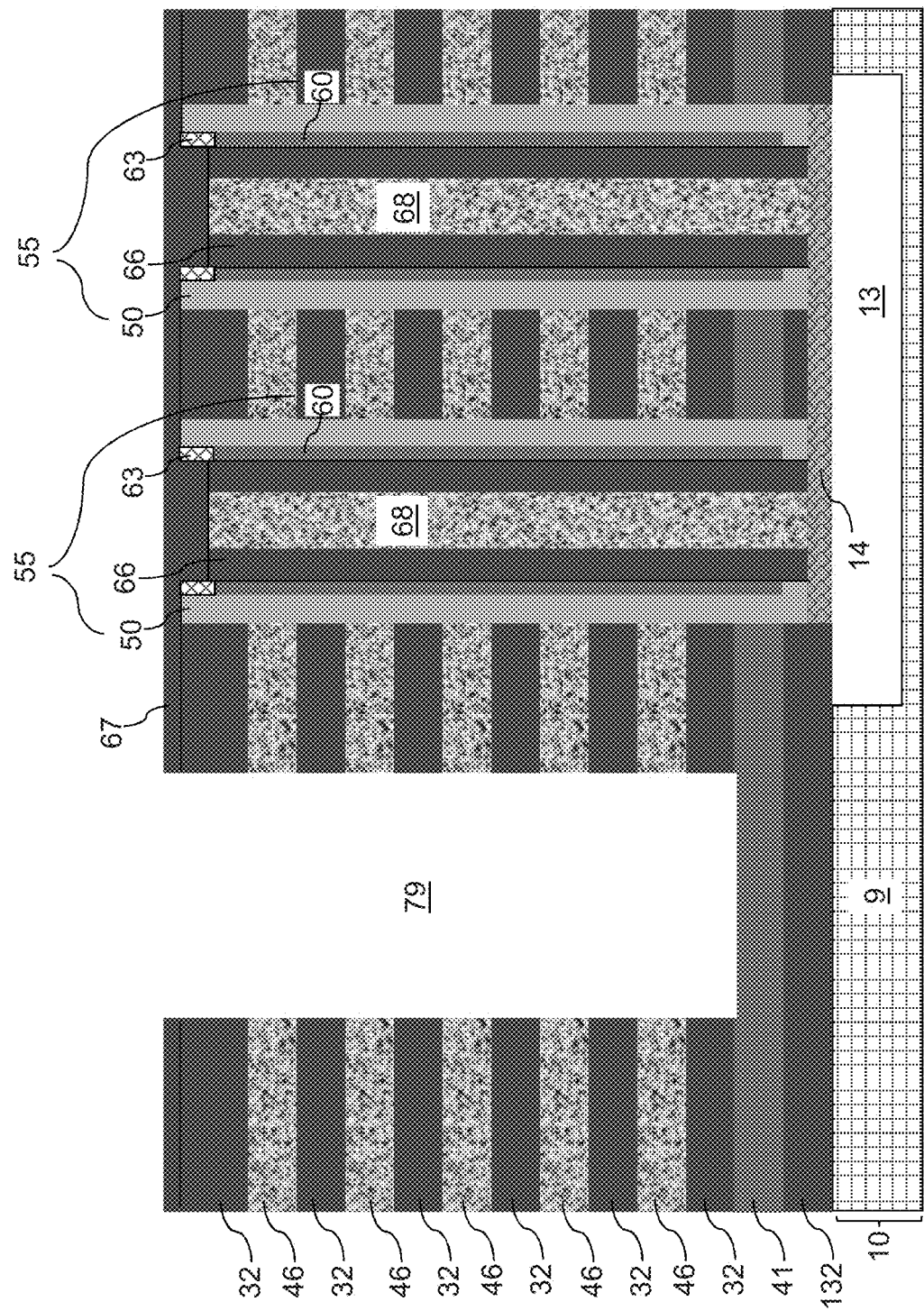
FIG. 25 is a vertical cross-sectional view of the third exemplary structure after replacement of sacrificial material layers with electrically conductive layers according to the third embodiment of the present disclosure.

Referring to FIG. 25, an etchant that selectively etches the second material of the sacrificial material layers 42 with respect to the first material of the insulator layers 32 and the temporary material layer 41 can be introduced into the at least one backside contact trench 79, for example, employing an etch process. Backside recesses are formed in volumes from which the sacrificial material layers 42 are removed. The removal of the second material of the sacrificial material layers 42 can be selective to the first material of the insulator layers 32, the material of the temporary material layer 41, and the material of the outermost layer of the memory films 50. In an illustrative example, the sacrificial material layers 42 can include silicon nitride, the material of the insulator layers 32 can be silicon oxide, and the material of the temporary material layer 41 can be germanium, a silicon-germanium alloy, amorphous silicon, or polysilicon. In another embodiment, the sacrificial material layers 42 can include a semiconductor material such as germanium, a silicon-germanium alloy, or silicon, the material of the insulator layers 32 can include silicon oxide, and the material of the temporary material layer 41 can include silicon nitride.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side openings or front side cavities in contrast with the backside recesses. In one embodiment, the device region comprises an array of monolithic three-dimensional NAND strings having a plurality of device levels disposed above the substrate 10. In this case, each backside recess can define a space for receiving a respective word line of the array of monolithic three-dimensional NAND strings.

Each of the plurality of backside recesses can extend substantially parallel to the top surface of the substrate 10. The backside recess can be vertically bounded by a top surface of an underlying insulator layer 32 and a bottom surface of an overlying insulator layer 32. In one embodiment, each backside recess can have a uniform height throughout.

A conductive material can be deposited in the plurality of backside recesses, on sidewalls of the at least one the backside contact trench 79, and over the top surface of the dielectric cap layer 67. As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses can be selected from tungsten and a combination of titanium nitride and tungsten. In one embodiment, the conductive material can be deposited by chemical vapor deposition.

A plurality of electrically conductive layers 46 can be formed in the plurality of backside recesses, and a contiguous conductive material layer (not shown) can be formed on the sidewalls of each backside contact trench 79 and over the dielectric cap layer 67. Thus, at least a portion of each sacrificial material layer 42 can be replaced with an electrically conductive layer 46, which is a conductive material portion.

Subsequently, the deposited conductive material of the contiguous conductive material layer can be etched back from the sidewalls of each backside contact trench 79 and from above the dielectric cap layer 67, for example, by an isotropic etch. Each remaining portion of the deposited conductive material in the backside recesses constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Each memory stack structure 55 includes a memory film 50 and a semiconductor channel 60 within a memory opening. The total number of charge storage elements within a memory stack structure 55 can be the same as the total number of levels of the control gate electrodes, which can be end portions of the electrically conductive layers 46, if each control gate electrode 46 laterally surrounds the entire periphery of memory stack structure 55. Alternatively, if more than one control gate electrode is formed in proximity to a memory stack structure 55 at the same level, the total number of charge storage elements at the corresponding level of the memory stack structure 55 can be the same as the total number of control gate electrodes 46 located in proximity to the memory stack structure 55 at the corresponding level. If a total of N control gate electrodes are located in proximity to the memory film 50 at each level of the electrically conductive layers 46, the total number of charge storage elements per memory film 50 can be the product of the total number of levels of the electrically conductive layer 46 and the integer N.

Figure 26:
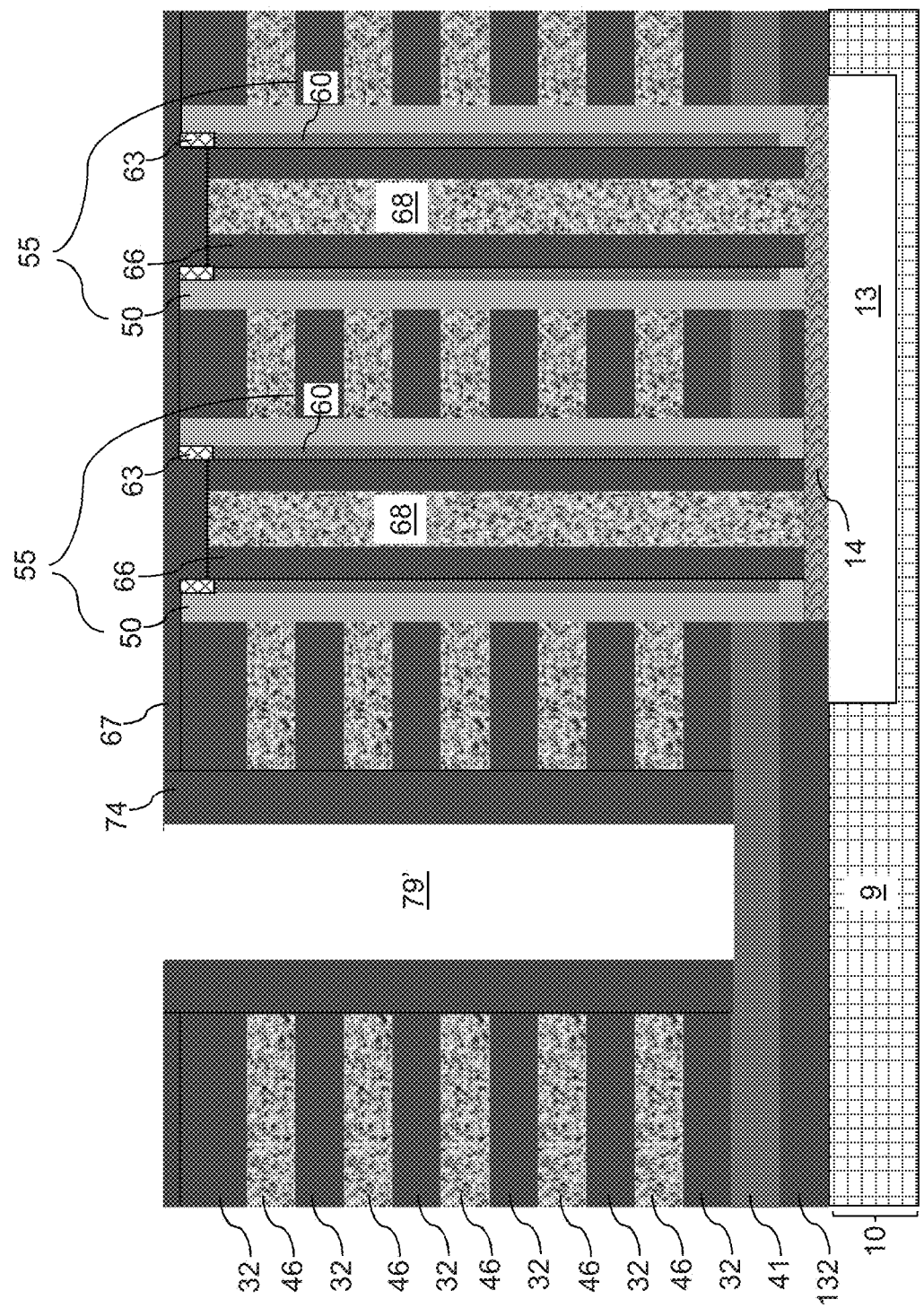
FIG. 26 is a vertical cross-sectional view of the third exemplary structure after formation of a backside via spacer according to the third embodiment of the present disclosure.

Referring to FIG. 26, an insulating spacer 74 can be formed on the sidewalls of the backside contact trench 79 by depositing a contiguous dielectric material layer and anisotropically etching horizontal portions of the contiguous dielectric material layer. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm. A cavity 79' is formed in a volume of each backside contact trench 79 that is not filled with the insulating spacer 74.

Figure 27:
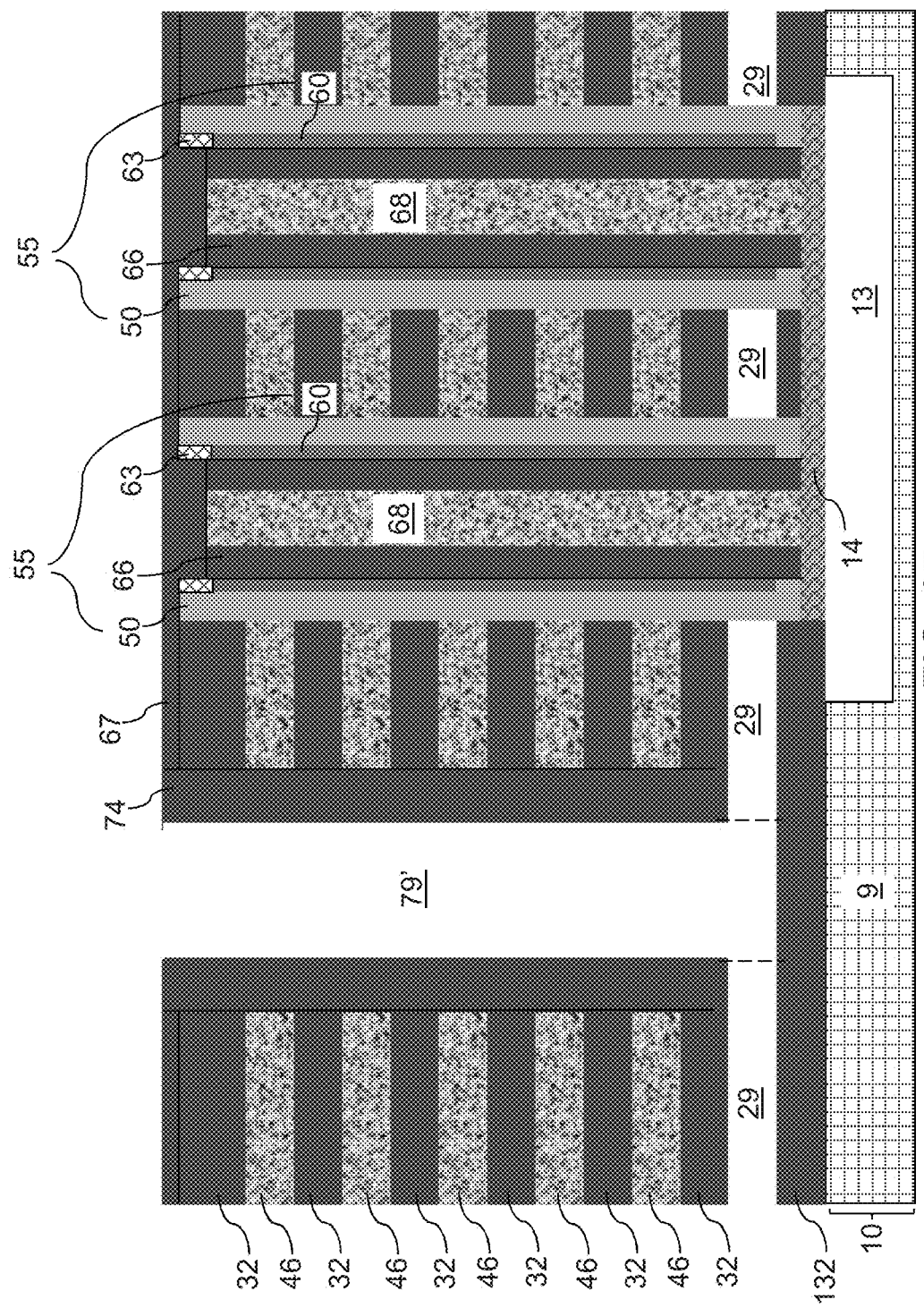
FIG. 27 is a vertical cross-sectional view of the third exemplary structure after formation of a source-level cavity according to the third embodiment of the present disclosure.

Referring to FIG. 27, an etchant that selectively etches the material of the temporary material layer 41 with respect to the first material of the insulator layers 32 can be introduced into the at least one backside contact trench 79, for example, employing an etch process. A bottommost backside cavity is formed in the volume from which the temporary material layer 41 is removed. The bottommost backside cavity is herein referred to as a source-level backside recess 29. The source-level backside recess 29 is a backside cavity that is located at the source level, i.e., the level at which source regions are to be subsequently formed. In one embodiment, the removal of the material of the temporary material layer 41 can be selective to the first material of the insulator layers 32, and to the material of the insulating spacer 74.

The etch process that removes the material of the temporary material layer 41 selective to the first material can be a wet etch process employing a wet etch solution, or can be a gas phase (dry) etch process in which the etchant is introduced in a vapor phase into the at least one backside contact trench 79. For example, if the temporary material layer 41 includes silicon nitride, the etch process can be a wet etch process in which the exemplary structure is immersed within a wet etch tank including phosphoric acid, which etches silicon nitride selective to silicon oxide, silicon, and various other materials employed in the art. In another example, if the temporary material layer 41 includes germanium or a silicon-germanium alloy, the etchant can include a combination of hydrogen peroxide and dilute hydrofluoric acid.

Figure 28:
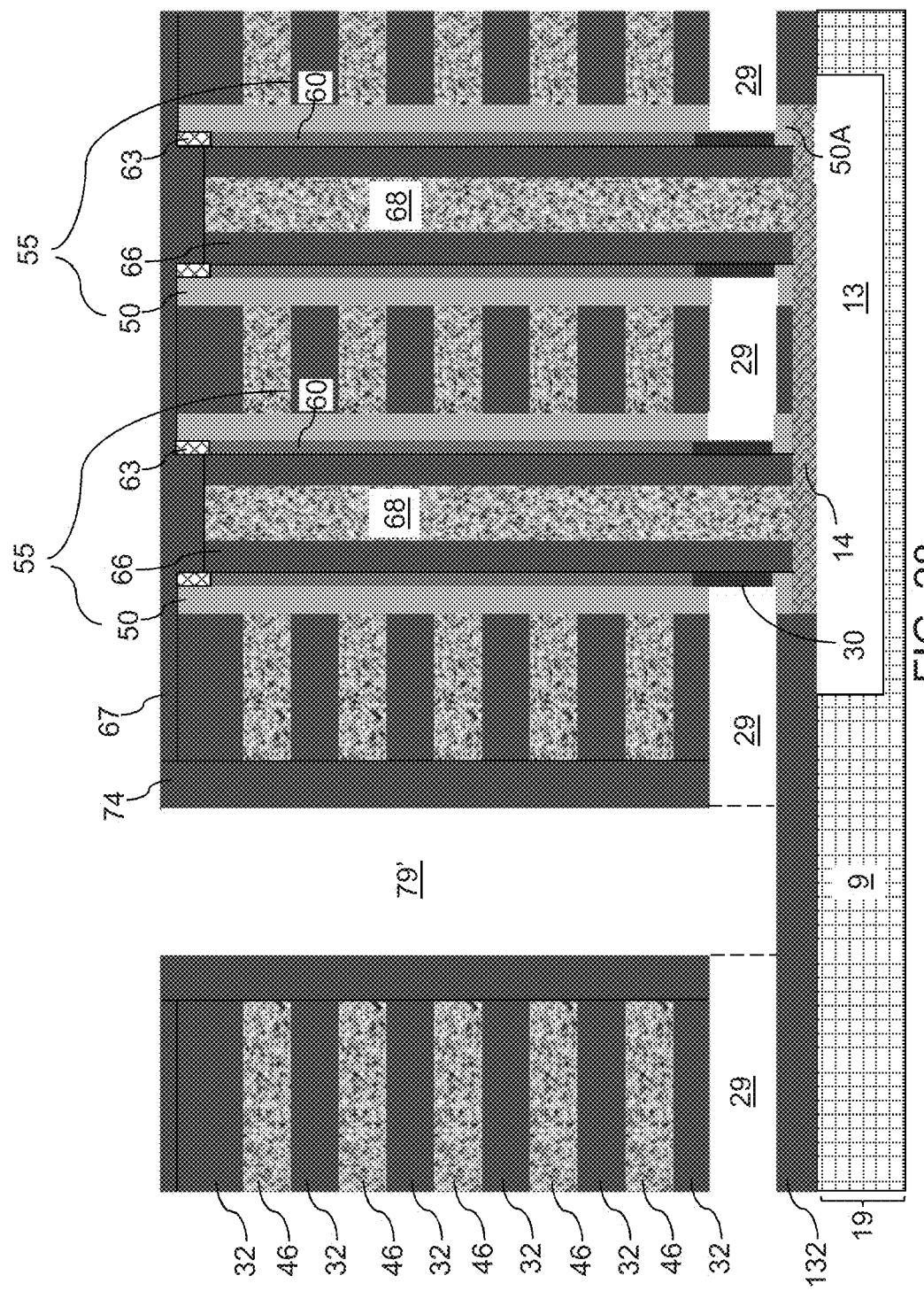
FIG. 28 is a vertical cross-sectional view of the third exemplary structure after formation of source regions according to the third embodiment of the present disclosure.

Referring to FIG. 28, a portion of each memory film 50 physically exposed to the source-level backside recess 29 can be removed by at least one etch process, which can be a series of isotropic etch processes. The chemistry of each isotropic etch process can be selected to sequentially remove the various materials of the memory films 50 from outside to inside. If each memory film 50 includes at least one blocking dielectric 502, a charge storage region 504, and a tunneling dielectric 505 as in the first and second embodiments, a first isotropic etch process can etch a portion of the at least one blocking dielectric 502, a second isotropic etch process can etch a portion of the charge storage element 504, and a third isotropic etch process can etch a portion of the tunneling dielectric 505. The isotropic etch process that etches the material of the tunneling dielectric 505 can be selective to the material of the semiconductor channels 60. An annular dielectric material portion 50A that includes a remaining portion of the memory film 50 can be formed underneath each source region 30. The annular dielectric material portion 50A provides electrical isolation between a source region 30 and the underlying patterned conductive material layer 14.

Subsequently, electrical dopants can be introduced through the cavity 79' and into the physically exposed portion of the sidewall of each semiconductor channel 60. The electrical dopants can be p-type dopants or n-type dopants. Exemplary p-type dopants include B, Ga, and In. Exemplary n-type dopants include P, As, and Sb. Each portion of the semiconductor channel 60 into which the electrical dopants are introduced is converted into a source region 30.

The electrical dopants can be introduced into physically exposed portions of the semiconductor channels 60 by a plasma doping process and/or a gas phase doping process. If a plasma doping process is employed, the exemplary structure can be placed in a process chamber in which a plasma of the electrical dopants is generated. Non-limiting examples of process gases from which the plasma can be generated include $B_2H_6$, $PH_3$, $AsH_3$, and $SbH_3$. In a gas phase doping process, the exemplary structure is placed in a process chamber, and is subjected to a dopant gas at an elevated temperature, which can be, for example, in a range from 600 degrees Celsius to 1,000 degrees Celsius. The atomic concentration of the electrical dopants in each source region 30 can be in a range from $1.0 \times 10^{19}/cm^3$ to $1.0 \times 10^{21}/cm^3$, although lesser and greater atomic concentrations can also be employed.

Within each memory opening, the source region 30 can have a same horizontal cross-sectional shape and areas as the overlying semiconductor channel 60. The source region 30 includes the same semiconductor material as the remaining portions of the semiconductor channel 60, and further includes the electrical dopants. In one embodiment, the composition of the source regions 30 can differ from the composition of the semiconductor channel 60 by the presence of the electrical dopant atoms in the source region 30, while the semiconductor channel 60 is substantially free of the electrical dopants or doped with electrical dopants of opposite conductivity dopants than the source region 30. Further, the composition of drain region 63 can differ from the composition of the semiconductor channel 60 by the presence of the electrical dopant atoms in the drain region 63, while the semiconductor channel 60 is substantially free of the electrical dopants or doped with electrical dopants of opposite conductivity dopants than the source region 30. In one embodiment the source region 30 and the drain region 63 within a same memory opening can have a same lateral thickness, and can have a substantially same horizontal cross-sectional area. The source regions 30 and the drain regions 63 can have a same type of doping. For example, the source regions 30 and the drain regions 63 can be n-doped, or the source regions 30 and the drain regions 63 can be p-doped. The semiconductor channel 60 can be p-doped, n-doped, or intrinsic.

Figure 29A:
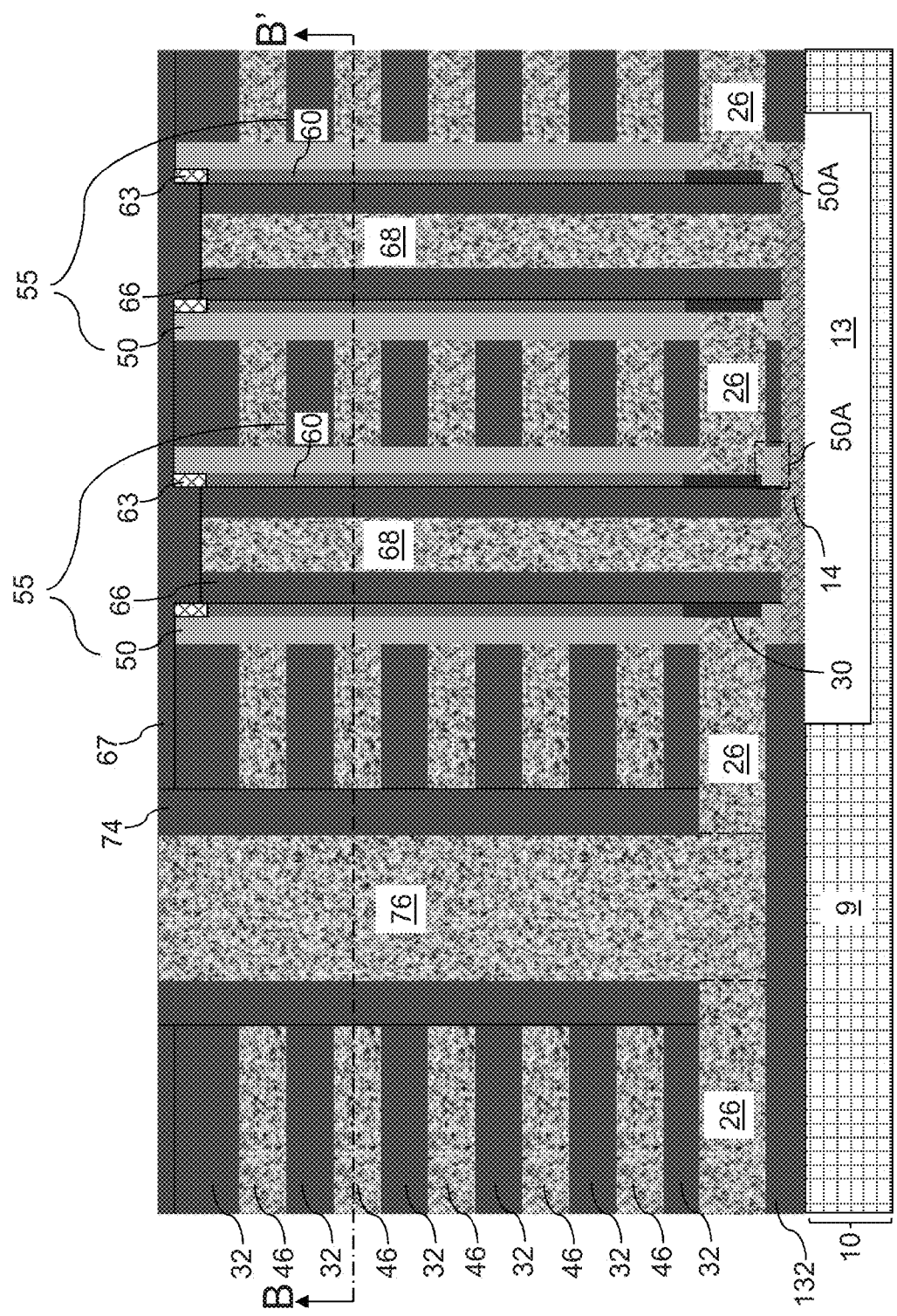
FIG. 29A is a vertical cross-sectional view of the third exemplary structure after formation of a source electrode and a backside contact via structure according to the third embodiment of the present disclosure.

Referring to FIGS. 29A and 29B, a conductive material can be deposited in the source-level backside recess 29 and the cavity 79' within the backside contact trench 79, and over the top surface of the dielectric cap layer 67. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. In one embodiment, the conductive material can comprise a metal such as tungsten and/or metal nitride. In one embodiment, the conductive material for filling the source-level backside recess 29 and the cavity 79' within the backside contact trench 79 can be selected from tungsten and a combination of titanium nitride and tungsten. In one embodiment, the conductive material can be deposited by chemical vapor deposition.

An excess portion of the conductive material deposited over the top surface of the dielectric cap layer 67 can be removed by a planarization process, which can be a chemical mechanical planarization (CMP) process and/or a recess etch process. A source electrode 26 can be formed in each source-level backside recess 29, and a backside contact via structure 76. Each source electrode 26 contacts a source region 30. Each source electrode 26 is formed directly on a source region 30 and an annular dielectric material portion 50A. A source electrode 26 can laterally surrounds a source region 30 and contact and entire outer periphery of the source region 30.

A dielectric material portion including an annular unetched portion 50A of a memory film 50 can be present between the source region 30 and an underlying conductive material layer 14. A plurality of conductive material layers 14 can be provided. A conductive material layer 14 can underlie a single memory stack structure 55, a plurality of memory stack structures 55 located between a neighboring pair of backside contact via structures 76, or a plurality of memory stack structures 55 that are located within an area including more than two backside contact via structures 76. The width of each contiguous portion of a conductive material layer 14 can correspond to the width of a word line finger F between a neighboring pair of backside contact via structures 76, or can correspond to the width of a block B including multiple backside contact via structures 76.

Figure 30A:
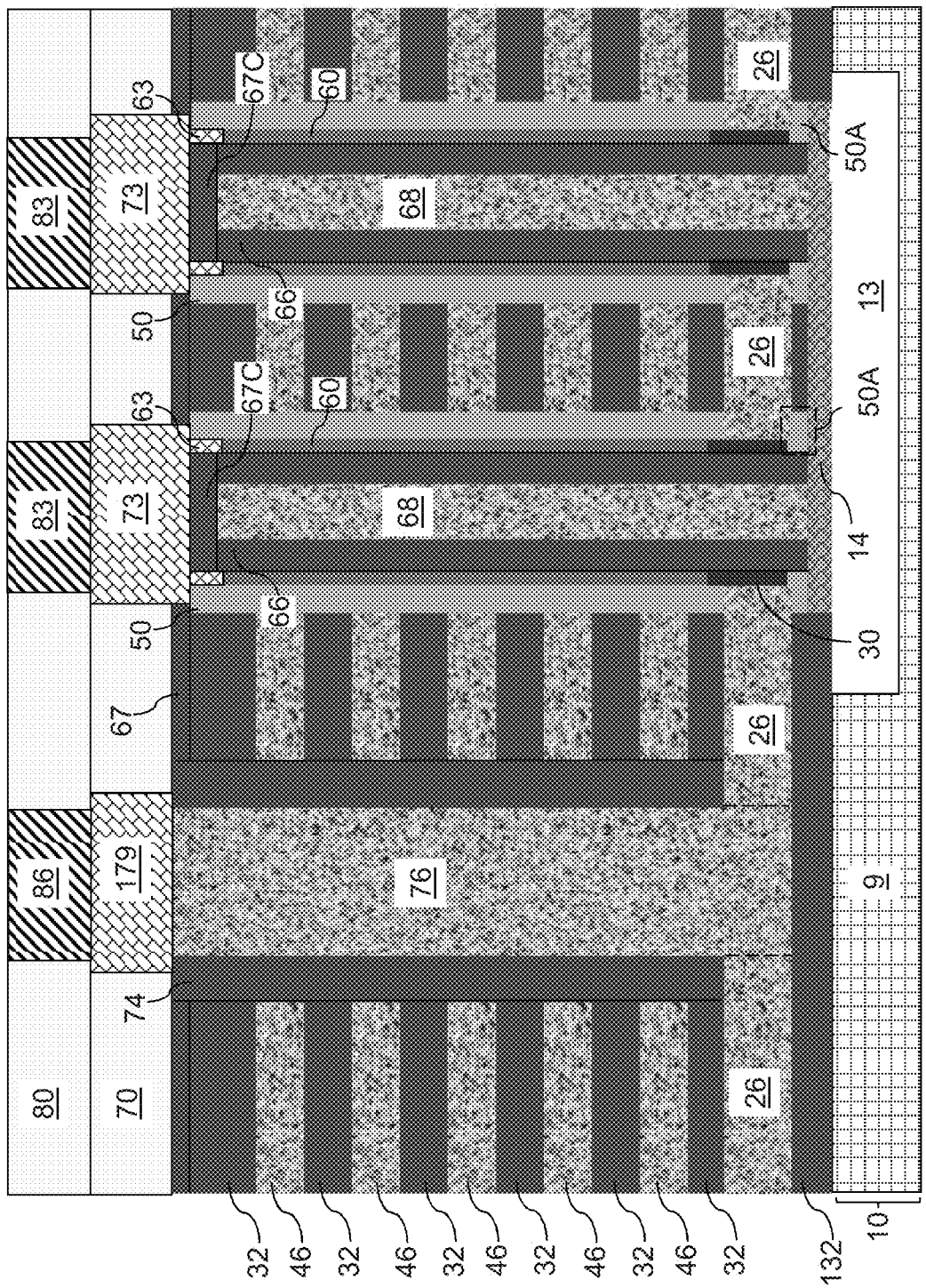
FIG. 30A is a vertical cross-sectional view of the third exemplary structure after formation of contact via structures and conductive line structures according to the third embodiment of the present disclosure.
Figure 30B:
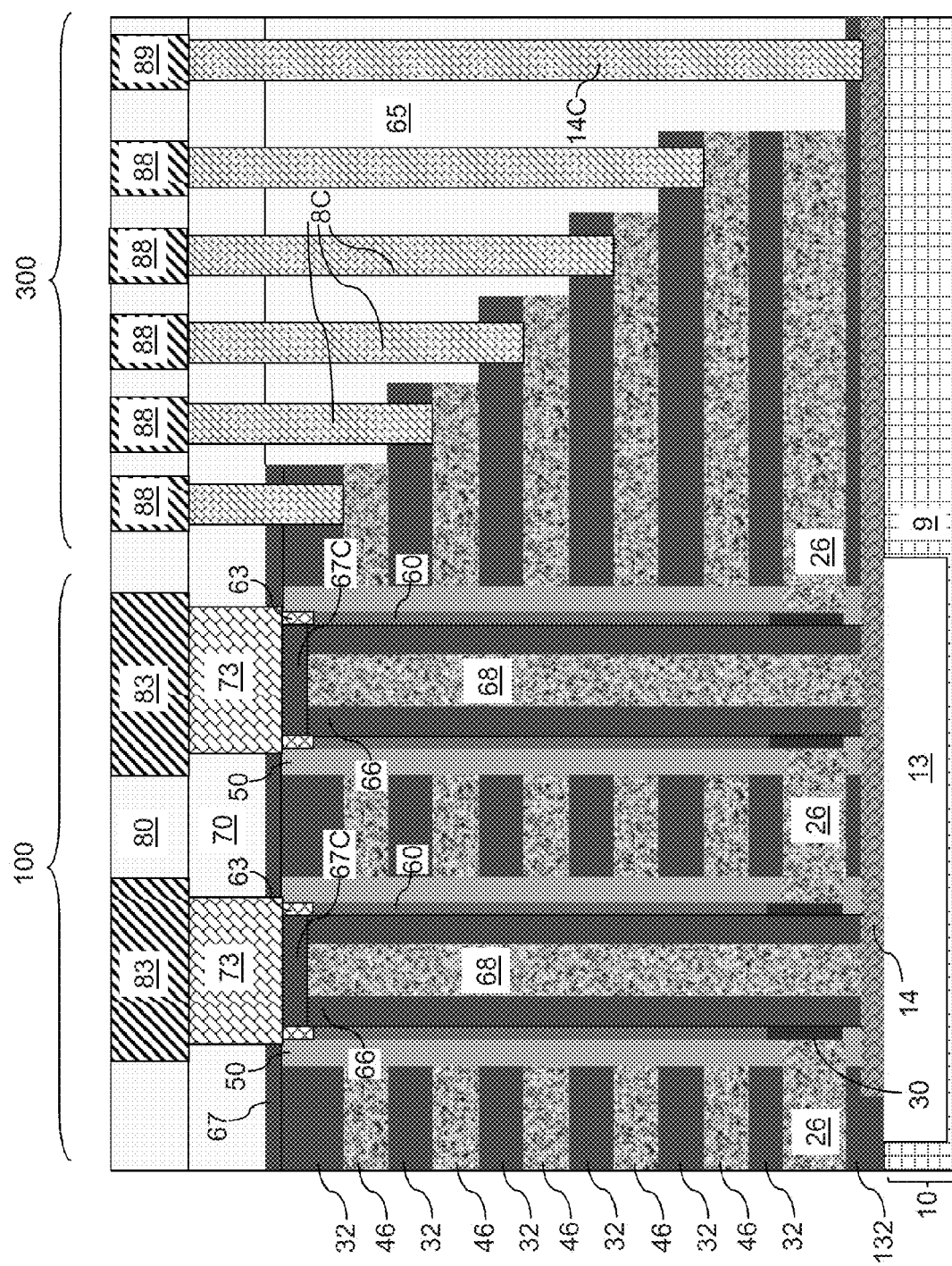
FIG. 30B is another vertical cross-sectional view of the third exemplary structure of FIG. 30A along a vertical plane that is perpendicular to the vertical cross-sectional plane of FIG. 30A.

Referring to FIGS. 30A and 30B, a contact cavity including a set of stepped surfaces can be formed within a contact region 300 of the third exemplary structure, for example, by repetition of a vertical anisotropic etch process and a horizontal opening expansion process (such as trimming) The contact region 300 is adjacent to a device region 100 that includes memory stack structures in memory openings and the backside contact via structures 46. The contact cavity can be filled with a retro-stepped dielectric material portion 65, which is a dielectric material portion of which the lateral extent is greater at levels farther away from the substrate 10 than at levels proximal to the substrate 10. The retro-stepped dielectric material portion 65 can be formed by deposition of a dielectric material such as silicon oxide, organosilicate glass, silicon nitride, or a combination thereof into the contact cavity, and removing an excess portion of the deposited dielectric material from above a horizontal plane including the top surface of the dielectric cap layer 67 by a planarization process. The planarization process can employ a chemical mechanical planarization process (CMP) or a recess etch process.

A via level dielectric layer 70 can be formed over the dielectric cap layer 67 and the backside contact via structures 76. The via level dielectric layer 70 includes an interlayer dielectric material such as silicon oxide, silicon nitride, and organosilicate glass. The thickness of the via level dielectric layer 70 can be in a range from 30 nm to 1,000 nm, although lesser and greater thicknesses can also be employed.

Various contact via structures can be formed through the via level dielectric layer 70 and underlying material layers. The various contact via structures can include at least one source contact via structure 179 that contacts the top surface of a backside contact via structure 76, and drain contact via structures 73 contacting top surfaces of the drain regions 63. The depth of each via cavity for the drain contact via structures 73 can be controlled such that the bottom surfaces of the via cavities for the drain contact via structures 73 are formed above the topmost surfaces of the back gate electrodes 68. Each remaining portion of the dielectric cap layer 67 that remains over a gate electrode 68 is herein referred to as a dielectric cap portion 67C. Each dielectric cap portion 67C has the same composition as the remaining portion of the dielectric cap layer 67 that are present over the alternating stack (32, 46) of insulator layers 32 and the electrically conductive layers 46. A bottom surface of a drain contact via structure 73 can contact a top surface of a dielectric cap portion 67C and an annular top surface of a drain region 63. A top surface of a back gate electrode 68 can contact a bottom surface of dielectric cap portion 67C.

Additional contact via structures (8C, 14C) can be formed through the via level dielectric layer 70, one of the dielectric cap layer 67 and the retro-stepped dielectric material portion 65, and to a top surface of an electrically conductive layer 46 or the at least one conductive material layer 14. Each control electrode contact via structure 8C can contact, or can be electrically shorted to, an electrically conductive layer 46, and electrically isolated from the source electrodes 26 and other the electrically conductive lines 46 located at different levels. Each back gate contact via structure 14C can contact, or can be electrically shorted to, the at least one conductive material layer 14, and electrically isolated from the source electrodes 26 and the electrically conductive lines 46. The back gate contact via structure 14C and the conductive material layer 14 provide an electrically conductive path to the back gate electrodes 68 so that a backside bias voltage can be applied during operation of each memory stack structure. In one embodiment, the additional contact via structures (8C, 14C) may be formed in the same deposition step by deposition of a same conductive material and removal of excess portions of the deposited conductive material from a top surface of the via level dielectric layer 70.

A line level dielectric layer 80 can be formed over the via level dielectric layer 70. The line level dielectric layer 80 includes an interlayer dielectric material such as silicon oxide, silicon nitride, and organosilicate glass. The thickness of the line level dielectric layer 80 can be in a range from 30 nm to 1,000 nm, although lesser and greater thicknesses can also be employed.

Various conductive line structures (83, 86, 88) can be formed through the line level dielectric layer 80. The various conductive line structures (83, 86, 88) can include at least one source line 86 that contacts a top surface of a contact via structure 79, and at least one drain line 83 (i.e., a bit line) that contacts a top surface of a drain contact via structures 73, and gate control lines 88 contacting a respective control electrode contact via structure 8C, and a back gate control line 89 that contacts the back gate contact via structure 14C.

The third exemplary structure is a monolithic three-dimensional memory structure that comprises a stack (32, 46) including an alternating plurality of insulator layers 32 and electrically conductive layers 46, a memory opening 49 extending through the stack (32, 46), and a pillar structure (68, 66, 60, 63, 30, 50) located within the memory opening and comprising a back gate electrode 68 and a set of nested layers laterally surrounding the back gate electrode 68. The set of nested layers include, from inside to outside, a back gate dielectric 66, a semiconductor channel 60, and a memory film 50. A patterned conductive material layer 14 can contact a bottom surface of the back gate electrode 68. The patterned conductive material layer 14 can be electrically isolated from the semiconductor channel 60.

The third exemplary structure can further comprise an annular dielectric material portion 50A having a same composition as the memory film 50 and contacting an outer sidewall of the back gate dielectric 66. The patterned conductive material layer 14 can contact a bottom surface of another back gate electrode 68 located within another memory opening through the stack (32, 46). A dielectric material portion 13 can be embedded within an upper portion of the substrate 10, and can contact a bottom surface of the patterned conductive material layer 14.

A dielectric cap portion 67C can contact a top surface of the back gate electrode 68, and a drain region 63 can contact a top surface of the semiconductor channel 60 and a surface of the dielectric cap portion 67C. The drain region 63 can have an annular shape, and can contact a sidewall of the dielectric cap portion 67C.

A source region 30 can be adjoined to a bottom portion of the semiconductor channel 60, and can laterally surround a portion of the back gate dielectric 66. A source electrode 26 can contact, and laterally surround, the source region 30. The source electrode 26 is located over the substrate 10. The source electrode 26 can underlie the alternating stack (32, 46), and a backside contact via structure 76 can extend through the alternating stack (32, 46) and can contact the source electrode 26. In one embodiment, the source region 30 can have a same horizontal cross-sectional shape as the semiconductor channel 60, and can be laterally spaced from the back gate electrode 68 by the back gate dielectric 66.

Figure 31:
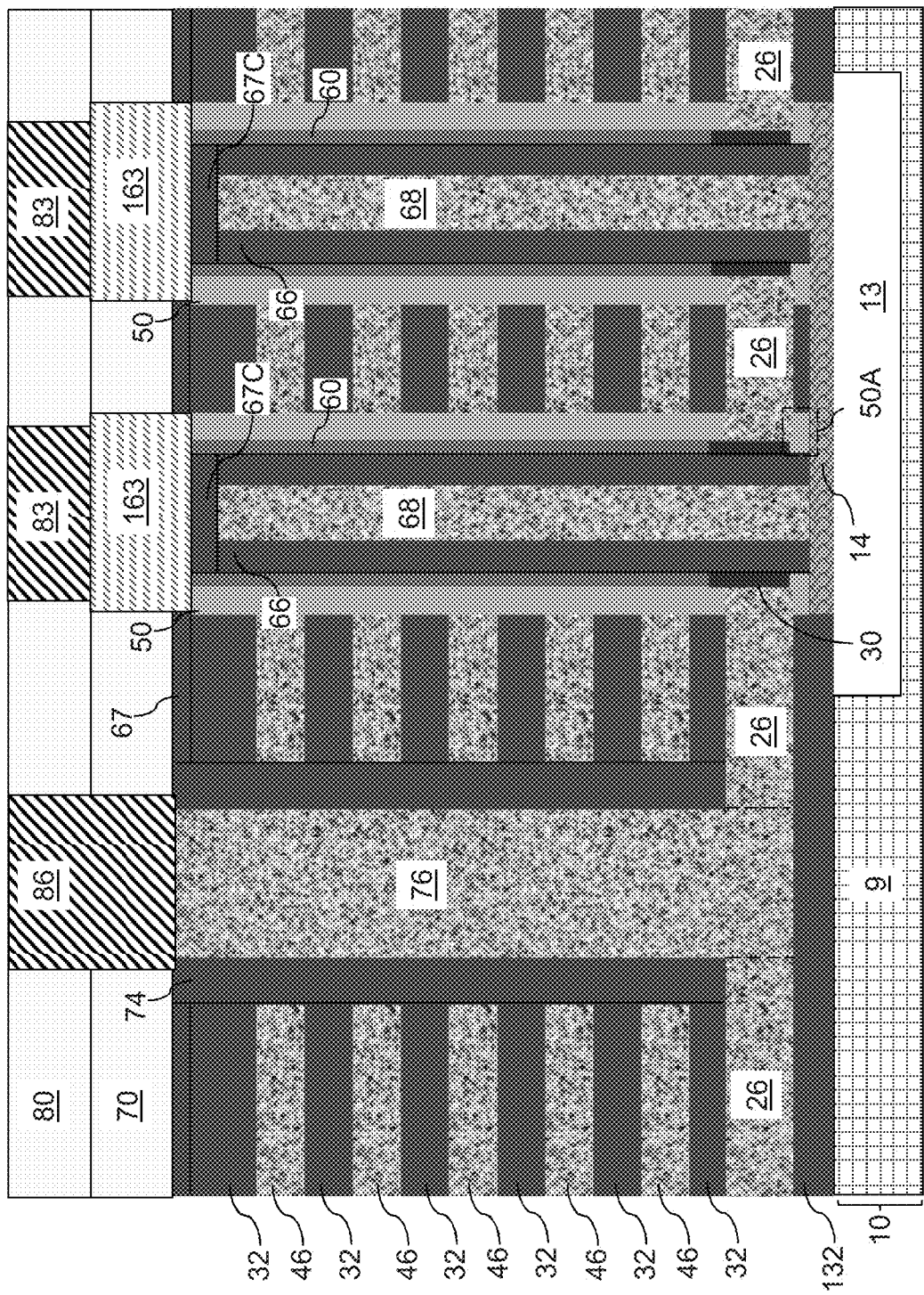
FIG. 31 is a vertical cross-sectional view of an alternate embodiment of the third exemplary structure according to the third embodiment of the present disclosure.

Referring to FIG. 31, an alternate embodiment of the third exemplary structure is illustrated, which can be derived from the third exemplary structure by omitting the processing step employed to convert top portions of the semiconductor channels 60 to drain regions 63 by introduction of electrical dopants as illustrated in FIG. 23. Thus, the drain regions 63 are not present within the various in-process structures between the processing steps of FIGS. 23-29B. After formation of the via level dielectric layer 70 and via cavities therethrough, a top surface of each semiconductor channel 60 is physically exposed at bottom surfaces of the various via cavities. A doped semiconductor material can be deposited within the via cavities and over the via level dielectric layer 70. The deposited doped semiconductor material can be patterned, for example, by a planarization process, which can employ chemical mechanical planarization (CMP) and/or a recess etch. Remaining portions of the doped semiconductor material can form drain regions 163. Each drain region 163 contacts a top surface of a semiconductor channel 60. The dielectric cap portion 67C can contact a bottom surface of the drain region 63 and an inner sidewall of the semiconductor channel 60.

In the alternate embodiment of the third exemplary structure, each dielectric cap portion 67C can be formed over a back gate electrode 68 and on an inner sidewall of a semiconductor channel 60. Each drain region 163 can be formed over, and on the top surface of, a dielectric cap portion 67C and on a top surface of a semiconductor channel 60 by depositing and patterning a doped semiconductor material. Additional structures, such as the line level dielectric layer 80 and the conductive line structures (83, 86, 88), can be formed as in the third exemplary structure illustrated in FIGS. 30A and 30B.

In one embodiment, each of the first, second, and third exemplary structures can be formed on a semiconductor substrate such as a silicon substrate. Each of the first, second, and third exemplary structures is a multilevel structure including a stack {(32, 142) or (32, 46)} of an alternating plurality of electrically conductive layers (142 or 46) and insulator layers 32 located over a semiconductor substrate including the semiconductor material layer. An array of memory stack structures 55 can be located within memory openings through the stack {(32, 142) or (32, 46)}.

In one embodiment, the device located on the semiconductor substrate can include a vertical NAND device located in the device region 100, and at least one of the electrically conductive layers (142 or 46) in the stack {(32, 142) or (32, 46)} can comprise, or can be electrically connected to, a word line of the NAND device. The device region can include a plurality of semiconductor strip structures 160. At least one end portion of each of the plurality of semiconductor strip structures 160 extends substantially perpendicular to a top surface of the semiconductor substrate. The device region further includes a plurality of charge storage elements located within each charge trapping layer 504. Each charge storage element is located adjacent to a respective one of the plurality of semiconductor strip structures 160. The device region further includes a plurality of control gate electrodes having a strip shape extending substantially parallel to the top surface of the substrate 10. The plurality of control gate electrodes comprise at least a first control gate electrode located in the first device level and a second control gate electrode located in the second device level. The plurality of electrically conductive layers (142 or 46) in the stack {(32, 142) or (32, 46)} can be in electrical contact with, or can comprise, the plurality of control gate electrodes, and extends from the device region to a contact region including a plurality of electrically conductive contact via structures.

In case the exemplary structure includes a three-dimensional NAND device, a stack {(32, 142) or (32, 46)} of an alternating plurality of word lines (142 or 46) and insulating layers 32 can be located over a semiconductor substrate. Each of the word lines (142 or 46) and insulating layers 32 is located at different levels that are vertically spaced from a top surface of the semiconductor substrate by different distances. An array of memory stack structures 55 is embedded within the stack {(32, 142) or (32, 46)}. Each memory stack structure 55 comprises a semiconductor strip structure 160 and at least one charge storage element 50 located adjacent to the semiconductor strip structure 160. At least one end portion of the semiconductor strip structure 160 extends substantially perpendicular to the top surface of the semiconductor substrate through the stack {(32, 142) or (32, 46)}.

In a non-limiting illustrative example, the insulating layers 32 can comprise silicon oxide layers, the plurality of word lines (142 or 46) can comprise doped semiconductor material, tungsten, or a combination of titanium nitride and tungsten, the at least one charge storage element 50 can comprise a tunneling dielectric, a blocking dielectric layer, and either a plurality of floating gates or a charge trapping layer located between the tunneling dielectric layer and the blocking dielectric layer. An end portion of each of the plurality of word lines (142 or 46) in a device region can comprise a control gate electrode located adjacent to the at least one charge storage element. A plurality of contact via structures contacting the word lines (142 or 46) can be located in a contact region. The plurality of word lines (142 or 46) extends from the device region 100 to the contact region 300. A drain line 83, as embodied as a conductive line structure that contacts at least one drain contact via structure 73 or at least one drain region 163, can electrically contact an upper portion of the semiconductor strip structure 160. As used herein, a first element "electrically contacts" a second element if the first element is electrically shorted to the second element.

In the first exemplary semiconductor structure, the electrical current between a first contact via structure and a second contact via structure located above an alternating stack (32, 142) is controlled by the electrical charges that are stored at various charge storage elements within the memory film 50, and by the electrical bias voltage that is applied to the back gate electrode 168 that is adjacent to a U-shaped semiconductor channel within a semiconductor strip structure 160. The first contact via structure can function as a source contact via structure, and the second contact via structure can function as a drain contact via structure.

In the second exemplary semiconductor structure, the electrical current between a source contact via structure and a drain contact via structure is controlled by the electrical charges that are stored at various charge storage elements of the memory film 50, and by the electrical bias voltage that is applied to the back gate electrode 68 that is adjacent to a semiconductor channel (which can be a vertical portion of the semiconductor strip structure 160) located between a source line layer 12 and the drain contact via structure.

In the third exemplary semiconductor structure, the electrical current between a source contact via structure 79 and a drain contact via structure 73 is controlled by the electrical charges that are stored at various charge storage elements of the memory film 50, and by the electrical bias voltage that is applied to the back gate electrode 68 that is adjacent to a semiconductor channel 60 located between the source region 30 and the drain region (63 or 163).

In one embodiment, each portion of the memory film 50 adjacent to an end portion of a conductive material layer (which can be a second material layer 142 in case the second material layers 142 are formed as conductive material layers, or a layer of a conductive material that replaces a sacrificial material of the second material layers 142 in case the second material layers 142 are initially formed as sacrificial material layers, or electrically conductive layers 46) can function as a charge storage element. In one embodiment, each charge storage element can be a portion of a charge trapping material that is present within the memory film 50. For example, each charge storage element can be a charge trapping material that is present in a charge trapping layer 504.

A charge storage element can be present at each end of control gate electrodes, which can be end portions of the conductive material layers within the alternating stack. In one embodiment, only a single control gate electrode can be provided per level within each memory stack structure. In another embodiment, two or more control gate electrodes can be provided within the same level in each memory stack structure. In one embodiment, two or more control gate electrodes can be provided at each level in each memory stack structure.

In one embodiment, at least one of the charge storage elements may be configured to store more than one amount of non-zero total electrical charge. In other words, a charge storage element can be configured to store no electrical charge, a first amount of electrical charge that is not zero, a second amount of electrical charge that is not zero and different from the first amount, and optionally an i-th amount of electrical charge for every integer i that is greater than 2 and not exceeding the maximum integer n that is greater than 2.

In one embodiment, a predefined set of stored electrical charge amount can be defined for each of the charge storage elements. In one embodiment, a common predefined set of stored electrical charge amounts can be employed for all of the charge storage elements. To detect the amount of electrical charges stored at a particular charge storage element as embodied as a portion of the charge trapping layer 504, the control gate electrode adjacent to the selected charge storage element (which is located adjacent to a semiconductor channel portion) can be electrically biased at different test voltages while all other control gate electrodes adjacent to the semiconductor channel portion can be electrically biased at a voltage that turns on the semiconductor channel portion irrespective of the electrical charges stored in other charge storage elements. Multiple test voltages are sequentially applied to the selected charge storage element to determine a channel-turn-on trigger voltage that is required to turn on the semiconductor channel portion. The amount of the electrical charge stored in the selected charge storage element can be determined from the measured channel-turn-on trigger voltage. In one embodiment, the relationship between the measured channel-turn-on trigger voltage and the amount of stored electrical charges can be calibrated in a test environment, and the data on the relationship can be stored in a permanent (e.g., non-volatile) memory module and retrieved at the time of measurement of the channel-turn-on trigger voltage.

In one embodiment, the relationship between the measured channel-turn-on trigger voltage and the amount of stored electrical charges can be digitized so that the data stored in each charge storage element can indicate a k-nary bit data in which k is greater than 2. For example, if each charge storage element can store no electrical charge and two non-zero amounts of electrical charges, k is 3, and each charge storage element can store a ternary bit, of which the content can be "0," "1," or "2." If each charge storage element can store no electrical charge and three non-zero amounts of electrical charges, k is 4, and each charge storage element can store a quaternary bit, of which the content can be "0," "1," "2," or "3." If each charge storage element can store no electrical charge and (n−1) non-zero amounts of electrical charges, k is n, and each charge storage element can store an n-ary bit (i.e., a bit with the arity of n), of which the content can be "0," "1," "2," . . . "n−2," or "n."

In one embodiment, the first exemplary structure includes a monolithic three-dimensional memory structure comprising a stack including an alternating plurality of insulator layers 32 and electrically conductive layers (which can be the second material layers (46 or 142) or conductive material layers formed by replacement of the sacrificial material of the second material layers 142 in case the second material layers 142 initially include the sacrificial material) and located over a substrate 10, a trench (e.g., a line trench 149 illustrated in FIGS. 3A and 3B) extending through the stack to a top surface of the substrate 10 and including a first sidewall and a second sidewall that are laterally spaced from each other, and a plurality of semiconductor strip structures 160 straddling the trench. Each semiconductor strip structure 160 contacts a respective portion of the first sidewall and a respective portion of the second sidewall and is laterally spaced from one another along the first horizontal direction. A back gate dielectric 166 contacts inner sidewalls of the plurality of semiconductor strip structures 160. A back gate electrode 168 contacts inner sidewalls of the back gate dielectric 166.

Figure 32:
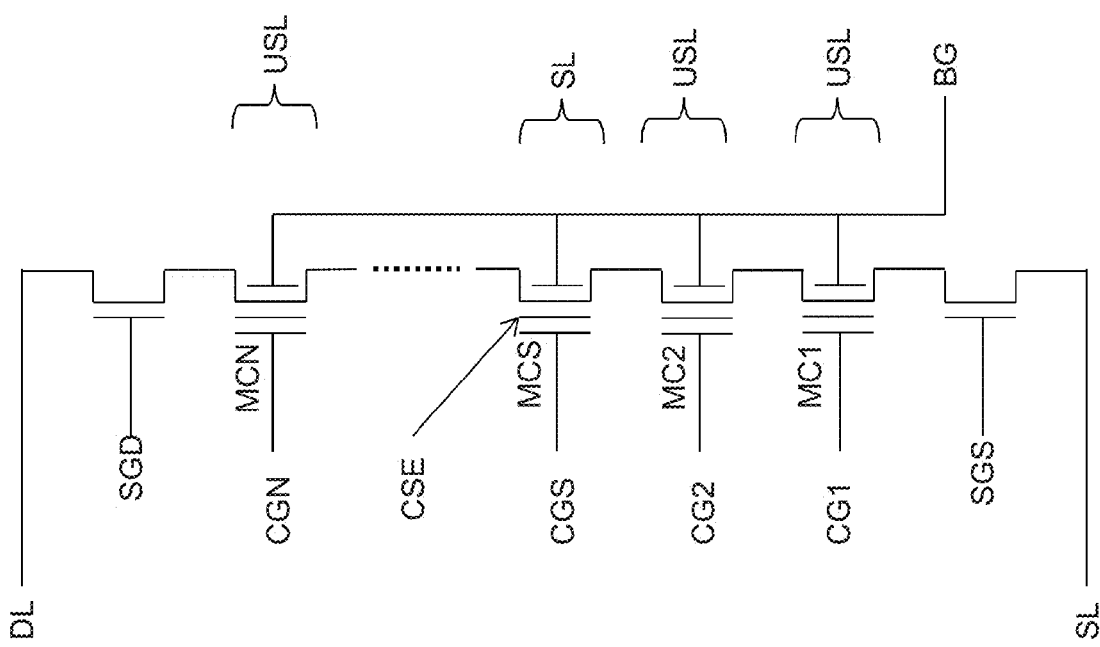
FIG. 32 is a circuit schematic for an exemplary three-dimensional memory device of the present disclosure.

Referring to FIG. 32, a schematic circuit diagram for a three-dimensional memory device including one of the memory stack structures of the present disclosure is shown. The three-dimensional memory device can include a vertical string of N memory cells (MC1, MC2, MCS, . . . , MCN) that are vertically stacked and sharing a same semiconductor channel. Each memory cell includes a set of at least one charge storage element CSE, which can be a portion of a charge trapping layer 504 located at a respective level. A control gate electrode (CG1, CG2, CGS, . . . , CGN), which can be an end portion of a conductive material layer, can be capacitively coupled to each set of at least one charge storage element CSE. While only a single charge storage element and a single control gate electrode is illustrated in FIG. 32, embodiments are expressly contemplated herein in which multiple charge storage elements and/or multiple control gate electrodes located on a same semiconductor channel and at a same level.

Optionally, at least one source select gate transistor including a source select gate (SGS) electrode and/or at least one drain select gate transistor including a drain select gate (SGD) electrode can be formed at end portions of the vertical string of N memory cells (MC1, MC2, MCS, . . . , MCN). The vertical string can be in a U-shaped configuration as illustrated in the first exemplary structure (in which N/2 levels of conductive line structures are provided as control gate electrodes), or can be in a linear configuration as illustrated in the second and third exemplary structures. The source-side end of the vertical string can be electrically shorted to a source line SL, and the drain-side end of the vertical string can be electrically shorted to a drain line DL. The back gate electrode BG extends through the entirety of the N memory cells (MC1, MC2, MCS, . . . , MCN), and can apply a same backside bias voltage to each of the N memory cells.

According to an aspect of the present disclosure, presence of a back gate electrode (68 or 168) in a three-dimensional memory structure can be utilized to program, and to sense, "multinary" bits at a single level within a memory stack structure 55. As used herein, a "multinary" bit refers to a bit that can store more than two states, i.e., a k-nary bit in which k is an integer not less than 3. The three-dimensional memory device can comprise a stack including an alternating plurality of insulator layers and electrically conductive layers that include control gate electrodes located at their respective level, a plurality of charge storage elements located in the stack, a semiconductor channel located on a first side of the plurality of charge storage elements and within the stack, and a back gate electrode located on a second side of the plurality of charge storage elements and within the stack.

A set of at least one charge storage element located at a selected level SL of the stack can be programmed by injecting electrical charges into the set of at least one charge storage element by selecting a mode of programming from among a plurality of modes of programming. Each set of at least one charge storage element can store a multinary bit, and thus, can function as a multinary bit storage unit. The total amount of electrical charge stored within the set of at least one charge storage element is a function of the selected mode of programming that is selected from among a plurality of modes of programming. The set of at least one charge storage element can include a single charge storage element such as a portion of a charge trapping layer 504, or can include a plurality of charge storage elements such as multiple portions of a single charge storage layer 504 that adjoin different control gate electrodes, or multiple charge storage layers 504 placed in proximity to a common semiconductor channel and multiple control gate electrodes. The plurality of modes of programming can inject electrical charges to a selected subset of charge storage elements from among a plurality of charge storage elements located at a selected level SL, or can inject different amounts of electrical charges to a charge storage element or to a plurality of charge storage elements by selecting suitable programming conditions, e.g., the electrical bias voltage between the control gate electrode(s) and the semiconductor channel in proximity to the selected set of at least one charge storage element.

The charged state of the set of at least one memory element, i.e., the stored value of the multinary bit in the corresponding multinary bit storage unit, can be determined by measuring electrical current through the semiconductor channel under a plurality of electrical bias conditions. The variables within the plurality of electrical bias conditions include at least one of the backside bias voltage applied to the back gate electrode and the control gate bias voltage applied to the control gate electrode(s) located at the selected level SL and adjoining the selected set of at least one memory element. In one embodiment, each of the plurality of electrical bias conditions differs from one another by at least one of a value for a backside bias voltage applied to the back gate electrode and a value for a control gate bias voltage applied to a control gate electrode located at the selected level SL.

For any selected set of at least one charge storage element, which is located at a respective level within a respective memory stack structure, electrical current through the semiconductor channel that is most proximal to the selected set of at least one charge element can be measured under a plurality of bias voltage conditions, within which at least one of a value for a backside bias voltage applied to the back gate electrode and a value for a control gate bias voltage applied to a control gate electrode located at the selected level SL. If a plurality of control gate electrodes are located on the at least one charge element, each control gate bias voltage applied to a respective control gate electrode among the plurality of control gate electrodes can be a parameter. In this case, each set of bias voltage conditions comprises a combination of respective values for the control gate voltages for the plurality of control gate electrodes and a value for the backside bias voltage.

Each bias voltage condition can include a value for a backside bias voltage that is applied to a back gate electrode that is most proximal to the selected set of at least one charge storage element, and at least one selected control gate bias voltage that is applied to a respective control gate electrode that is proximal to the selected at least one charge storage element. Unselected control gate electrodes that are located at different levels than the level at which the selected set of at least one charge storage element is present can be electrically biased at an unselect control gate bias voltage, which is selected to turn on the portion of the semiconductor channel located at the corresponding level. Thus, under each of the plurality of electrical bias conditions that are employed to measure the electrical current through the semiconductor channel, the control gate electrodes located at levels different from the selected level SL can be electrically biased at voltages that, in conjunction with a respective backside bias voltage within the respective electrical bias conditions, turn on portions of the semiconductor channel located at each level different from the selected level SL. The voltage bias applied to the control gate electrodes located at levels different from the selected level SL is herein referred to as an "unselect control gate bias voltage."

For example, a set of at least one charge storage element can store electrical charges in k different states such that k is an integer greater than 2. In other words, the set of at least one charge storage element can store a k-nary data, and the value of the k-nary data can be retrieved from the set of at least one charge storage element if the total amount of electrical charge that is stored in the set of at least one charge storage element can be determined. The set of at least one charge storage element can be in a state selected from k possible states, each of which has different total amount of store electrical charges. For example, a first state can be a state in which the total amount of stored electrical charges is zero, a second state can be a state in which the total amount of stored electrical charges is a non-zero quantity, and i-th state can be a state in which the total amount of stored electrical charges can be a non-zero quantity that is different from any of the non-zero quantities corresponding to the first through (i−1)-th states for each value of i that is greater than 2 and not exceeding k. In one embodiment, the value for total amount of stored electrical charges for an i-th state can be greater than any of the values for the total amount of stored electrical charges corresponding to the first through (i−1)-th states for each value of i that is greater than 2 and not exceeding k.

Figure 33:
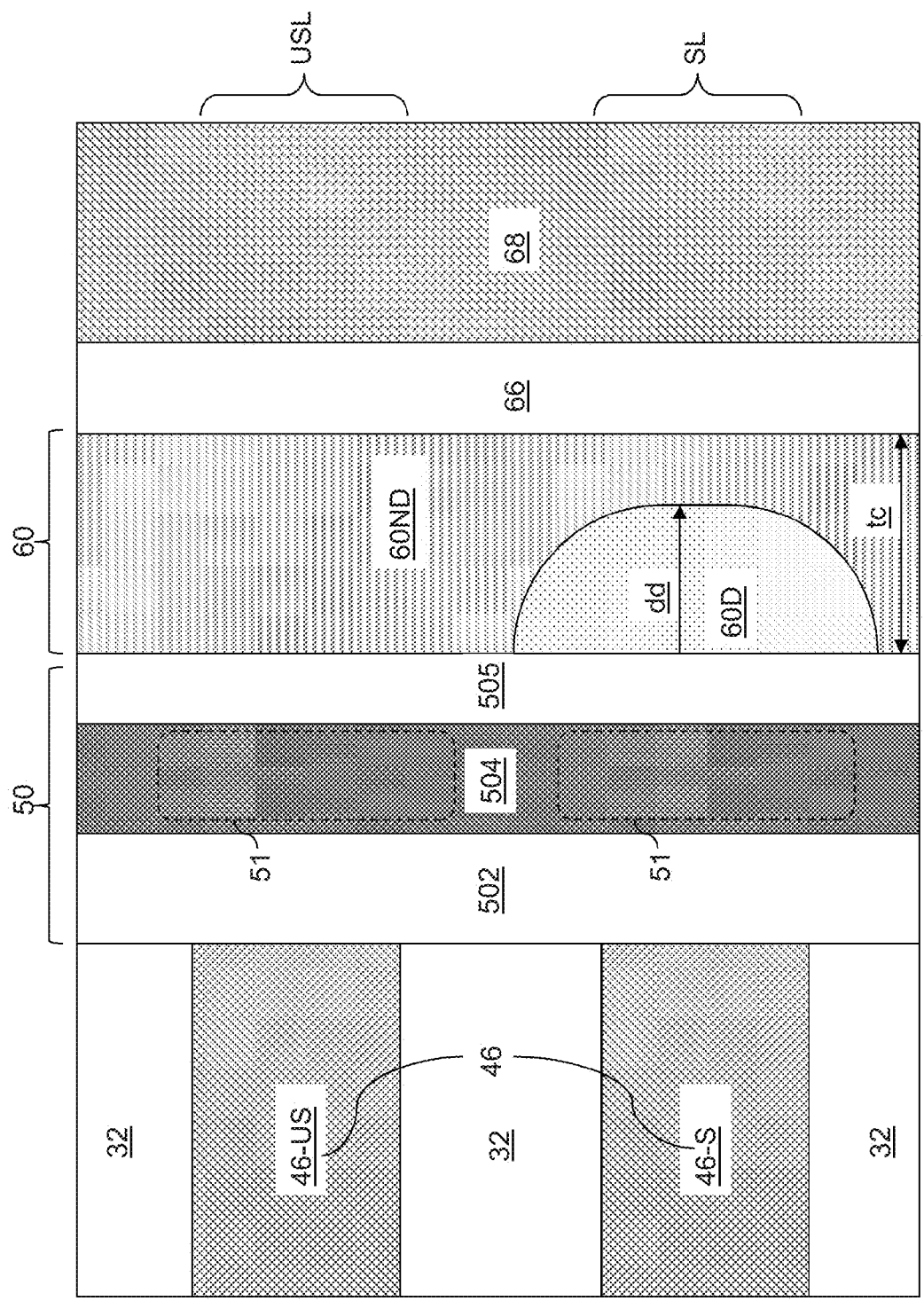
FIG. 33 is a schematic vertical cross-sectional diagram illustrating a mechanism for detection of a threshold bias condition according to an embodiment of the present disclosure.

The operation of the semiconductor channel during the various electrical current measurement steps is illustrated in FIG. 33. An alternating stack (32, 46) of insulator layers 32 and conductive material layers 46, i.e., electrically conductive layers, can be provided within any of the first, second, and third exemplary structures of the present disclosure. A memory film 50 including a blocking dielectric 502, a charge storage layer 504, and a tunneling dielectric 505 can be formed on a sidewall of the alternating stack (32, 46). A semiconductor channel 60, a back gate dielectric 66, and a back gate electrode 68 can be present on the semiconductor channel 60 according to any of the embodiments of the present disclosure.

A selected set of at least one charge storage element 51 can be a portion of a charge trapping layer 504, and can include stored electrical charges such as electrons. At least one control gate electrode located at the selected level SL including the selected set of at least one charge storage element 51 and in proximity to the selected set of at least one charge storage element 51 is represented as a selected control gate electrode 46-S. A control gate bias voltage can be applied to the selected control gate electrode 46S. The unselect control gate bias voltage can be applied to each of the unselected control gate electrodes 46-US, which include all control gate electrodes that are located at unselected levels USL, which are different from the selected level SL in which the selected set of at least one charge storage element 51 is present.

The magnitude of the unselect control gate bias voltage can be determined such that, in conjunction with the backside bias voltage, the applied unselect control gate bias voltage turn on each portion of the semiconductor channel 60 that is not at the selected level SL. In other words, for any selected value for the backside bias voltage, the unselect control gate bias voltage is selected such that portions of the semiconductor channel 60 that are located at the unselected level USL including the unselected control gate electrodes 46-US become conductive. In one embodiment, a low bias voltage (e.g., a bias voltage about zero volt) can be applied to the unselected control gate electrodes to reduce read disturb. For the portions of the semiconductor channel under the unselected control gate electrodes (i.e., at the unselected levels USL), the positive back gate bias voltage applied to the back gate electrode can turn on the portions of the semiconductor channel near the back gate electrode to allow the flow of the electrical current. For example, in case electrons are the minority charge carriers that conduct electricity in a p-doped semiconductor channel, and electrons are stored in the charge storage elements 51, the portions of the semiconductor channel 60 that are located at the unselected levels USL of the unselected control gate electrodes 46-US can contain electrons as charge carriers. This property is illustrated by a non-depleted channel portion 60ND, which includes all portions of the semiconductor channel 60 in which electrons are present to enable charge conduction therethrough. In one embodiment, a positive bias voltage to attract electrons into the backside (the inner side) of the semiconductor channel 60 can be applied to the back gate electrode 68.

A negative voltage, a zero voltage, or a positive voltage of a low magnitude than the high positive voltage applied to the unselected control gate electrodes 46-US can be applied to the selected control gate electrode 46-S. In one embodiment, the control gate bias voltage applied to the selected control gate electrode 46-S can be negative. In general, the control gate bias voltage applied to the selected control gate electrode 46-S can be selected such that the semiconductor channel 60 becomes conducting or non-conducting depending on the total amount of electrical charges present at the selected set of at least one charge storage element 51 (located at the same level (i.e., the selected level SL) as the selected control gate electrode 46-S). For example, a combination of the positive voltage applied to the back gate electrode 68 and a control gate bias voltage applied to the selected control gate electrode 46-S can be selected such that the portion of the semiconductor channel 60 at the selected level SL conducts electrically if the at least one charge storage element 51 includes less than a preset amount of electrons, and does not conduct electrically if the at least one charge storage element 51 includes more than the preset amount of electrons. In other words, the electrical field generated by the combination of the control gate bias voltage applied to the selected control gate electrode 46-S and any stored electrical charge in the at least one charge storage element 51 at the selected level SL causes the portion of the semiconductor channel 60 at the selected level SL either to conduct or not to conduct depending on the total amount of stored electrical charge in the at least one charge storage element 51.

Voltages applied to the control gate electrodes depend on the channel type, and can be independent of whether electrons or holes are stored in the charge trapping layer, e.g., a memory material layer. For an n-doped semiconductor channel, all applied voltages can be reversed in polarity with respect to the operation of a device employing a p-doped semiconductor channel. Thus, for an n-doped semiconductor channel a low bias voltage (e.g. zero) can also be applied to the unselected control gate to reduce read disturb in a device with an n-doped channel. The region from which charge carriers are repelled due to the electrical field generated by the combination of the control gate bias voltage applied to the selected control gate electrode 46-S and any stored electrical charge in the at least one charge storage element 51 is herein referred to as a depleted channel portion 60D. The depth dd of the depleted channel portion 60D is a function of the control gate bias voltage applied to the selected control gate electrode 46-S and the total amount of stored electrical charge in the at least one charge storage element 51 in the selected level SL. If the depth dd of the depleted channel portion 60D becomes equal to the channel thickness tc, which is the thickness, or the lateral dimension, of the semiconductor channel 60, the semiconductor channel 60 becomes non-conducting.

In case the stored electrical charges in the at least one charge storage element 51 are electrons, the depth dd of the depleted channel portion 60D generally increases with an increase in magnitude of a negative voltage applied to the selected control gate electrode 46-S and with the total amount of electrons stored in the at least one charge storage element 51 in the selected level SL. Further, the depth dd of the depleted channel portion 60D generally increases with a decrease in magnitude in a positive voltage applied to the back gate electrode 68. Thus, by measuring the electrical current through the semiconductor channel 60 under various combinations of control gate bias voltage applied to the selected control gate electrode 46-S located at the selected level SL and the backside bias voltage applied to the back gate electrode 68, the total amount of electrical charges stored in the at least one charge storage element 51 at the selected level SL can be determined.

In an illustrative example, the unselect control gate bias voltage applied to the unselected control gate electrodes 46-US can be in a range from 15 V to 30 V, although lesser and greater unselect control gate bias voltages can also be employed. The backside bias voltage applied to the back gate electrode 68 can be in a range from −2 V to 20 V, although lesser and greater backside bias voltages can also be employed. In one embodiment, the backside bias voltage applied to the back gate electrode 68 can be in a range from 2 V to 20V. In one embodiment, the backside bias voltage applied to the back gate electrode 68 can be in a range from 2 V to 15V. The control gate bias voltage applied to the selected control gate electrode 46-S located at the selected level SL can be in a range from −2 V to −12 V, although lesser and greater control gate bias voltages can also be employed. The source line SL can biased, for example, at 0 V. The drain line DL can be biased, for example, at a positive voltage selected from a range from 0.2 V to 5.0 V.

Figure 34:
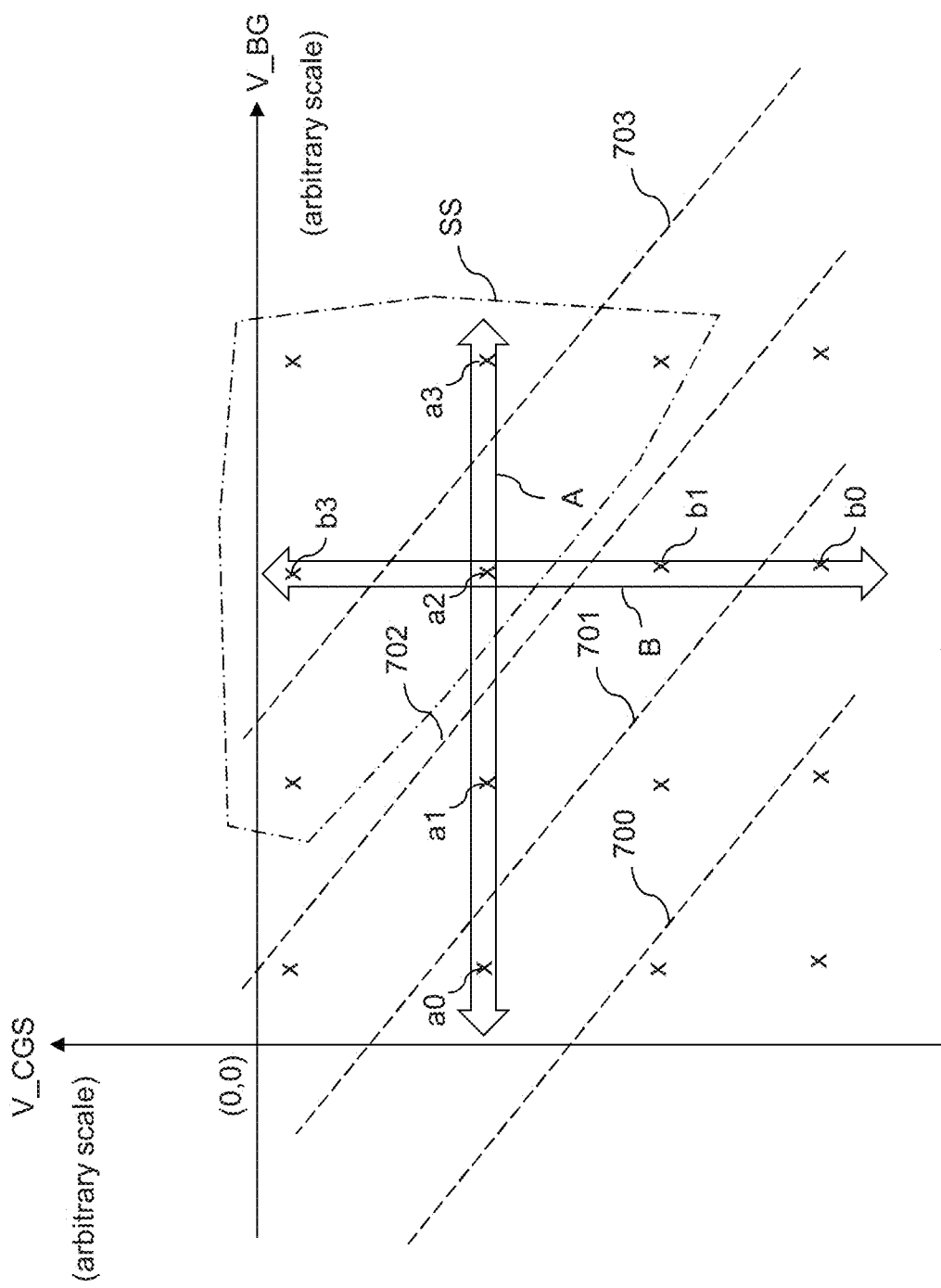
FIG. 34 is a graph illustrating a set of bias voltage conditions that can be employed to determine the total amount of stored electrical charge in a set of at least one memory element at a level within a memory stack structure.

Referring to FIG. 34, a set of bias voltage conditions is illustrated, which can be employed to determine the total amount of stored electrical charge in a set of at least one memory element at a level within a memory stack structure. Each bias voltage condition includes a value for the backside gate voltage V_BG that is applied to a back gate electrode, and a control gate bias voltage V_CGS that is applied to the selected control gate electrode that is adjacent to, and located at the same level as, the at least one charge storage element of which the total amount of stored electrical charge is to be determined.

The points marked by "x" refer to exemplary electrical bias conditions for the combination of at least one of the plurality of electrical bias conditions can have a non-zero voltage for the value for the backside bias voltage. In one embodiment, the polarity of the non-zero voltage for the value for the backside bias voltage V_BS can be the opposite polarity of a corresponding value for the control gate bias voltage V-CGS applied to the control gate electrode located at the selected level SL. In one embodiment, the injected electrical charges can comprise electrons, the non-zero voltage for the value for the backside bias voltage V_BS can be a positive voltage, and the corresponding control gate bias voltage V_CGS applied to the control gate electrode located at the selected level SL can be a negative voltage.

The distinction between a turn-on state of a semiconductor channel and a turn-off state of a semiconductor channel can be made employing a predefined level of electrical current, which is herein referred to as a threshold current level. The threshold current level can be selected to coincide with the threshold value for the electrical current at which a sensor circuitry configured to determine whether the semiconductor channel is turned on or turned off generates a change in the output. In other words, the threshold current level can be defined as the current level at which the sensor circuitry generates a transition in the output.

For any fixed amount of electrical charges that are present in a selected set of at least one charge storage element, a set of electrical bias conditions at which the electrical current through the semiconductor channel reaches the threshold current level can be defined by a curve in the graph. For a set of at least one charge storage element configured to store a k-nary data, a total of k different curves can be generated at which the electrical current through the semiconductor channel reaches the threshold current level for a predefined bias voltage conditions between the source region and the drain region.

For example, for a first state in which a first non-zero total amount of stored electrical charges is present in the selected set of at least one charge storage element, a first curve 701 can be plotted in a graph including the back gate voltage V_BG as one axis and the control gate voltage V-CGS applied to the selected control gate electrode on the other axis. Similarly, for an i-th state in which an i-th non-zero total amount of stored electrical charges is present in the selected set of at least one charge storage element, an i-th curve (such as a second curve 702 or a third curve 703) can be plotted in the same graph for each value of i up to (k−1). For a zero total charge state in which electrical charges are not present, a k-th curve 700 can be plotted in the same graph because application of a sufficiently high back gate electrode voltage can turn on the semiconductor channel even if no electrical charges are present in the selected set of at least one charge storage element. While the various curves (700, 701, 702, 703) are illustrated as lines in FIG. 34, it is understood that the various curves (700, 701, 702, 703) may, or may not, be a straight line. Further, in case m control gate electrodes are located adjacent to the selected set of at least one charge storage element, a graph including (m+1) axes can be employed to plot an m-dimensional volume at which the electrical current through the semiconductor channel reaches the threshold current level for a predefined electrical bias conditions between the source region and the drain region.

In order to determine in which charge state the selected set of at least one charge storage element is in, a plurality of electrical bias conditions can be selected such that the plurality of electrical bias conditions include at least one point between each neighboring pair of k curves representing the k different sets of electrical bias conditions that generate the threshold current level at a respective state of total electrical charges. A subset of electrical bias conditions under which a respective measured electrical current through the semiconductor channel is below a predefined threshold level can be identified based on the electrical current measurements. The total amount of electrical charge stored in the set of at least one charge storage element can be determined based on the identified subset of electrical bias conditions.

For example, the electrical current through the semiconductor channel under a predefined electrical bias voltage between the source region and the drain region can be measured employing a two-dimensional matrix of measurement conditions identified by the points marked "x." If the measured electrical current through the semiconductor channel is above the threshold current level in the subset SS of electrical bias conditions, and is below the threshold current level in the complement of the subset SS of electrical bias conditions, the total amount of electrical charges stored in the selected set of at least one charge storage element is the amount of electrical charges corresponding to curve 702, which can be the second non-zero total amount of stored electrical charges for the selected set of at least one charge storage element.

In one embodiment, the plurality of electrical bias conditions comprises electrical bias conditions having different non-zero voltages for the value for the backside bias voltage V_BG and having a same value for the control gate bias voltage V_CGS applied to the control gate electrode located at the selected level SL. In an illustrative example, the plurality of electrical bias conditions can comprise the set of electrical bias conditions corresponding to the points marked by "x" and located within the bidirectional arrow A.

In one embodiment, the total amount of electrical charge stored in the set of at least one charge storage element can be determined by identifying a pair of electrical bias conditions (e.g., a1 and a2 in FIG. 34) having a same value for the control gate bias voltage V_CGS applied to the control gate electrode located at the selected level SL, and having different values for the backside bias voltage V_BG applied to the back gate electrode such that the electrical current through the semiconductor channel is above the predefined threshold level for one of the pair of electrical bias conditions (e.g., a2), and is below the predefined threshold level for another of the pair of electrical bias conditions (e.g., a1). The curve (e.g., 702) located between the two electrical bias conditions corresponds to the electrical charge stored in the set of at least one charge storage element (e.g., the second non-zero total amount of stored electrical charges out of k possible charge states). For a set of at least one charge storage element configured to store a k-nary bit, in which k is an integer greater than 1, at least (k−1) measurement conditions can be employed for the selected set of electrical bias conditions having different non-zero voltages for the value for the backside bias voltage V_BG and having a same value for the control gate bias voltage V_CGS.

In one embodiment, the injected electrical charges can comprise electrons, the non-zero voltage for the value for the backside bias voltage V_BS can be positive for the plurality of electrical bias conditions, and electrical current through the semiconductor channel increases with an increase in magnitude in the value for the backside bias voltage V_BS within the plurality of electrical bias conditions. In one embodiment, the order of the electrical bias conditions having the same value for the control gate bias voltage V_CGS applied to the control gate electrode located at the selected level SL within the selected set of measurement conditions (e.g., within the bidirectional arrow A in FIG. 34) can be selected such that the applied value for the backside bias voltage V_BG either increases sequentially, or decreases sequentially, between successive measurements. In this case, the applied value for the backside bias voltage V-BS can be strictly increased, or strictly decreased, an while a same control gate bias voltage V_CGS is applied to the control gate electrode located at the selected level SL. As used herein, a "strict" increase refers to a positive increment over a pre-existing quantity, and a "strict" decrease refers to a decrease by a positive quantity (which is the same as an increase by a negative quantity) over a pre-existing quantity.

In one embodiment, the back gate voltage V_BS can be sequentially increased, and a transition point value (e.g., the value at condition a2 in an exemplary case of a second non-zero total amount of electrical charges corresponding to the second curve 702) of the applied voltage for the backside bias voltage V_GS can be identified when a cross-over above the predefined threshold voltage occurs to determine the charge state of the selected set of at least one charge storage element. In another embodiment, the back gate voltage V_BS can be sequentially decreased, and a transition point value (e.g., the value at condition a1 in an exemplary case of a second non-zero total amount of electrical charges corresponding to the second curve 702) of the applied voltage for the backside bias voltage V_GS can be identified when a cross-over below the predefined threshold voltage occurs to determine the charge state of the selected set of at least one charge storage element. In one embodiment, the total amount of electrical charge stored in the set of at least one charge storage element can be determined by a predefined table that correlates the transition point value to the total amount of stored electrical charges.

In another embodiment, the total amount of electrical charge stored in the set of at least one charge storage element can be determined by identifying a pair of electrical bias conditions (e.g., b1 and a2 in FIG. 34) having different values for the control gate bias voltage V_CGS applied to the control gate electrode located at the selected level SL, and having the same for the backside bias voltage V_BG applied to the back gate electrode such that the electrical current through the semiconductor channel is above the predefined threshold level for one of the pair of electrical bias conditions (e.g., a2), and is below the predefined threshold level for another of the pair of electrical bias conditions (e.g., b1). The curve (e.g., 702) located between the two electrical bias conditions corresponds to the electrical charge stored in the set of at least one charge storage element (e.g., the second non-zero total amount of stored electrical charges out of k possible charge states). For a set of at least one charge storage element configured to store a k-nary bit, in which k is an integer greater than 1, at least (k-1) measurement conditions can be employed for the selected set of electrical bias conditions having the same non-zero voltage for the value for the backside bias voltage V_BG and having different values for the control gate bias voltage V_CGS.

In one embodiment, the injected electrical charges can comprise electrons, the non-zero voltage for the value for the backside bias voltage V_BS can be positive for the plurality of electrical bias conditions, and electrical current through the semiconductor channel decreases with an increase in magnitude in the negative value for the control gate bias voltage V_CGS within the plurality of electrical bias conditions. In one embodiment, the order of the electrical bias conditions having the same value for the back gate bias voltage V_BS within the selected set of measurement conditions (e.g., within the bidirectional arrow B in FIG. 34) can be selected such that the applied value for the control gate bias voltage V_CGS (which is applied to the control gate electrode located at the selected level SL) either increases sequentially, or decreases sequentially, between successive measurements. In this case, the applied value for the control gate bias voltage V_CGS can be strictly increased, or strictly decreased, while a same back gate bias voltage V_BS is applied to the back gate electrode.

In one embodiment, the control gate bias voltage V_CGS can be sequentially increased (by becoming less negative or more positive), and a transition point value (e.g., the value at condition a2 within the bidirectional arrow B in an exemplary case of a second non-zero total amount of electrical charges corresponding to the second curve 702) of the applied voltage for the control gate bias voltage V_CGS can be identified when a cross-over above the predefined threshold voltage occurs to determine the charge state of the selected set of at least one charge storage element. In another embodiment, the control gate bias voltage V_CGS can be sequentially decreased, and a transition point value (e.g., the value at condition b1 within the bidirectional arrow B in an exemplary case of a second non-zero total amount of electrical charges corresponding to the second curve 702) of the applied voltage for the control gate bias voltage V_CGS can be identified when a cross-over below the predefined threshold voltage occurs to determine the charge state of the selected set of at least one charge storage element. In one embodiment, the total amount of electrical charge stored in the set of at least one charge storage element can be determined by a predefined table that correlates the transition point value to the total amount of stored electrical charges.

In general, identifying a charge state of a set of at least one charge story element among possible k states can be effected by making (k-1) measurements at measurement conditions corresponding to intervals between the (k-1) neighboring pairs of curves (701, 702, 703, 704) corresponding to the condition of threshold current level. In an illustrative example, a set of three electrical bias conditions including a0, a1, and a2 within the bidirectional arrow A or a set of three electrical bias conditions including b0, b1, and a2 can be employed to distinguish the charge state of a quaternary bit memory cell embodied in a set of at least one charge storage element.

Figure 35:
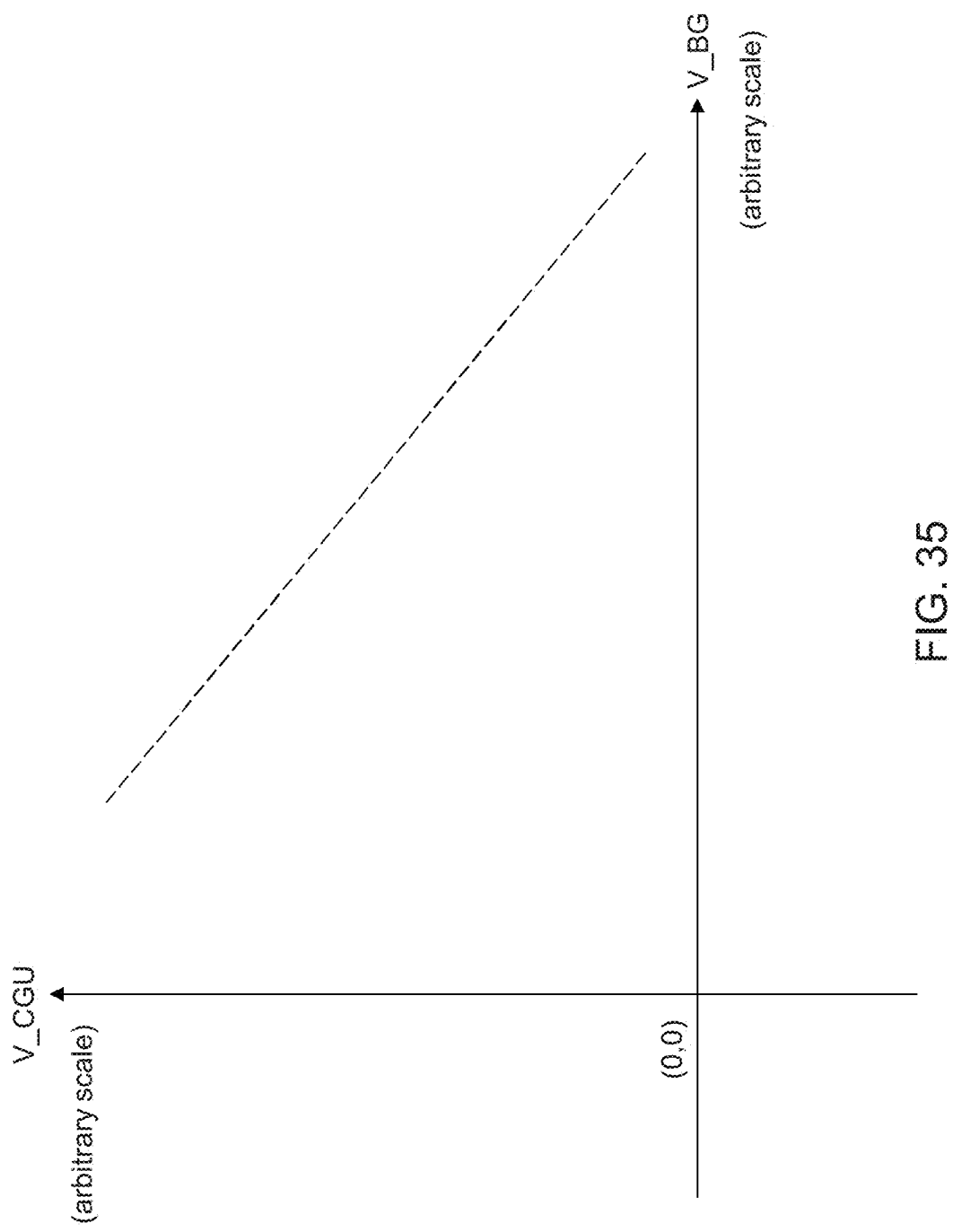
FIG. 35 is a graph illustrating the interdependency for optimal values for the backside bias voltage and unselect control gate bias voltage according to an embodiment of the present disclosure.

The unselect control gate bias voltage that is applied to each unselected control gate electrodes can be adjusted for each selected value for the back gate bias voltage to ensure that the portions of the semiconductor channel 60 located at any other level (i.e., the unselected levels USL) than the selected level SL belong to the non-depleted channel portion. FIG. 35 illustrates the interdependency for optimal values for the backside bias voltage V_BS and unselect control gate bias voltage V_CGU according to an embodiment of the present disclosure. While the graph in FIG. 35 illustrates a line, it is understood that the set of points including optimal combinations of the backside bias voltage V-BS and the unselect control gate bias voltage V-CGU may, or may not, be on a straight line.

Referring collectively to FIGS. 9A, 9B, 30A, 30B, 31, 34 and 35, a three-dimensional NAND string is provided, which includes a semiconductor channel (160 or 60) having at least one vertical portion, a plurality of vertically separated control gate electrodes (as embodied in electrically conductive layers 46), a memory film 50 located between a first side of the vertical portion of the semiconductor channel (160 or 60) and the control gate electrodes, a back gate electrode (168 or 68), and a back gate dielectric (166 or 66) located between a second side of the vertical portion of the semiconductor channel (160 or 60) and the back gate electrode (168 or 68). The three-dimensional NAND string can be operated by applying a positive voltage to the back gate electrode (168 or 68) and by applying a negative read voltage to a selected control gate electrode (as embodied by an electrically conductive layer 46) to read a selected cell of the NAND string. A voltage can be applied between a source (such as source region 30) and a drain (such as drain region (63 or 163) of the NAND string.

During the read operation of the NAND string, it can be determined that charge is stored in a charge storage region of the memory film 50 of the selected cell if no current flows between the source and the drain during application of the positive voltage to the back gate electrode (68 or 168) and the negative read voltage of the selected control gate electrode. Further, it can be determined that no charge is stored in a charge storage region of the memory film of the selected cell if current flows between the source and the drain during application of the positive voltage to the back gate electrode and the negative read voltage of the selected control gate electrode.

In one embodiment, a first pair of electrical bias conditions can be applied, which includes applying a first backside bias voltage to the back gate electrode and a first control gate bias voltage to the control gate electrode of the selected cell. Subsequently, a second pair of electrical bias conditions can be applied, which includes applying a second backside bias voltage to the back gate electrode and a second control gate bias voltage to the control gate electrode of the selected cell. The first pair of electoral bias conditions and the second pair of electrical bias conditions can be applied sequentially. In one embodiment, the first and the second backside bias voltages can be the same and the first and the second control gate bias voltages can be different. Alternatively, the first and the second backside bias voltages can be different and the first and the second control gate bias voltages can be the same. A total amount of electrical charge stored in a charge storage region of the memory film of the selected cell can be determined when an electrical current through the semiconductor channel (60 or 160) is above a predefined threshold level for the first pair of electrical bias conditions, and is below a predefined threshold level for the second pair of electrical bias conditions. In one embodiment, an absolute value of the positive voltage applied to the back gate electrode can be smaller than an absolute value of the negative read voltage applied to the selected control gate electrode. In one embodiment, the back gate electrodes (68 or 168) can be employed to turn on the backside of the semiconductor channel (60 or 160) and increase the cell current without increasing the leakage current through the front side (i.e., the outer side) of the semiconductor channel (60 or 160).

The programming and measurement methods of the present disclosure can be employed in conjunction with a three-dimensional memory device as embodied in any of the first, second, and third exemplary structures. In an illustrative example, the a three-dimensional memory device can include a trench extending through an alternating stack (32, 142) and including a first sidewall and a second sidewall that are laterally spaced from each other, a plurality of semiconductor strip structures 160 straddling the trench, and a back gate dielectric 168 contacting inner sidewalls of the plurality of semiconductor strip structures as in the first and second exemplary structures illustrated in FIGS. 9A, 9B, 18A, and 18B. Each semiconductor strip structure 160 can contact a respective portion of the first sidewall and a respective portion of the second sidewall, and can be laterally spaced from one another. Each of the plurality of semiconductor strip structures 160 can include at least one semiconductor channel. The back gate electrode 168 can contact inner sidewalls of a back gate dielectric 166. Each semiconductor channel can be electrically isolated from the substrate 10 by a memory film 50 as in the first exemplary structure. Alternatively, each of the plurality of semiconductor strip structures 160 can be electrically shorted to a source line layer 12 located within the substrate 10 as in the second exemplary structure.

In another illustrative example, the three-dimensional memory device can further comprise a pillar structure (68, 66, 60, 63, 30, 50) located within a memory opening extending through the alternating stack (32, 46) as in the third exemplary structure illustrated in FIGS. 30A and 30B. The pillar structure (68, 66, 60, 63, 30, 50) can comprise a back gate electrode 68 and a set of nested layers laterally surrounding the back gate electrode 68. The set of nested layers can include, from inside to outside, a back gate dielectric 66, the semiconductor channel 60, and a memory film 50.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
    a stack including an alternating plurality of insulator layers and electrically conductive layers and located over a top surface of a substrate;
    an opening extending through the stack;
    a memory film located in the opening;
    at least one semiconductor channel located over the memory film in the opening, such that at least a portion of the at least one semiconductor channel extends substantially perpendicular to the top surface of the substrate;
    a back gate dielectric located over the at least one semiconductor channel in the opening;
    a back gate electrode located over the back gate dielectric in the opening;
    a source region adjoined to a bottom portion of the semiconductor channel; and
    a source electrode contacting, and laterally surrounding, the source region, and located over the substrate,
    wherein:
    the device comprises a vertical NAND device located in a device region;
    at least one of the electrically conductive layers in the stack comprises, or is electrically connected to, a word line of the NAND device;
    the opening comprises a memory opening;
    the at least one semiconductor channel comprises a pillar shaped semiconductor channel located in the memory opening;
    a pillar structure is located within the memory opening and comprises the back gate electrode and a set of nested layers laterally surrounding the back gate electrode, wherein the set of nested layers include, from inside to outside, the back gate dielectric, the semiconductor channel, and at least a portion of the memory film;

the source region laterally surrounds a portion of the back gate dielectric;

the source electrode underlies the stack; and a backside contact via structure extends through the stack and contacts the source electrode.

2. The monolithic three-dimensional memory device of claim 1, further comprising a patterned conductive material layer contacting a bottom surface of the back gate electrode and electrically isolated from the semiconductor channel.

3. The monolithic three-dimensional memory device of claim 2, wherein the patterned conductive material layer contacts a bottom surface of another back gate electrode located within another memory opening through the stack.

4. The monolithic three-dimensional memory device of claim 2, further comprising a dielectric material portion embedded within an upper portion of the substrate and contacting a bottom surface of the patterned conductive material layer.

5. The monolithic three-dimensional memory device of claim 1, further comprising:

a dielectric cap portion contacting a top surface of the back gate electrode; and a drain region contacting a top surface of the semiconductor channel and a surface of the dielectric cap portion.

6. The monolithic three-dimensional memory device of claim 1, further comprising an annular dielectric material portion having a same composition as the memory film and contacting an outer sidewall of the back gate dielectric under at least one of the source region and the source electrode.

7. The monolithic three-dimensional memory device of claim 1, wherein the source region has a same horizontal cross-sectional shape as the semiconductor channel, and is laterally spaced from the back gate electrode by the back gate dielectric.

8. The monolithic three-dimensional memory device of claim 1, further comprising:

a stepped word line connection region located adjacent to the device region;

a plurality of word line contact via structures contacting respective word lines in the word line connection region;

a conductive material layer located under the stack of the alternating layers and contacting the back gate electrode; and a back gate contact via structure contacting the conductive layer in the word line connection region.

9. The monolithic three-dimensional memory device of claim 1, wherein:

no charge storage region is present between the back gate electrode and the at least one semiconductor channel;

the NAND device comprises:

a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack comprise, or are in electrical contact with, the plurality of control gate electrodes and extend from the device region to a contact region containing a plurality of electrically conductive via connections that contact the electrically conductive layers; and the substrate comprises a silicon substrate containing a driver circuit for the NAND device.

* * * * *